(12) United States Patent
Kawasaki et al.

(10) Patent No.: US 8,395,041 B2
(45) Date of Patent: Mar. 12, 2013

(54) PHOTOELECTRIC CONVERSION ELEMENT AND SOLOR CELL

(75) Inventors: Hidekazu Kawasaki, Tokyo (JP); Akihiko Itami, Tokyo (JP); Kazuya Isobe, Tokyo (JP); Hideya Miwa, Tokyo (JP); Kazukuni Nishimura, Tokyo (JP); Mayuko Ushiro, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 367 days.

(21) Appl. No.: 12/758,240

(22) Filed: Apr. 12, 2010

(65) Prior Publication Data

US 2010/0288360 A1 Nov. 18, 2010

(30) Foreign Application Priority Data

Apr. 15, 2009 (JP) ................. 2009-098758

(51) Int. Cl.
*H01L 25/00* (2006.01)
*H01L 31/00* (2006.01)
*C07D 271/00* (2006.01)
*C07D 285/02* (2006.01)
*C07D 285/04* (2006.01)
*C07D 323/02* (2006.01)
*C07D 307/02* (2006.01)

(52) U.S. Cl. ..................... 136/243; 136/263; 430/58.05; 548/122; 548/125; 549/429; 549/483; 549/487

(58) Field of Classification Search ................. 548/100, 548/125, 122; 549/429, 483, 487; 136/263, 136/243; 430/58.05
See application file for complete search history.

(56) References Cited

U.S. PATENT DOCUMENTS

2002/0015881 A1 * 2/2002 Nakamura et al. ............ 429/111
2004/0187918 A1 * 9/2004 Ikeda et al. ................... 136/263

FOREIGN PATENT DOCUMENTS

JP 2005063833 3/2005
JP 2006244752 A * 9/2006

OTHER PUBLICATIONS

English translation of JP 2006-244752; Takada et al; Sep. 2006.*

* cited by examiner

*Primary Examiner* — Karuna P Reddy
(74) *Attorney, Agent, or Firm* — Lucas & Mercanti, LLP

(57) ABSTRACT

Disclosed is a photoelectric conversion element comprising a conductive support and provided thereon, a semiconductor layer, a charge transporting layer and an opposed electrode, the semiconductor layer comprising a semiconductor with a dye, wherein the dye is a compound represented by the following formula (1).

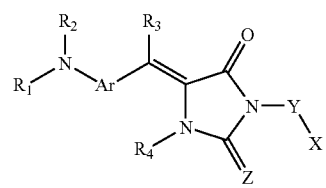

Formula (1)

18 Claims, 1 Drawing Sheet

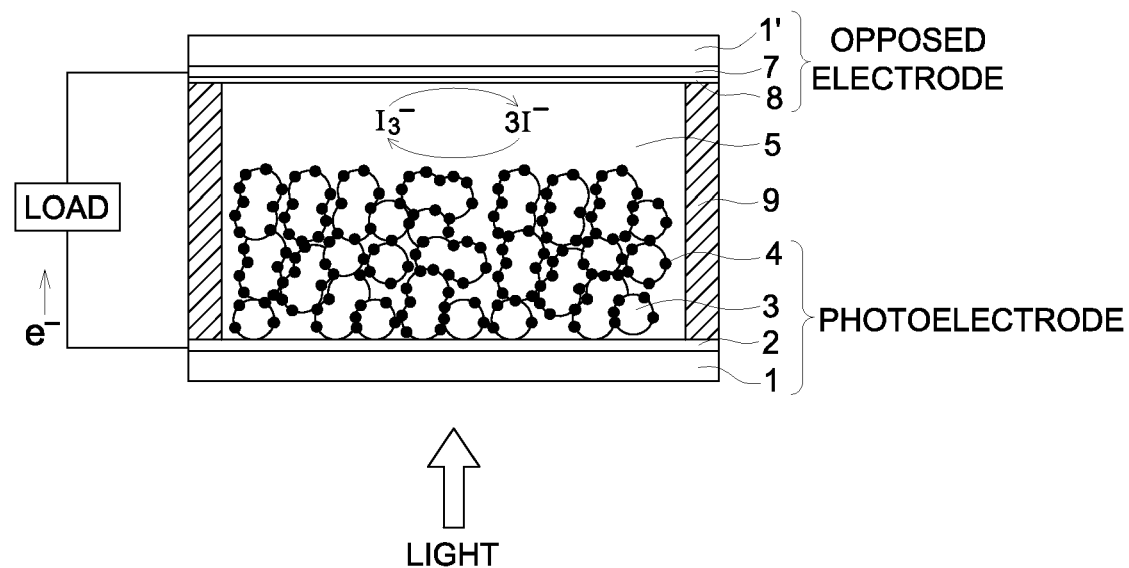

PHOTOELECTRIC CONVERSION ELEMENT AND SOLOR CELL

This application is based on Japanese Patent Application No. 2009-098758, filed on Apr. 15, 2009 in Japanese Patent Office, the entire content of which is hereby incorporated by reference.

FIELD OF THE INVENTION

The present invention relates to a photoelectric conversion element and a solar cell employing the same, and particularly to a dye-sensitizing type photoelectric conversion element (hereinafter also referred to as simply a photoelectric conversion element) and a dye-sensitizing type solar cell employing the same.

TECHNICAL BACKGROUND

In recent years, application of infinite solar light producing no harmful substances has been actively studied. As those in which a solar light is presently put into practical use as a clean energy source, there are inorganic type solar cells such as single crystalline silicon, polycrystalline silicon, amorphous silicon, and cadmium telluride and indium copper selenide for domestic use.

However, there are drawbacks in these inorganic type solar cells. Extremely high purity is required, for example in the case of the silicon type, and the purification process is complicated and includes many steps, resulting in high production cost.

On the other hand, many solar cells employing an organic material have also been proposed. Examples of the organic solar cell include a Schottky type photoelectric conversion element in which a p-type organic semiconductor and metal having a small work function are joined, and a hetero-junction type photoelectric conversion element in which a p-type organic semiconductor and an n-type inorganic semiconductor or a p-type organic semiconductor and an electron accepting organic compound are joined. The utilized organic semiconductors are synthesized dyes or pigments such as chlorophyll, perylene and so forth, conductive polymer materials such as polyacetylene and so forth, and composite materials thereof. These materials are thin-layered by a vacuum evaporation method, a casting method, a dipping method or the like to prepare a cell material. The organic materials have advantages that they are inexpensive and easy to obtain a large dimension, but there is problem that most of them exhibit a low conversion efficiency of 1% or less and poor durability.

In such a situation, a solar cell exhibiting favorable properties has been reported by Dr. Gratzel et al. in Switzerland (see B. O'Regan & M. Gratze, Nature, 353, 737 (1991), for example). The proposed cell is a dye sensitizing type solar cell, and a wet type solar cell in which a titanium oxide porous film spectrally sensitized by a ruthenium complex is provided as a functional electrode. Advantages of this system are that it is not necessary to purify an inexpensive oxide semiconductor such as titanium oxide up to high purity, and wide wavelength regions of visible light can be used, whereby a solar light containing visible light components can be effectively converted into electricity.

However, this system employs the ruthenium complex which is resourceless, and when this system is practically applied to a solar cell, supply of the ruthenium complex is a concern. Further, the ruthenium complex has problem in that it is expensive, and low in aging stability, but this problem can be solved if the ruthenium complex can be replaced with an inexpensive and stable organic dye.

There is disclosure in Japanese Patent O.P.I. Publication No. 2005-63833 that when compounds having a rhodamine nucleus-containing amine structure are employed as a dye for this solar cell, a dye-sensitizing type photoelectric conversion element (organic dye-sensitizing type solar cell) with high photoelectric conversion efficiency is obtained. However, it is supposed that these compounds having in the molecules plural sulfur atoms which contribute to light instability are lower in durability to light. Accordingly, further improvement of a sensitizing dye is required.

SUMMARY OF THE INVENTION

The present invention has been made in view of the above. An object of the invention is to provide a photoelectric conversion element with high efficiency and high durability employing a novel sensitizing dye (hereinafter also referred to as simply a dye) with high durability to light and high conversion efficiency used in a dye-sensitization type photoelectric conversion element, and a solar cell employing the photoelectric conversion element.

The photoelectric conversion element of the invention comprises a conductive support and provided thereon, a semiconductor layer, a charge transporting layer and an opposed electrode, the semiconductor layer comprising a semiconductor carrying a specific dye.

BRIEF DESCRIPTION OF THE DRAWING

FIG. 1 is a schematic cross-sectional view showing one example of a photoelectric conversion element used in the present invention.

DETAILED DESCRIPTION OF THE INVENTION

The above object of the invention can be attained by any one of the following constitutions.

1. A photoelectric conversion element comprising a conductive support, and provided thereon, a semiconductor layer, a charge transporting layer and an opposed electrode, the semiconductor layer comprising a semiconductor with a dye, wherein the dye is a compound represented by formula (1),

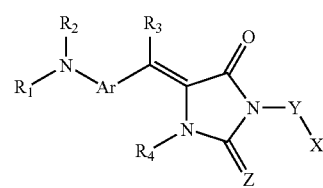

Formula (1)

wherein Ar represents a substituted or unsubstituted aromatic hydrocarbon ring or a substituted or unsubstituted aromatic heterocyclic ring; $R_1$ and $R_2$ independently represent a substituted or unsubstituted alkyl group, a substituted or unsubstituted alkenyl group, a substituted or unsubstituted aryl group or a substituted or unsubstituted heterocyclic group, provided that at least two of $R_1$ and $R_2$ and Ar may combine with each other to form a ring together with a nitrogen atom; $R_3$ and $R_4$ independently represent a hydrogen atom, a halogen atom, a cyano group, a substituted or unsubstituted alkyl group, a substituted or unsubstituted alkenyl group, a substituted or unsubstituted aryl group, a substituted or unsubstituted amino group or a substituted or unsubstituted heterocyclic group; Z represents a sulfur atom, an oxygen atom, a selenium atom, a substituted or unsubstituted alkylidene group, a substituted or unsubstituted aromatic hydrocarbon ring or a substituted or unsubstituted heterocyclic ring; Y represents a substituted or unsubstituted alkylene group, a substituted or unsubstituted alkenylene group, a substituted or unsubstituted aromatic hydrocarbon ring or a substituted or unsubstituted heterocyclic ring; and X represents a carboxylic acid group, a sulfonic acid group, a nitric acid group or a phosphoric acid group.

2. The photoelectric conversion element of item 1 above, wherein Ar in formula (1) is a substituted or unsubstituted aromatic hydrocarbon ring.

3. The photoelectric conversion element of item 2 above, wherein the aromatic hydrocarbon ring is a benzene ring.

4. The photoelectric conversion element of item 1 above, wherein $R_1$ and $R_2$ in formula (1) independently represent a substituted or unsubstituted alkyl group or a substituted or unsubstituted aryl group.

5. The photoelectric conversion element of item 1 above, wherein $R_1$ and $R_2$ represent a substituted or unsubstituted aryl group, the aryl group being a phenyl group.

6. The photoelectric conversion element of item 4 above, wherein $R_1$ and $R_2$ represent a substituted or unsubstituted aryl group, the aryl group being a stilbenzyl group.

7. The photoelectric conversion element of item 1 above, wherein $R_3$ and $R_4$ in formula (1) independently represent a hydrogen atom or a substituted or unsubstituted alkyl group.

8. The photoelectric conversion element of item 1 above, wherein $R_3$ and $R_4$ represent a hydrogen atom.

9. The photoelectric conversion element of item 1 above, wherein Z in formula (1) represents a sulfur atom or a substituted or unsubstituted heterocyclic ring, the heterocyclic ring being a rhodanine ring or a thiohydantoin ring.

10. The photoelectric conversion element of item 9 above, wherein Z represents a sulfur atom.

11. The photoelectric conversion element of item 1 above, wherein Y in formula (1) represents a substituted or unsubstituted alkylene group.

12. The photoelectric conversion element of item 11 above, wherein the alkylene group is a methylene group.

13. The photoelectric conversion element of item 1 above, wherein X in formula (1) represents a carboxylic acid group, a sulfonic acid group or a phosphoric acid group.

14. The photoelectric conversion element of item 13 above, wherein X is a carboxylic acid group.

15. The photoelectric conversion element of any one of items 1 through 14 above, wherein the semiconductor layer is a porous semiconductor layer.

16. The photoelectric conversion element of item 15 above, wherein the porosity of the porous semiconductor layer is not more than 10% by volume.

17. The photoelectric conversion element of any one of items 1 through 14 above, wherein the thickness of the semiconductor layer is from 0.5 to 30 μm.

18. The photoelectric conversion element of any one of items 1 through 14 above, wherein the semiconductor is titanium oxide.

19. The photoelectric conversion element of any one of items 1 through 14 above, wherein the content of the dye in the semiconductor layer is from 0.01 to 100 mmol per 1 $m^2$ of semiconductor layer.

20. The photoelectric conversion element of any one of items 1 through 14 above, wherein the conductive support is substantially transparent.

21. A solar cell employing a photoelectric conversion element comprising a conductive support, and provided thereon, a semiconductor layer, a charge transporting layer and an opposed electrode, the semiconductor layer comprising a semiconductor with a dye, wherein the dye is a compound represented by formula (1) above.

EFFECTS OF THE INVENTION

The present invention can provide a photoelectric conversion element with high efficiency and high durability employing a novel sensitizing dye with high durability to light and high conversion efficiency used in a dye-sensitization type photoelectric conversion element, and a solar cell employing the photoelectric conversion element.

Employing a compound represented by formula (1) as a sensitizing dye, a photoelectric conversion element having the same conversion efficiency as one employing a rhodamine dye and having high durability to light and a solar cell fitted with the photoelectric conversion element can be obtained.

Next, preferred embodiments of the invention will be explained in detail, but the invention is not limited thereto.

The present invention is characterized in that in a photoelectric conversion element comprising a semiconductor layer provided on a conductive support, an opposed electrode, and a charge transporting layer provided between the semiconductor layer and the opposed electrode, the semiconductor layer containing a semiconductor with a dye, the dye includes a compound represented by formula (1) described above.

In the invention, when a compound represented by formula (1) with high durability to light and high conversion efficiency is incorporated as a dye in a dye-containing semiconductor layer, a photoelectric conversion element with high efficiency and high durability and a solar cell employing the photoelectric conversion element can be obtained.

Next, the present invention will be explained in further detail.

In the photoelectric conversion element, a photoelectrode comprising a dye-containing semiconductor on a conductive support and an opposed electrode are opposed with each other through a charge transporting layer.

The photoelectric conversion element of the invention will be explained employing the drawing.

FIG. 1 is a schematic cross-sectional view showing one example of a photoelectric conversion element of the present invention.

As shown in FIG. 1, the photoelectric conversion element is constituted of a substrate 1 and a transparent conductive film 2 constituting a conductive support; an oxide semiconductor 3 and a dye 4 constituting a semiconductor layer; an electrolyte 5 which is a charge transporting layer; platinum 8, transparent conductive film 7 and substrate 1' constituting an opposed electrode; and a partition wall 9.

As a photoelectrode, utilized is one in which a semiconductor layer having pores formed via calcination of particles of the semiconductor 3 is provided on the substrate 1 on which the transparent conductive film 2 is placed, and the dye 4 is adsorbed on the semiconductor layer surface.

The present invention relates to a photoelectric conversion element and a solar cell each employing a compound (a dye) represented by formula (1) above.

<<Compound Represented by Formula (1)>>

Next, the compound represented by formula (1) will be explained.

In formula (1) above, Ar represents a substituted or unsubstituted aromatic hydrocarbon ring or a substituted or unsubstituted aromatic heterocyclic ring; $R_1$ and $R_2$ independently represent a substituted or unsubstituted alkyl, alkenyl, aryl or heterocyclic group, provided that at least two of $R_1$ and $R_2$ and Ar may combine with each other to form a ring together with a nitrogen atom; $R_3$ and $R_4$ independently represent a hydrogen atom, a halogen atom, a cyano group, or a substituted or unsubstituted alkyl, alkenyl, aryl, amino or heterocyclic group; Z represents a sulfur atom, an oxygen atom, a selenium atom, a substituted or unsubstituted alkylidene group, a substituted or unsubstituted aromatic hydrocarbon ring or a substituted or unsubstituted heterocyclic ring; Y represents a substituted or unsubstituted alkylene group, a substituted or unsubstituted alkenylene group, a substituted or unsubstituted aromatic hydrocarbon ring or a substituted or unsubstituted heterocyclic ring; and X represents an acid group such as a carboxylic acid group, a sulfonic acid group, a nitric acid group or a phosphoric acid group.

In formula (1) above, Ar represents a substituted or unsubstituted aromatic hydrocarbon ring or a substituted or unsubstituted aromatic heterocyclic ring.

The aromatic hydrocarbon ring represented by Ar refers to as an aryl ring also. Examples of the aromatic hydrocarbon ring include a benzene ring, a naphthalene ring, an anthracene ring, an azulene ring, an acenaphthylene ring, a fluorene ring, a phenanthrene ring, an indene ring, a pyrene ring, and a biphenyl ring. These rings may further have a substituent.

The aromatic hydrocarbon ring represented by Ar is preferably a benzene ring or a naphthalene ring.

Examples of the aromatic heterocyclic ring represented by Ar include a furan ring, a thiophene ring, a pyridine ring, a pyridazine ring, a pyrimidine ring, a pyrazine ring, a triazine ring, an imidazole ring, a pyrazole ring, a thiazole ring, a quinazoline ring, a carbazole ring, a carboline ring, and a diazacarboline ring (in which one of the carbon atoms of the hydrocarbon ring constituting a carboline ring is further replaced with a nitrogen atom), 1,10-phenanthroline ring, a phthalazine ring, an indole ring, and a cumarin ring. These rings may further have a substituent.

The aromatic heterocyclic ring represented by Ar is preferably a cumarin ring.

In formula (1) above, $R_1$ and $R_2$ independently represent a substituted or unsubstituted alkyl, alkenyl, aryl or heterocyclic group, provided that at least two of $R_1$ and $R_2$ and Ar may combine with each other to form a ring together with a nitrogen atom.

Examples of the alkyl group represented by $R_1$ and $R_2$ include a methyl group, an ethyl group, a propyl group, an isopropyl group, a butyl group, a tert-butyl group, a pentyl group, a hexyl group, an octyl group, a dodecyl group, a tridecyl group, a tetradecyl group and a pentadecyl group.

Examples of the alkenyl group represented by $R_1$ and $R_2$ include a vinyl group, an allyl group, a butenyl group, and an octenyl group.

Examples of the aryl group represented by $R_1$ or $R_2$ include a phenyl group, a naphthyl group, biphenyl group, an anthryl group, a phenanthryl group, an azulenyl group, an acenaphthylenyl group, a fluorenyl group, a phenanthrenyl group, an indenyl group, and a pyrenyl group. These groups may further have a substituent.

Examples of an aromatic heterocyclic ring group in the heterocyclic ring group represented by $R_1$ or $R_2$ include a furyl group, a thienyl group, a cumarinyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a dibenzofuranyl group, a carbazolyl group, a carbolinyl group, a diazacarbazolyl group (in which one of the carbon atoms constituting the carboline ring of the carbolinyl group is substituted with a nitrogen atom), and a phthalazinyl group. Examples of a saturated heterocyclic ring group in the heterocyclic ring group represented by $R_1$ or $R_2$ include a pyrrolidinyl group, an imidazolinyl group, a morphinyl group and an oxazolinyl group.

At least two of $R_1$, $R_2$ and Ar may combine with each other to form a ring together with a nitrogen atom. Examples such a ring include a carbazole ring, an indoline ring, julolidine ring or phenothiazine ring.

It is preferred that $R_1$ and $R_2$ independently represent an alkyl group or an aryl group. The aryl group is preferably a phenyl group or a stilbenzyl group.

In formula (1) above, $R_3$ and $R_4$ independently represent a hydrogen atom, a halogen atom, a cyano group, a substituted or unsubstituted alkyl, alkenyl, aryl, amino or heterocyclic ring group.

Examples of the alkyl, alkenyl, aryl or heterocyclic group represented by $R_3$ and $R_4$ include the same as denoted above in the alkyl, alkenyl, aryl or heterocyclic group represented by $R_1$ and $R_2$.

Examples of the amino group represented by $R_3$ and $R_4$ include an amino group, an ethylamino group, a dimethylamino group, a butylamino group, a cyclopentylamino group, a 2-ethylhexylamino group, a dodecylamino group, an anilinoamino group, a naphthylamine group, and a 2-pyridylamino group.

Examples of the halogen atom represented by $R_3$ and $R_4$ include a fluorine atom, a chlorine atom, and a bromine atom.

In formula (1) above, Z represents a sulfur atom, an oxygen atom, a selenium atom, a substituted or unsubstituted alkylidene group, a substituted or unsubstituted aromatic hydrocarbon ring or a substituted or unsubstituted heterocyclic ring.

Example of the alkylidene group represented by Z include a methylidene group, an ethylidene group, a propylidene group, an isopropylidene group, a pentylidene group, a hexylidene group, an octylidene group, a dodecylidene group, a tridecylidene group, a tetradecylidene group, and a pentadecylidene group. These groups may have further a substituent.

Examples of the aromatic hydrocarbon ring or aromatic heterocyclic ring represented by Z include the same as denoted in the aromatic hydrocarbon ring or aromatic heterocyclic ring represented by Ar above. Examples of the saturated heterocyclic ring represented by Z include a rhodanine ring, a pyrrolidine ring, an imidazolidine ring, a morpholine ring, an oxazolidine ring and a thiohydantoin ring. These rings may have further a substituent.

Z is preferably a sulfur atom or a saturated heterocyclic ring. The saturated heterocyclic ring is preferably a rhodanine ring or a thiohydantoin ring.

In formula (1) above, Y represents a substituted or unsubstituted alkylene group, a substituted or unsubstituted alkenylene group, a substituted or unsubstituted aromatic hydrocarbon ring or a substituted or unsubstituted heterocyclic ring.

Example of the alkylene group represented by Y include a methylene group, an ethylene group, a propylene group, an isopropylene group, a tert-butylene group, a pentylene group, a hexylene group, an octylene group, a dodecylene group, a tridecylene group, a tetradecylene group, and a pentadecylene group. These groups may have further a substituent.

Example of the alkenylene group represented by Y include a vinylene group, an alkylene group, and a butenylene group. These groups may have further a substituent.

Examples of the aromatic hydrocarbon ring or aromatic heterocyclic ring represented by Y include the same as denoted in the aromatic hydrocarbon ring or aromatic heterocyclic ring represented by Ar above. Examples of the saturated heterocyclic ring represented by Y include a pyrrolidine ring, an imidazolidine ring, a morpholine ring, and an oxazolidine ring. These rings may have further a substituent. As the substituent of Y, an electron withdrawing group is preferred.

Y is preferably an alkylene group, and the alkylene group is preferably an ethylene group.

In formula (1) above, X represents an acid group such as a carboxylic acid group, a sulfonic acid group, a nitric acid group, or a phosphoric acid group or their salt group. X is preferably a carboxylic acid group, a sulfonic acid group or a phosphoric acid group.

X is preferably a carboxylic acid group. When X of formula (1) is a carboxylic acid group, the compound exhibits high adsorption capability to an oxide semiconductor, provides a smooth flow of a charge to the oxide semiconductor.

As described above, the rings or groups may further have a substituent.

Examples of the substituent include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, or a pentadecyl group); an cycloalkyl group (for example, a cyclopentyl group or a cyclohexyl group); an alkenyl group (for example, a vinyl group or a allyl group); an alkynyl group (for example, an ethynyl group or a propargyl group); an aryl group (for example, a phenyl group or a naphthyl group); an aromatic heterocyclic ring group (for example, a furyl group, a thienyl group, an indolyl group, coumarinyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl, a carbolinyl group, a diazacarbazolyl group (in which one of the carbon atoms constituting the carboline ring of the carbolinyl group is substituted with a nitrogen atom) or a phthalazinyl group); a saturated heterocyclic ring group (for example, pyrrolidyl, an imidazolidyl group, a morpholyl group or an oxazolidyl group); an alkoxy group (for example, a methoxy group, an ethoxy group, a propyloxy group, a pentyloxy group, a hexyloxy group, an octyloxy group or a dodecyloxy group); a cycloalkoxy group (for example, a cyclopentyloxy group or a cyclohexyloxy group); an aryloxy group (for example, a phenoxy group or a naphthyloxy group); an alkylthio group (for example, a methylthio group, an ethylthio group, a propylthio group, a pentylthio group, a hexylthio group, an octylthio group, or a dodecylthio group); a cycloalkylthio group (for example, a cyclopentylthio group or a cyclohexylthio group), an arylthio group (for example, a phenylthio group or a naphthylthio group); an alkoxycarbonyl group (for example, a methyloxycarbonyl group, an ethyloxycarbonyl group, a butyloxycarbonyl group, an octyloxycarbonyl group or a dodecyloxycarbonyl group); an aryloxycarbonyl group (for example, a phenyloxycarbonyl group or a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group or a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group or a pyridylcarbonyl group); an acyloxy group (for example, an acetyloxy group, an ethylcarbonyloxy group, a butylcarbonyloxy group, an octylcarbonyloxy group, a dodecylcarbonyloxy group or a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group or a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group or a 2-puridylaminocarbonyl group); a ureido group (for example, a methylureido group, an ethylureido group, a pentylureido group, a cyclohexylureido group, an octylureido group, a dodecylureido group, a phenylureido group, a naphthylureido group, or a 2-pyridylaminoureido group); a sulfinyl group (for example, a methylsulfinyl group, an ethylsulfinyl group, a butylsulfonyl group, a cyclohexylsulfinyl group, a 2-ethylhexylsulfinyl group, a dodecylsulfinyl group, a phenylsulfinyl group, a naphthylsulfinyl group or a 2-pyridylsulfinyl group); an alkylsulfonyl group (for example, a methylsulfonyl group, an ethylsulfonyl group, a butylsulfonyl group, a cyclohexylsulfonyl group, a 2-ethylhexylsulfonyl group, or a dodecyl sulfonyl group); an arylsulfonyl group or a heteroaryl sulfonyl group (for example, a phenylsulfonyl group, a naphthylsulfonyl group or a 2-pyridylsulfonyl group); an amino group (for example, an amino group, an ethylamino group, a dimethylamino group, a butylamino group, a cyclopentylamino group, a 2-ethylhexylamino group, a dodecylamino group, an anilino group, a naphthylamino group or a 2-pyridylamino group); a halogen atom (for example, a fluorine atom, a chlorine atom or a bromine atom); a fluorinated hydrocarbon group (for example, a fluoromethyl group, a trifluoromethyl group, a pentafluoroethyl group or a fluorophenyl group); a cyano group; an nitro group; a hydroxyl group, a mercapto group; and a silyl group (for example, a trimethylsilyl group, a triisopropylsilyl group, a triphenylsilyl group or a phenyldiethylsilyl group).

These substituents may further have the substituent described above. A plurality of these substituents may combine with each other to form a ring.

Typical examples of the compound (dye) represented by formula (1) will be listed below, but the invention is not limited thereto. In the partial chemical structures of the exemplified dyes listed below, the line with a wavy line represents a bonding site.

| DYE | R₁ | R₂ | R₃ | R₄ |
|---|---|---|---|---|
| 1 | triphenylethenyl-phenyl group | triphenylethenyl-phenyl group | H | H |
| 2 | (4-methylphenyl)(phenyl)ethenyl-phenyl group | (4-methylphenyl)(phenyl)ethenyl-phenyl group | H | H |
| 3 | bis(4-methylphenyl)ethenyl-phenyl group | bis(4-methylphenyl)ethenyl-phenyl group | H | H |
| 4 | (2,4-dimethylphenyl)(phenyl)ethenyl-phenyl group | (2,4-dimethylphenyl)(phenyl)ethenyl-phenyl group | H | H |
| 5 | (3,4-dimethylphenyl)(phenyl)ethenyl-phenyl group | (3,4-dimethylphenyl)(phenyl)ethenyl-phenyl group | H | H |

-continued
| | | | | |
|---|---|---|---|---|
| 6 | 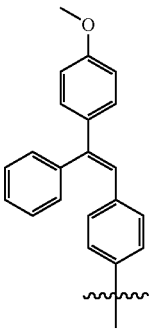 [SMILES: *c1ccc(/C=C(\c2ccccc2)c2ccc(OC)cc2)cc1] | 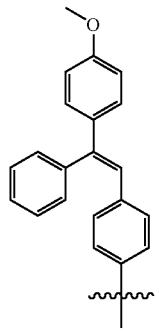 [SMILES: *c1ccc(/C=C(\c2ccccc2)c2ccc(OC)cc2)cc1] | H | H |
| 7 | 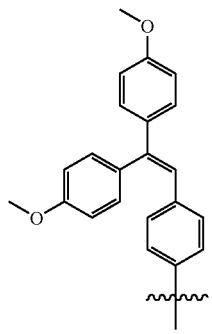 [SMILES: *c1ccc(C=C(c2ccc(OC)cc2)c2ccc(OC)cc2)cc1] | 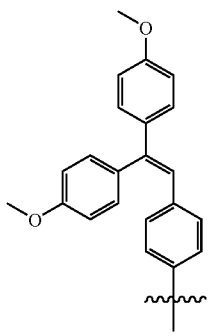 [SMILES: *c1ccc(C=C(c2ccc(OC)cc2)c2ccc(OC)cc2)cc1] | H | H |
| 8 | 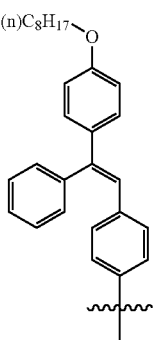 | 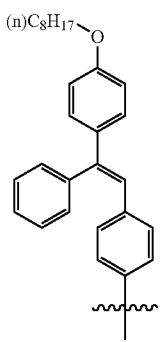 | H | H |
| 9 | 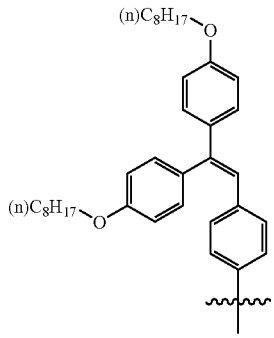 | 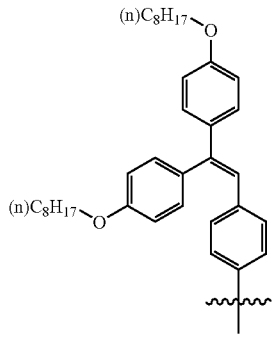 | H | H |
| 10 | 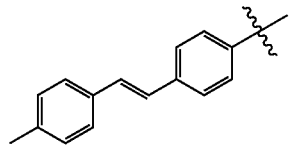 [SMILES: *c1ccc(/C=C/c2ccc(C)cc2)cc1] | 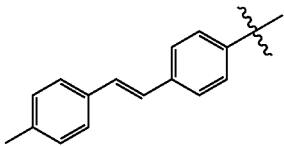 [SMILES: *c1ccc(/C=C/c2ccc(C)cc2)cc1] | H | H |

-continued
| | | | | |
|---|---|---|---|---|
| 11 | 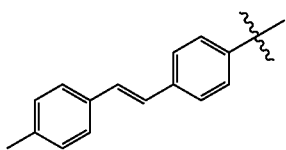 [SMILES: *c1ccc(/C=C/c2ccc(C)cc2)cc1] | 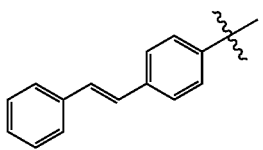 [SMILES: *c1ccc(/C=C/c2ccccc2)cc1] | H | H |
| 12 | 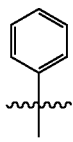 | 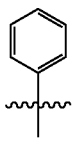 | H | H |
| 13 | 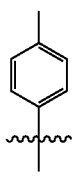 | 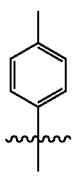 | H | H |
| 14 | 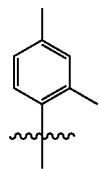 | 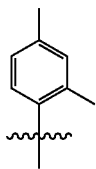 | H | H |
| 15 | 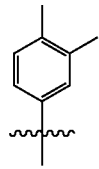 | 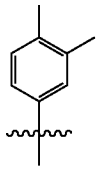 | H | H |
| 16 | 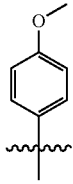 | 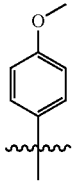 | H | H |
| 17 | 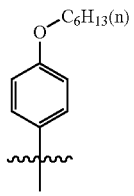 | 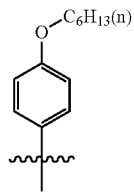 | H | H |
| 18 | 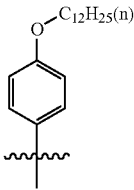 | 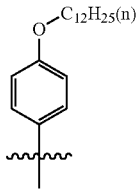 | H | H |
| 19 | 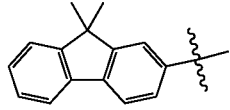 | 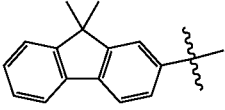 [SMILES: *c1ccc2c(c1)C(C)(C)c1ccccc1-2] | H | H |

-continued
| | | | | |
|---|---|---|---|---|
| 20 |  |  | H | H |
| 21 | 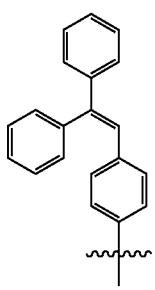 [SMILES: *c1ccc(C=C(c2ccccc2)c2ccccc2)cc1] | 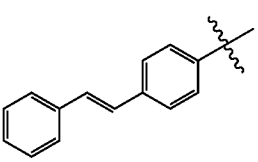 [SMILES: *c1ccc(/C=C/c2ccccc2)cc1] | H | H |
| 22 | 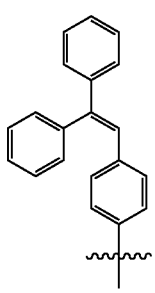 [SMILES: *c1ccc(C=C(c2ccccc2)c2ccccc2)cc1] | | H | H |
| 23 | 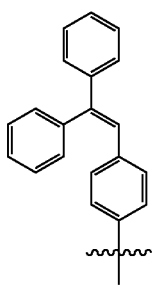 [SMILES: *c1ccc(C=C(c2ccccc2)c2ccccc2)cc1] | 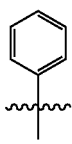 | H | H |
| 24 | 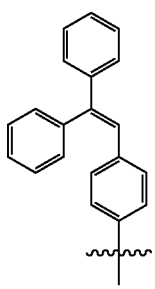 [SMILES: *c1ccc(C=C(c2ccccc2)c2ccccc2)cc1] | 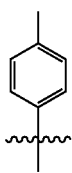 | H | H |
| 25 | 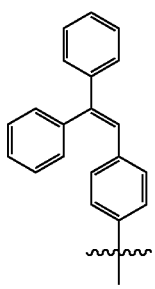 [SMILES: *c1ccc(C=C(c2ccccc2)c2ccccc2)cc1] | 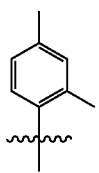 | H | H |

-continued
| | | | | |
|---|---|---|---|---|
| 26 | 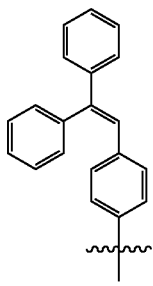 [SMILES: *c1ccc(C=C(c2ccccc2)c2ccccc2)cc1] | 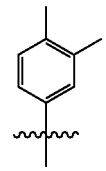 | H | H |
| 27 | 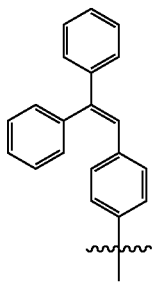 [SMILES: *c1ccc(C=C(c2ccccc2)c2ccccc2)cc1] | 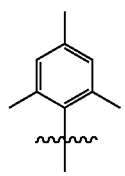 | H | H |
| 28 | 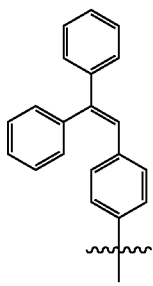 [SMILES: *c1ccc(C=C(c2ccccc2)c2ccccc2)cc1] | 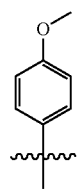 | H | H |
| 29 | 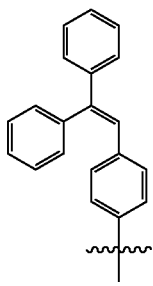 [SMILES: *c1ccc(C=C(c2ccccc2)c2ccccc2)cc1] | 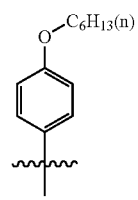 | H | H |
| 30 | 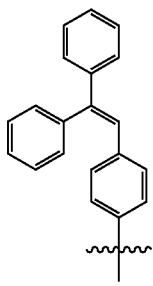 | 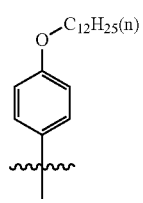 | H | H |

-continued
| | | | | |
|---|---|---|---|---|
| 31 | 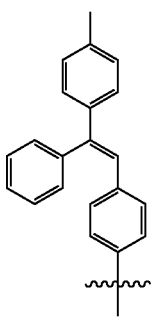 | 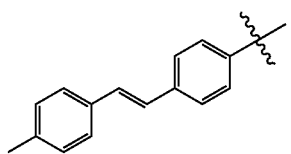 [SMILES: *c1ccc(/C=C/c2ccc(C)cc2)cc1] | H | H |
| 32 | 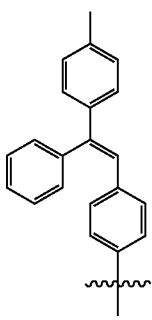 | 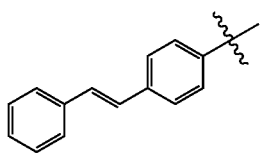 [SMILES: *c1ccc(/C=C/c2ccccc2)cc1] | H | H |
| 33 | 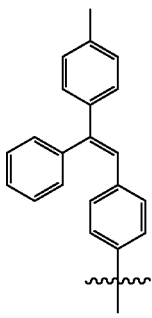 | 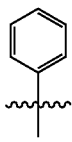 | H | H |
| 34 | 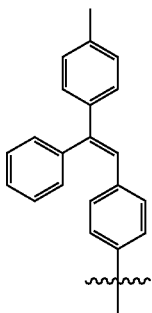 | 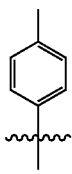 | H | H |
| 35 | 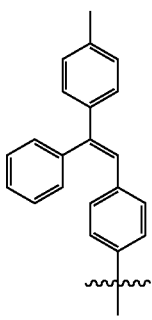 | 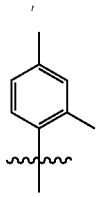 | H | H |

-continued
| 36 | 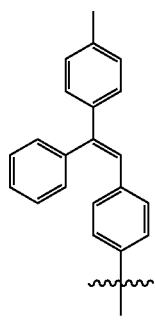 | 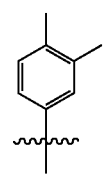 | H | H |
| 37 | 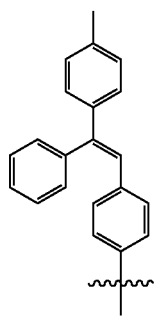 | 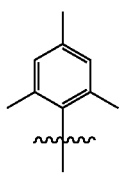 | H | H |
| 38 | 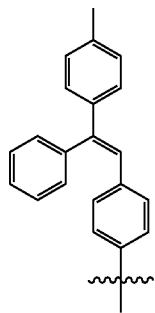 | 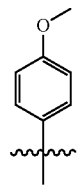 | H | H |
| 39 | 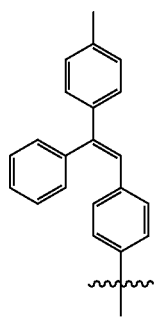 | 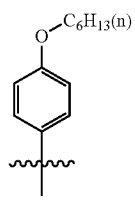 | H | H |
| 40 | 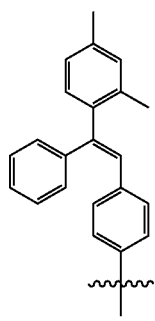 | 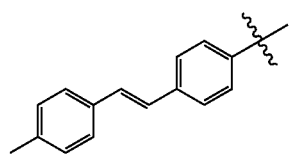 [SMILES: *c1ccc(/C=C/c2ccc(C)cc2)cc1] | H | H |

-continued
| | | | | |
|---|---|---|---|---|
| 41 | 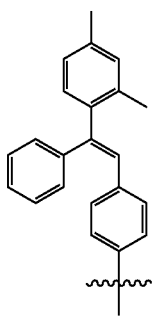 | 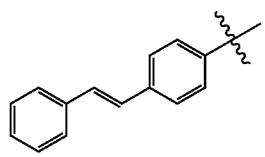 [SMILES: *c1ccc(/C=C/c2ccccc2)cc1] | H | H |
| 42 | 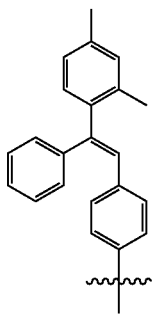 | 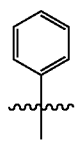 | H | H |
| 43 | 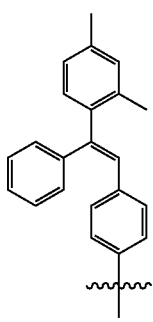 | 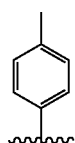 | H | H |
| 44 | 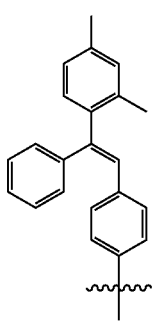 | 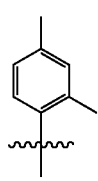 [SMILES: *c1ccc(C)cc1C] | H | H |
| 45 | 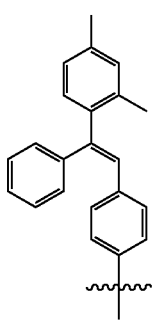 | 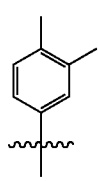 | H | H |

| | | | | |
|---|---|---|---|---|
| 46 | 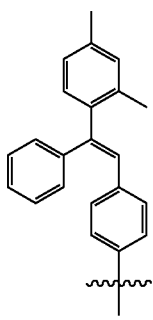 | 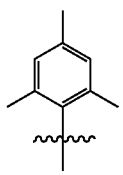 | H | H |
| 47 | 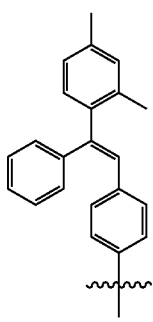 | 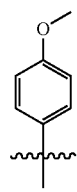 | H | H |
| 48 | 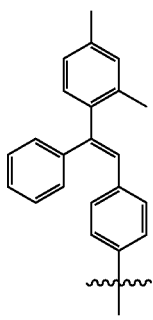 [SMILES: *c1ccc(/C=C(\c2ccccc2)c2ccc(C)cc2C)cc1] | 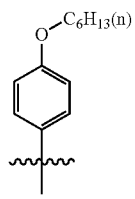 | H | H |
| 49 | 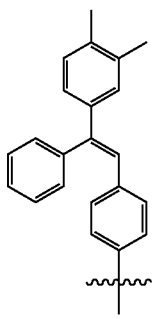 | 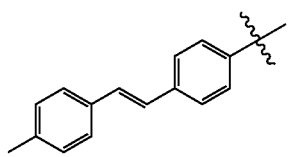 [SMILES: *c1ccc(/C=C/c2ccc(C)cc2)cc1] | H | H |
| 50 | 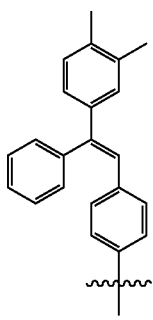 | 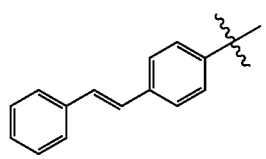 [SMILES: *c1ccc(/C=C/c2ccccc2)cc1] | H | H |

-continued
| | | | | |
|---|---|---|---|---|
| 51 | 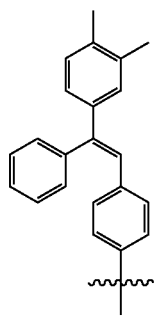 | 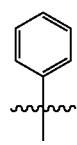 | H | H |
| 52 | 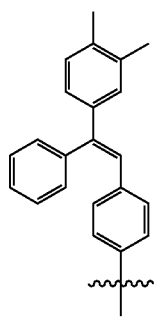 | 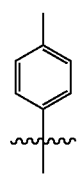 | H | H |
| 53 | 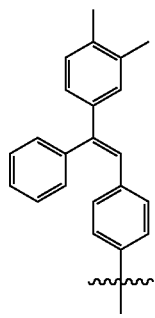 | 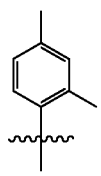 | H | H |
| 54 | 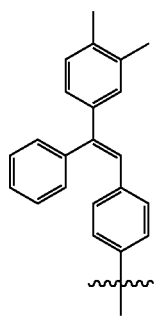 | 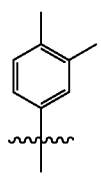 | H | H |
| 55 | 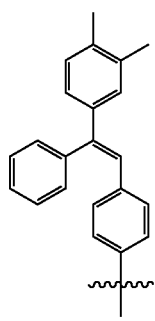 | 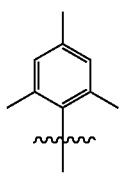 | H | H |

-continued
| | | | | |
|---|---|---|---|---|
| 56 | 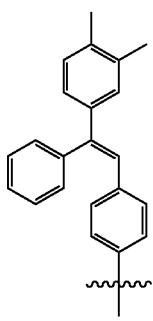 | 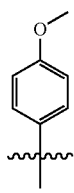 | H | H |
| 57 | 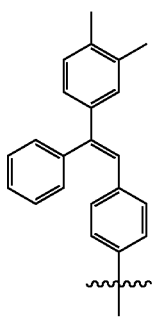 | 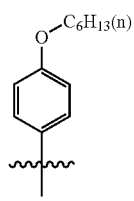 | H | H |
| 58 | 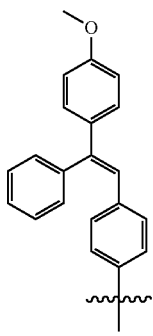 [SMILES: *c1ccc(/C=C(\c2ccccc2)c2ccc(OC)cc2)cc1] | 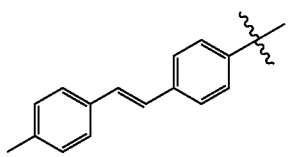 [SMILES: *c1ccc(/C=C/c2ccc(C)cc2)cc1] | H | H |
| 59 | 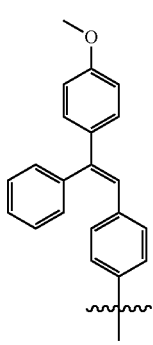 [SMILES: *c1ccc(/C=C(\c2ccccc2)c2ccc(OC)cc2)cc1] | 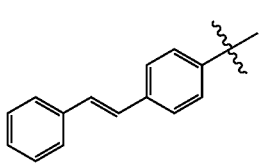 [SMILES: *c1ccc(/C=C/c2ccccc2)cc1] | H | H |
| 60 | 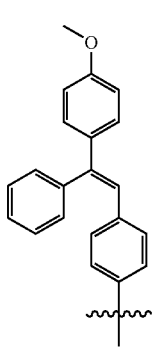 [SMILES: *c1ccc(/C=C(\c2ccccc2)c2ccc(OC)cc2)cc1] | 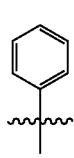 | H | H |

| | | | | |
|---|---|---|---|---|
| 61 | 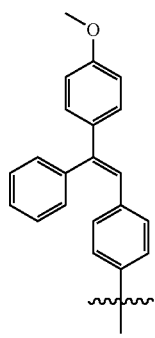 [SMILES: *c1ccc(/C=C(\c2ccccc2)c2ccc(OC)cc2)cc1] | 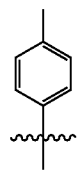 | H | H |
| 62 | 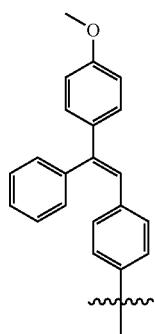 [SMILES: *c1ccc(/C=C(\c2ccccc2)c2ccc(OC)cc2)cc1] | 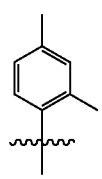 | H | H |
| 63 | 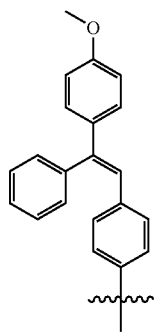 [SMILES: *c1ccc(/C=C(\c2ccccc2)c2ccc(OC)cc2)cc1] | 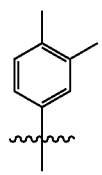 [SMILES: *c1ccc(C)c(C)c1] | H | H |
| 64 | 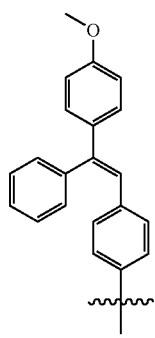 [SMILES: *c1ccc(/C=C(\c2ccccc2)c2ccc(OC)cc2)cc1] | 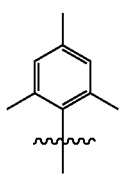 | H | H |

-continued
| | | | | |
|---|---|---|---|---|
| 65 | 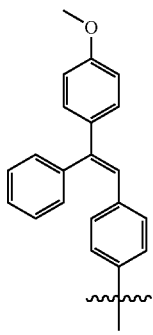 [SMILES: *c1ccc(/C=C(\c2ccccc2)c2ccc(OC)cc2)cc1] | 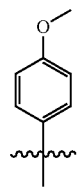 | H | H |
| 66 | 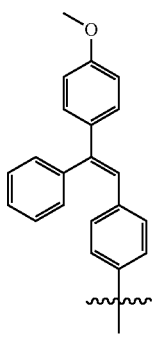 [SMILES: *c1ccc(/C=C(\c2ccccc2)c2ccc(OC)cc2)cc1] | 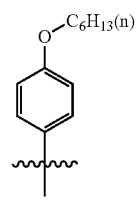 | H | H |
| 67 | 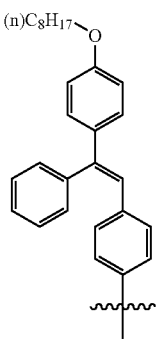 | 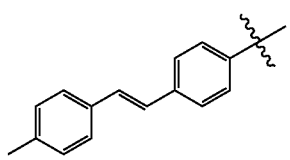 [SMILES: *c1ccc(/C=C/c2ccc(C)cc2)cc1] | H | H |
| 68 | 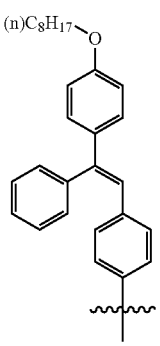 | 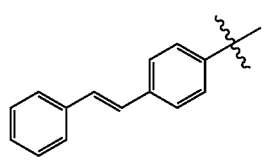 [SMILES: *c1ccc(/C=C/c2ccccc2)cc1] | H | H |

-continued
| | | | | |
|---|---|---|---|---|
| 69 | 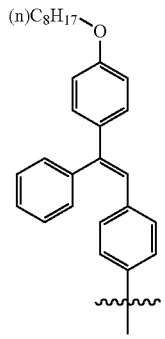 | 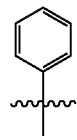 | H | H |
| 70 | 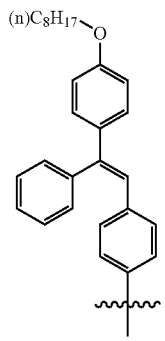 | 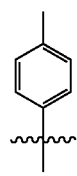 | H | H |
| 71 | 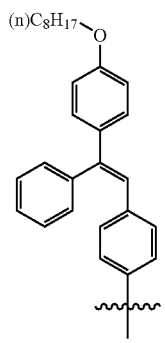 | 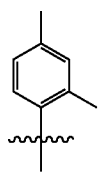 | H | H |
| 72 | 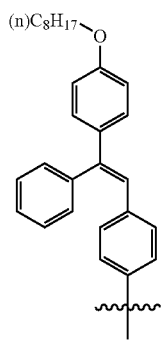 | 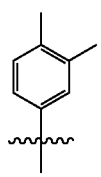 | H | H |

-continued

| | | | | |
|---|---|---|---|---|
| 73 | (n)C₈H₁₇—O—C₆H₄—C(Ph)=CH—C₆H₄—⁀ | mesityl-⁀ | H | H |
| 74 | (n)C₈H₁₇—O—C₆H₄—C(Ph)=CH—C₆H₄—⁀ | 4-MeO-C₆H₄—⁀ | H | H |
| 75 | (n)C₈H₁₇—O—C₆H₄—C(Ph)=CH—C₆H₄—⁀ | 4-(n)C₆H₁₃O-C₆H₄—⁀ | H | H |
| 76 | 4-Me-C₆H₄—CH=CH—C₆H₄—⁀ | Ph—CH=CH—C₆H₄—⁀ | H | H |
| 77 | 4-Me-C₆H₄—CH=CH—C₆H₄—⁀ | Ph—⁀ | H | H |
| 78 | 4-Me-C₆H₄—CH=CH—C₆H₄—⁀ | 4-Me-C₆H₄—⁀ | H | H |

US 8,395,041 B2
-continued
| | | | | |
|---|---|---|---|---|
| 79 | 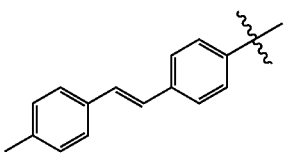 [SMILES: *c1ccc(/C=C/c2ccc(C)cc2)cc1] | 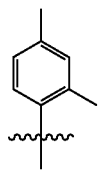 | H | H |
| 80 | 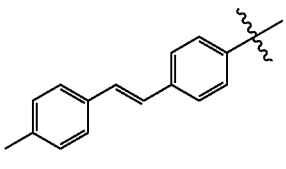 [SMILES: *c1ccc(/C=C/c2ccc(C)cc2)cc1] | 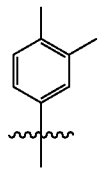 | H | H |
| 81 | 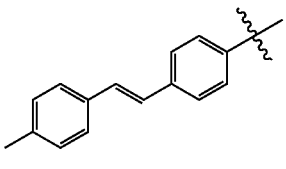 [SMILES: *c1ccc(/C=C/c2ccc(C)cc2)cc1] | 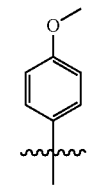 | H | H |
| 82 | 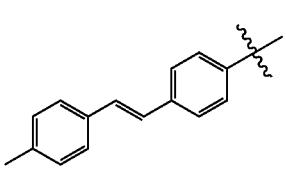 [SMILES: *c1ccc(/C=C/c2ccc(C)cc2)cc1] | 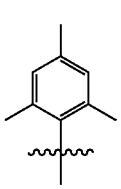 | H | H |
| 83 | 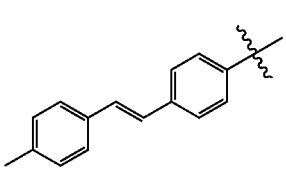 [SMILES: *c1ccc(/C=C/c2ccc(C)cc2)cc1] | 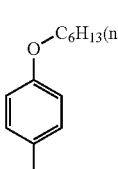 | H | H |
| 84 | 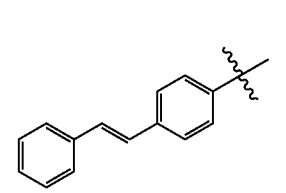 [SMILES: *c1ccc(/C=C/c2ccccc2)cc1] | 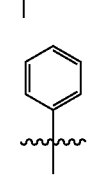 | H | H |
| 85 | 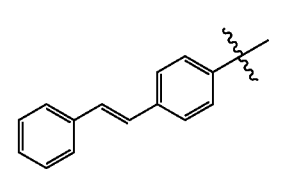 [SMILES: *c1ccc(/C=C/c2ccccc2)cc1] | 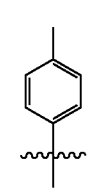 | H | H |
| 86 | 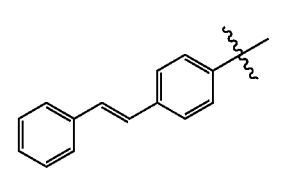 [SMILES: *c1ccc(/C=C/c2ccccc2)cc1] | 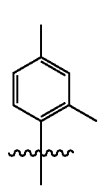 [SMILES: *c1ccc(C)cc1C] | H | H |
| 87 | 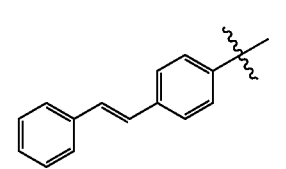 [SMILES: *c1ccc(/C=C/c2ccccc2)cc1] | 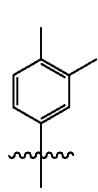 | H | H |

-continued
| | | | H | H |
|---|---|---|---|---|
| 88 | 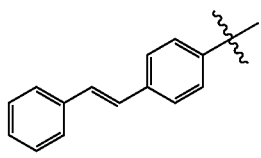 [SMILES: *c1ccc(/C=C/c2ccccc2)cc1] | 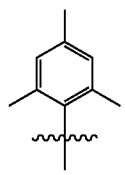 | H | H |
| 89 | 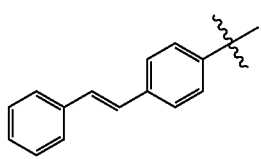 [SMILES: *c1ccc(/C=C/c2ccccc2)cc1] | 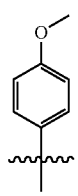 | H | H |
| 90 | 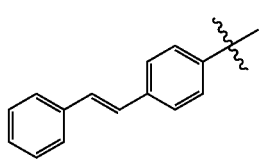 [SMILES: *c1ccc(/C=C/c2ccccc2)cc1] | 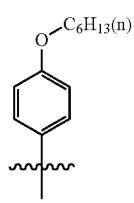 | H | H |
| 91 | 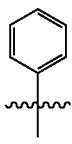 | 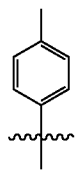 | H | H |
| 92 | 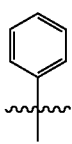 | 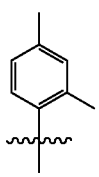 | H | H |
| 93 |  | 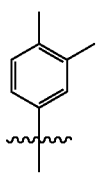 | H | H |
| 94 | 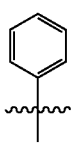 | 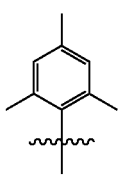 | H | H |
| 95 | 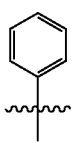 | 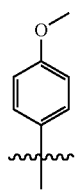 | H | H |

-continued
| | | | | |
|---|---|---|---|---|
| 96 | 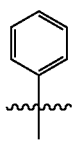 | 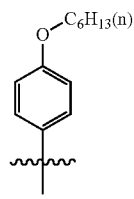 | H | H |
| 97 | 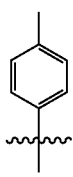 [SMILES: *c1ccc(C)cc1] | 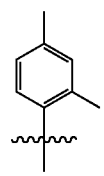 | H | H |
| 98 | 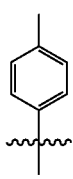 [SMILES: *c1ccc(C)cc1] | 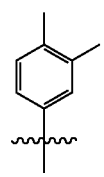 [SMILES: *c1ccc(C)c(C)c1] | H | H |
| 99 | 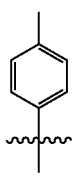 [SMILES: *c1ccc(C)cc1] | 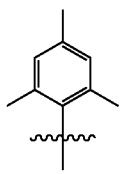 | H | H |
| 100 | 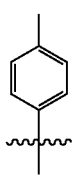 | 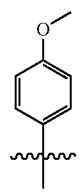 | H | H |
| 101 | 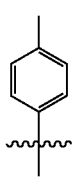 [SMILES: *c1ccc(C)cc1] | 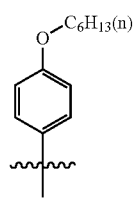 | H | H |
| 102 | 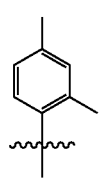 | 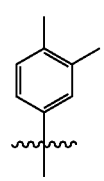 | H | H |
| 103 | 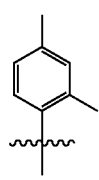 [SMILES: *c1ccc(C)cc1C] | 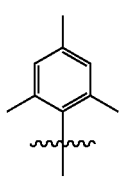 | H | H |

-continued
| | | | | |
|---|---|---|---|---|
| 104 | 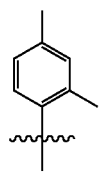 [SMILES: *c1ccc(C)cc1C] | 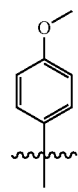 | H | H |
| 105 | 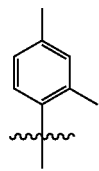 [SMILES: *c1ccc(C)cc1C] | 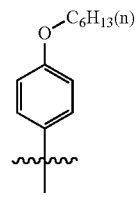 | H | H |
| 106 | 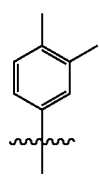 | 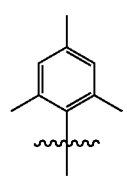 | H | H |
| 107 | 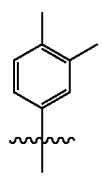 | 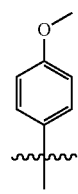 | H | H |
| 108 | 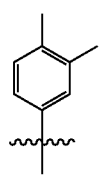 | 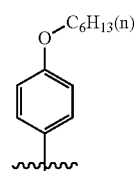 | H | H |
| 109 | 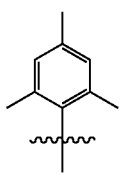 | 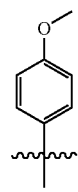 | H | H |
| 110 | 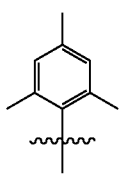 | 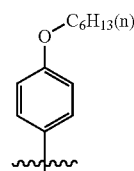 | H | H |
| 111 | 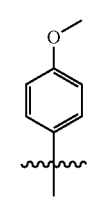 | 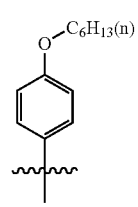 | H | H |

-continued

| | | | | |
|---|---|---|---|---|
| 112 | pyridin-4-yl | pyridin-4-yl | H | H |
| 113 | propenyl | propenyl | H | H |
| 114 | 1,2,2-triphenylethenyl | 1,2,2-triphenylethenyl | H | H |
| 115 | tri(p-tolyl)ethenyl | tri(p-tolyl)ethenyl | H | H |
| 116 | 2,4-dimethylphenyl diphenylethenyl | 3,4-dimethylphenyl diphenylethenyl | H | H |
| 117 | 4-methoxyphenyl diphenylethenyl | 4-methoxyphenyl diphenylethenyl | H | H |

-continued
| | | | | |
|---|---|---|---|---|
| 118 | 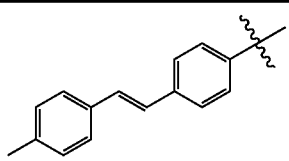 | 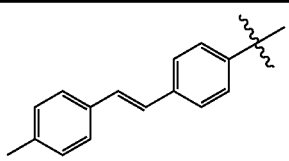 | H | H |
| 119 | 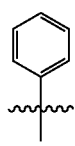 | 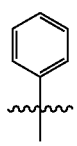 | H | H |
| 120 | 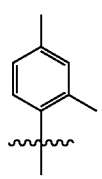 [SMILES: *c1ccc(C)cc1C] | 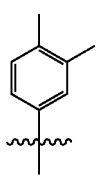 | H | H |
| 121 | 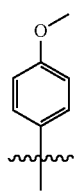 | 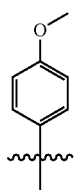 | H | H |
| 122 | 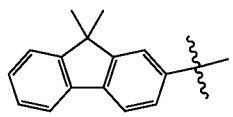 [SMILES: *c1ccc2c(c1)C(C)(C)c1ccccc1-2] | 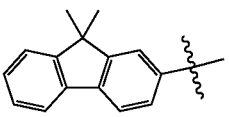 [SMILES: *c1ccc2c(c1)C(C)(C)c1ccccc1-2] | H | H |
| 123 |  |  | H | H |
| 124 | 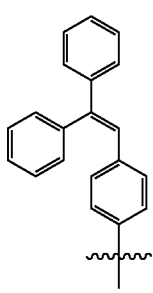 [SMILES: *c1ccc(C=C(c2ccccc2)c2ccccc2)cc1] | 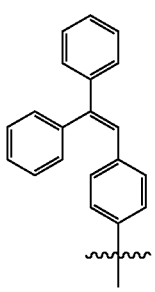 [SMILES: *c1ccc(C=C(c2ccccc2)c2ccccc2)cc1] | H | H |
| 125 | 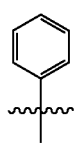 [SMILES: *c1ccccc1] | 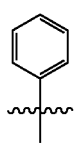 | H | H |
| 126 | 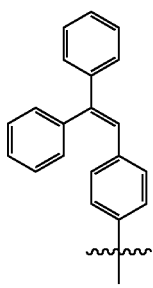 [SMILES: *c1ccc(C=C(c2ccccc2)c2ccccc2)cc1] | 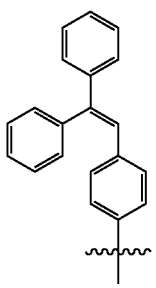 [SMILES: *c1ccc(C=C(c2ccccc2)c2ccccc2)cc1] | H | H |

| | 51 | 52 | | |
|---|---|---|---|---|
| 127 | 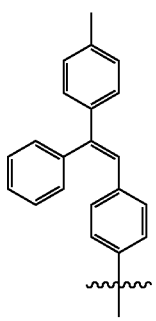 | 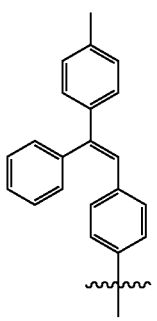 | H | H |
| 128 | 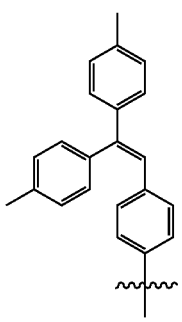 [SMILES: *c1ccc(C=C(c2ccc(C)cc2)c2ccc(C)cc2)cc1] | 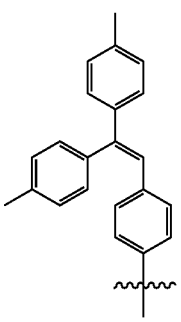 [SMILES: *c1ccc(C=C(c2ccc(C)cc2)c2ccc(C)cc2)cc1] | H | H |
| 129 | 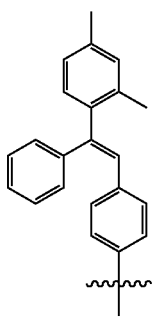 | 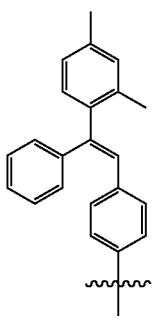 | H | H |
| 130 | 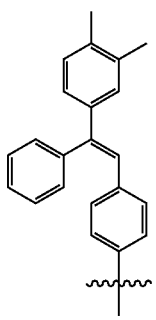 | 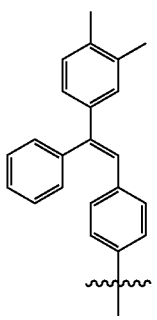 | H | H |
| 131 | 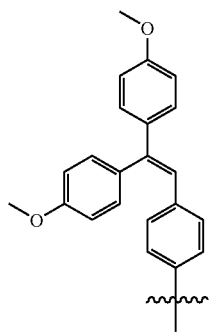 [SMILES: *c1ccc(C=C(c2ccc(OC)cc2)c2ccc(OC)cc2)cc1] | 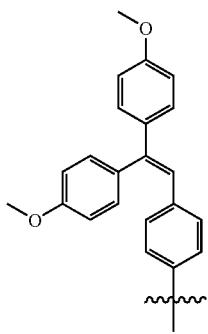 [SMILES: *c1ccc(C=C(c2ccc(OC)cc2)c2ccc(OC)cc2)cc1] | H | H |

-continued
| | | | | H | H |
|---|---|---|---|---|---|
| 132 | 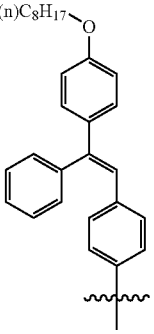 | | 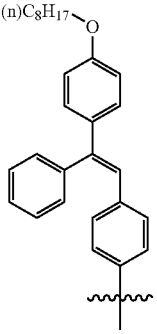 | H | H |
| 133 | 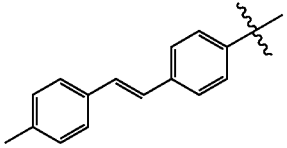 [SMILES: *c1ccc(/C=C/c2ccc(C)cc2)cc1] | | 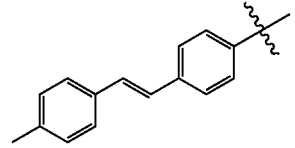 [SMILES: *c1ccc(/C=C/c2ccc(C)cc2)cc1] | H | H |
| 134 | 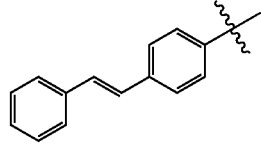 [SMILES: *c1ccc(/C=C/c2ccccc2)cc1] | | 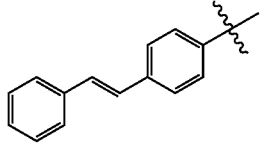 [SMILES: *c1ccc(/C=C/c2ccccc2)cc1] | H | H |
| 135 | 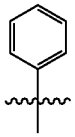 | |  | H | H |
| 136 | 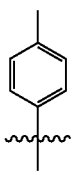 [SMILES: *c1ccc(C)cc1] | | 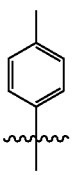 | H | H |
| 137 | 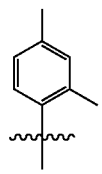 [SMILES: *c1ccc(C)cc1C] | | 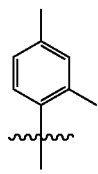 | H | H |
| 138 | 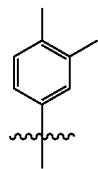 [SMILES: *c1ccc(C)c(C)c1] | | 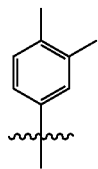 [SMILES: *c1ccc(C)c(C)c1] | H | H |
| 139 | 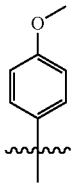 [SMILES: *c1ccc(OC)cc1] | | 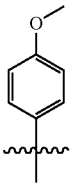 | H | H |

-continued
| | | | | |
|---|---|---|---|---|
| 140 | 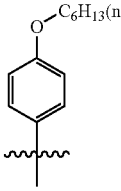 | 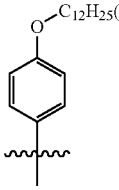 | H | H |
| 141 | 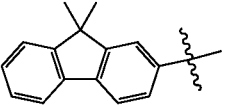 [SMILES: *c1ccc2c(c1)C(C)(C)c1ccccc1-2] | 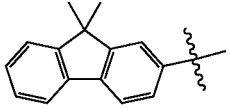 [SMILES: *c1ccc2c(c1)C(C)(C)c1ccccc1-2] | H | H |
| 142 |  |  | H | H |
| 143 | 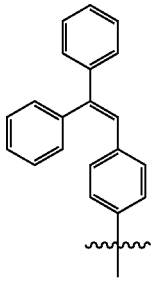 [SMILES: *c1ccc(C=C(c2ccccc2)c2ccccc2)cc1] | 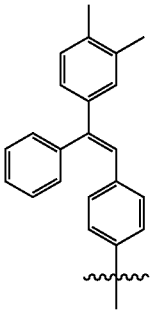 | H | H |
| 144 | 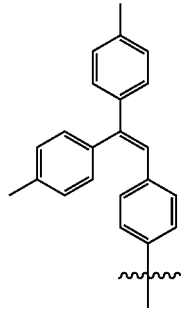 [SMILES: *c1ccc(C=C(c2ccc(C)cc2)c2ccc(C)cc2)cc1] | 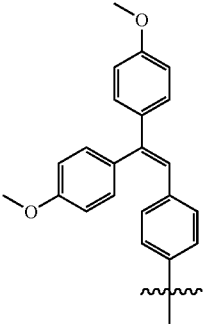 [SMILES: *c1ccc(C=C(c2ccc(OC)cc2)c2ccc(OC)cc2)cc1] | H | H |
| 145 | 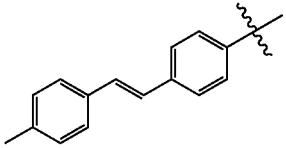 [SMILES: *c1ccc(/C=C/c2ccc(C)cc2)cc1] | 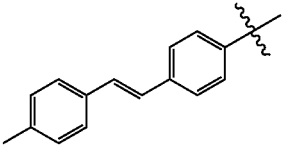 [SMILES: *c1ccc(/C=C/c2ccc(C)cc2)cc1] | H | H |
| 146 | 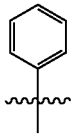 [SMILES: *c1ccccc1] | 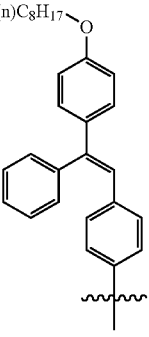 | H | H |

| | | | | |
|---|---|---|---|---|
| 147 | 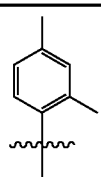 | 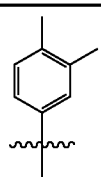 | H | H |
| 148 | 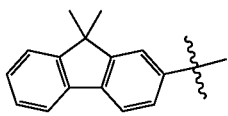 [SMILES: *c1ccc2c(c1)C(C)(C)c1ccccc1-2] | 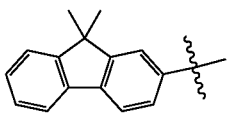 [SMILES: *c1ccc2c(c1)C(C)(C)c1ccccc1-2] | H | H |
| 149 | 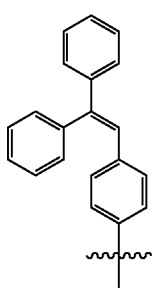 [SMILES: *c1ccc(C=C(c2ccccc2)c2ccccc2)cc1] | 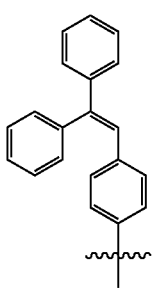 [SMILES: *c1ccc(C=C(c2ccccc2)c2ccccc2)cc1] | H | H |
| 150 | 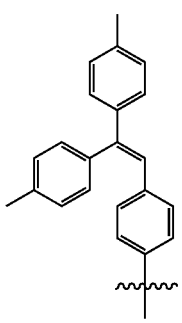 [SMILES: *c1ccc(C=C(c2ccc(C)cc2)c2ccc(C)cc2)cc1] | 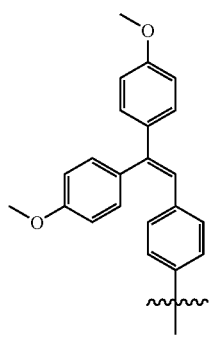 [SMILES: *c1ccc(C=C(c2ccc(OC)cc2)c2ccc(OC)cc2)cc1] | H | H |
| 151 | 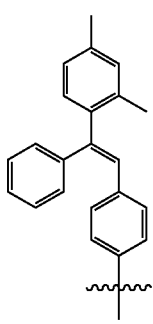 [SMILES: *c1ccc(/C=C(\c2ccccc2)c2ccc(C)cc2C)cc1] | 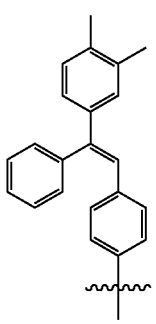 | H | H |
| 152 | 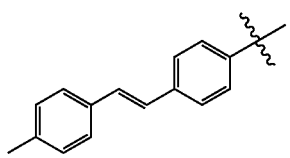 [SMILES: *c1ccc(/C=C/c2ccc(C)cc2)cc1] | 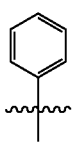 | H | H |
| 153 |  | 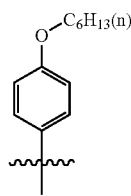 | H | H |

-continued
| | | | | |
|---|---|---|---|---|
| 154 | 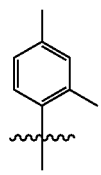 | 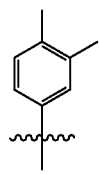 | H | H |
| 155 | 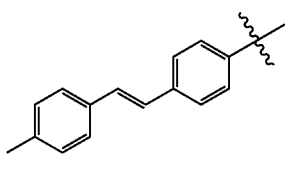 [SMILES: *c1ccc(/C=C/c2ccc(C)cc2)cc1] | 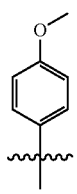 | H | H |
| 156 | 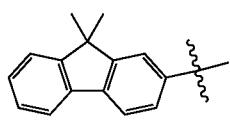 [SMILES: *c1ccc2c(c1)C(C)(C)c1ccccc1-2] | 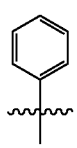 | H | H |
| 157 | 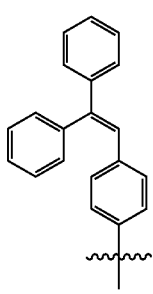 [SMILES: *c1ccc(C=C(c2ccccc2)c2ccccc2)cc1] | 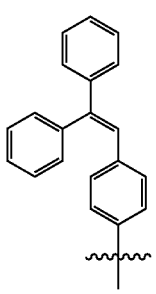 [SMILES: *c1ccc(C=C(c2ccccc2)c2ccccc2)cc1] | H |  |
| 158 | 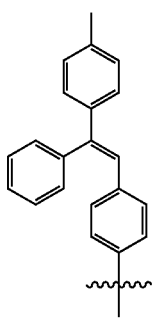 [SMILES: *c1ccc(/C=C(\c2ccccc2)c2ccc(C)cc2)cc1] | 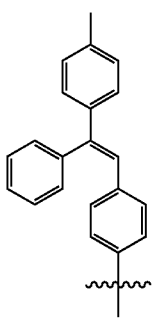 | H | 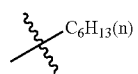 |
| 159 | 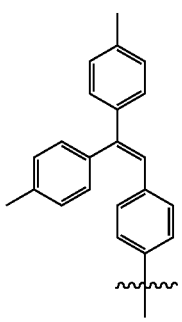 [SMILES: *c1ccc(C=C(c2ccc(C)cc2)c2ccc(C)cc2)cc1] | 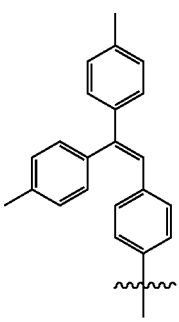 [SMILES: *c1ccc(C=C(c2ccc(C)cc2)c2ccc(C)cc2)cc1] | H | 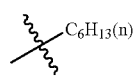 |

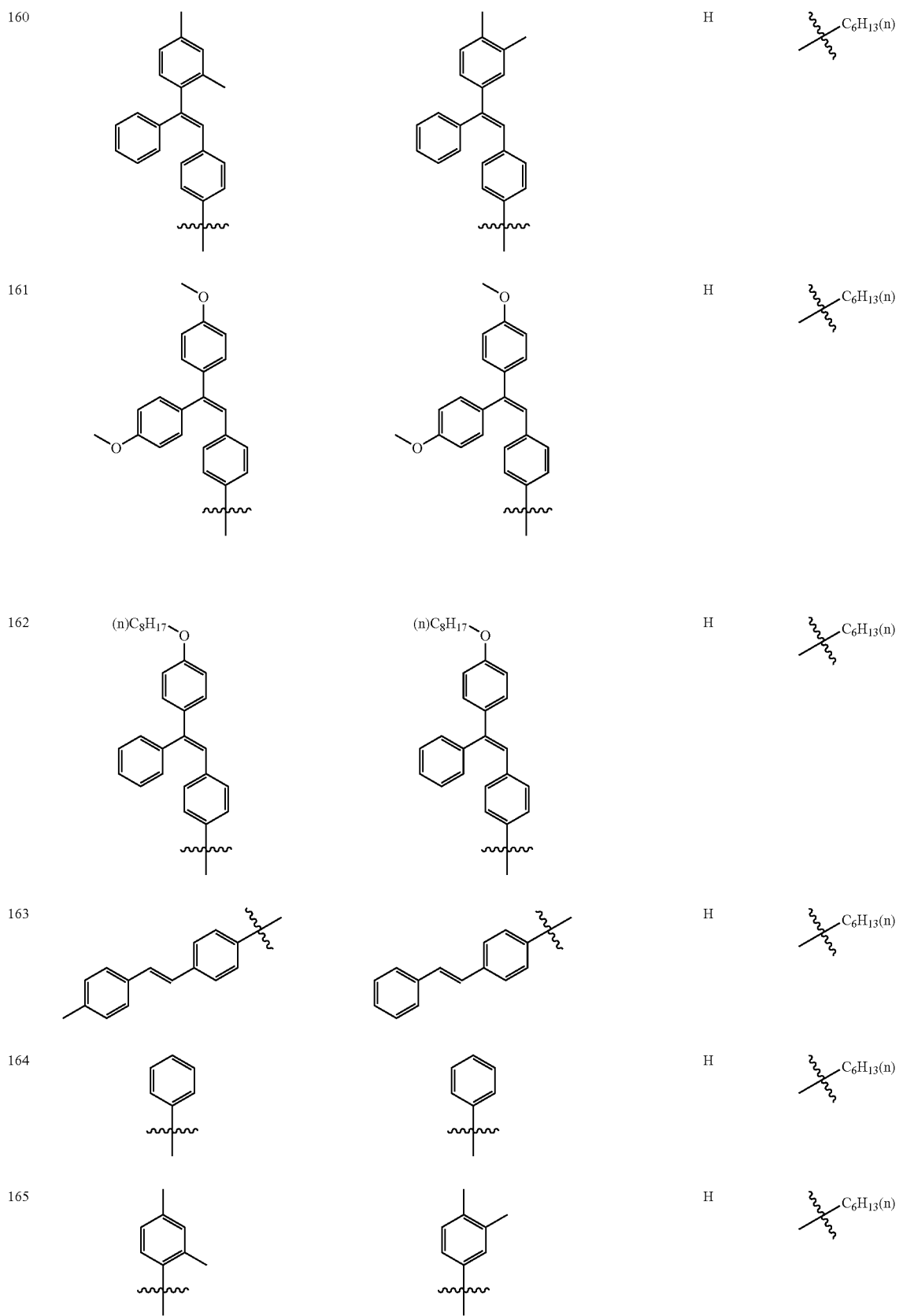

-continued
| | | | | |
|---|---|---|---|---|
| 166 | 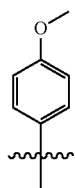 | 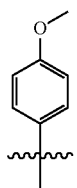 | H | 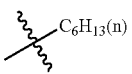 |
| 167 | 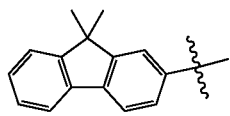 [SMILES: *c1ccc2c(c1)C(C)(C)c1ccccc1-2] | 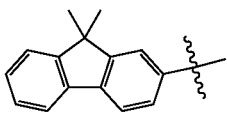 [SMILES: *c1ccc2c(c1)C(C)(C)c1ccccc1-2] | H | 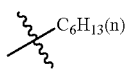 |
| 168 | 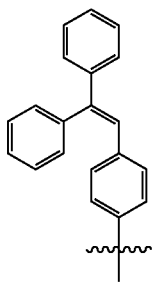 [SMILES: *c1ccc(C=C(c2ccccc2)c2ccccc2)cc1] | 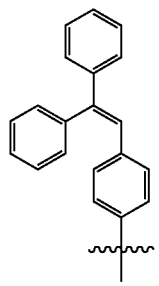 [SMILES: *c1ccc(C=C(c2ccccc2)c2ccccc2)cc1] | H | 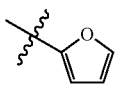 |
| 169 | 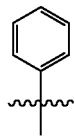 | 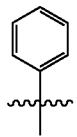 | H | 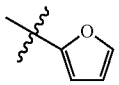 [SMILES: *c1ccco1] |
| 170 | 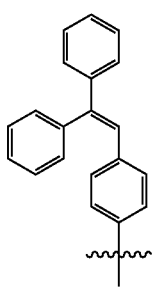 [SMILES: *c1ccc(C=C(c2ccccc2)c2ccccc2)cc1] | 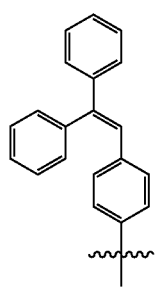 [SMILES: *c1ccc(C=C(c2ccccc2)c2ccccc2)cc1] | 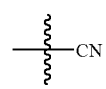 | H |
| 171 | 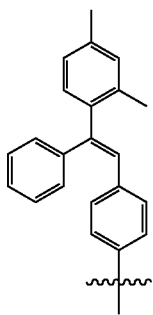 | 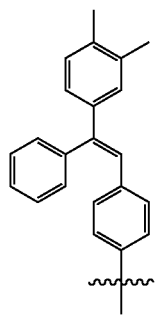 | 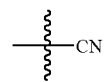 | H |

-continued
| | | | | |
|---|---|---|---|---|
| 172 | 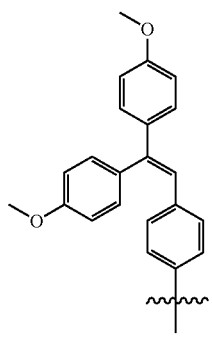 [SMILES: *c1ccc(C=C(c2ccc(OC)cc2)c2ccc(OC)cc2)cc1] | 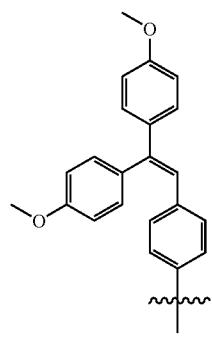 [SMILES: *c1ccc(C=C(c2ccc(OC)cc2)c2ccc(OC)cc2)cc1] | 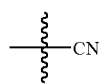 | H |
| 173 | 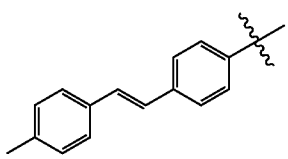 [SMILES: *c1ccc(/C=C/c2ccc(C)cc2)cc1] | 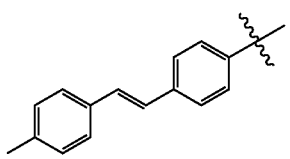 [SMILES: *c1ccc(/C=C/c2ccc(C)cc2)cc1] | 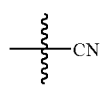 | H |
| 174 |  | 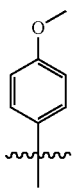 | 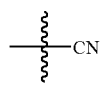 | H |
| 175 | 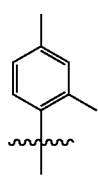 | 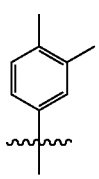 | 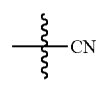 | H |
| 176 | 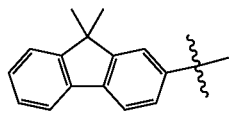 [SMILES: *c1ccc2c(c1)C(C)(C)c1ccccc1-2] | 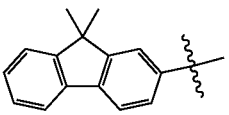 [SMILES: *c1ccc2c(c1)C(C)(C)c1ccccc1-2] | 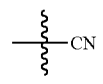 | H |
| 177 | 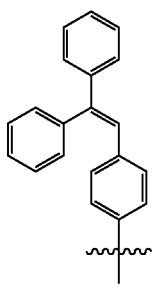 [SMILES: *c1ccc(C=C(c2ccccc2)c2ccccc2)cc1] | 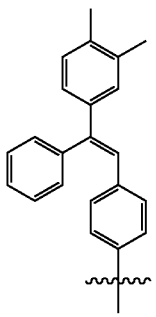 | 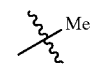 | H |
| 178 | 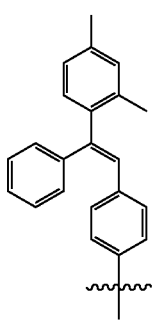 | 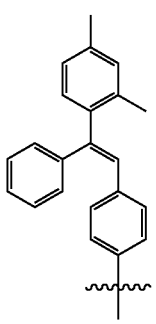 | 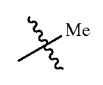 | H |

-continued
| | | | | |
|---|---|---|---|---|
| 179 | 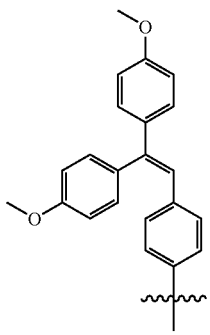 [SMILES: *c1ccc(C=C(c2ccc(OC)cc2)c2ccc(OC)cc2)cc1] | 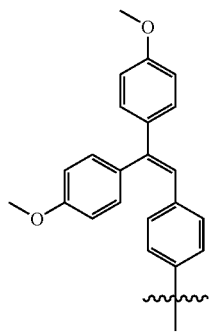 [SMILES: *c1ccc(C=C(c2ccc(OC)cc2)c2ccc(OC)cc2)cc1] |  Me | H |
| 180 | 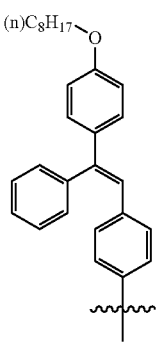 | 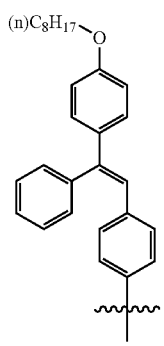 |  Me | H |
| 181 | 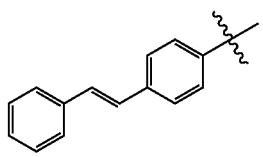 [SMILES: *c1ccc(/C=C/c2ccccc2)cc1] | 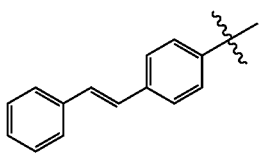 [SMILES: *c1ccc(/C=C/c2ccccc2)cc1] |  Me | H |
| 182 | 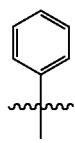 [SMILES: *c1ccccc1] | 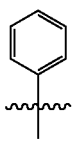 |  Me | H |
| 183 | 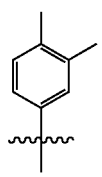 | 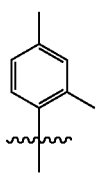 |  Me | H |
| 184 | 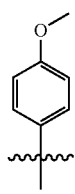 | 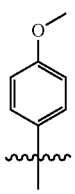 |  Me | H |
| 185 | 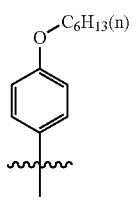 | 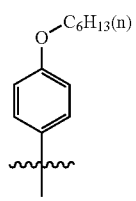 |  Me | H |

-continued
| | 69 | 70 | | |
|---|---|---|---|---|
| 186 | 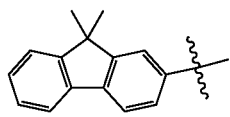 [SMILES: *c1ccc2c(c1)C(C)(C)c1ccccc1-2] | 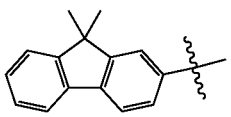 [SMILES: *c1ccc2c(c1)C(C)(C)c1ccccc1-2] |  Me | H |
| 187 | 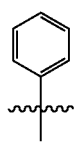 | 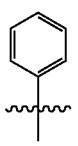 |  Br | H |
| 188 | 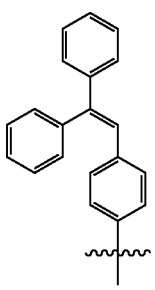 [SMILES: *c1ccc(C=C(c2ccccc2)c2ccccc2)cc1] | 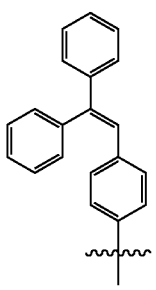 [SMILES: *c1ccc(C=C(c2ccccc2)c2ccccc2)cc1] |  Br | H |
| 189 | 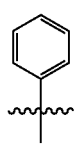 | 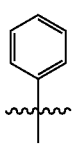 |  NH$_2$ | H |
| 190 | 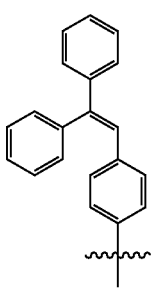 [SMILES: *c1ccc(C=C(c2ccccc2)c2ccccc2)cc1] | 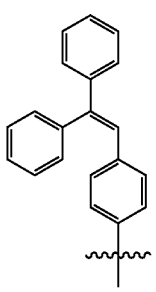 [SMILES: *c1ccc(C=C(c2ccccc2)c2ccccc2)cc1] |  NH$_2$ | H |
| 191 |  | 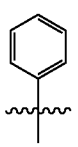 | 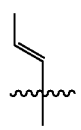 | H |
| 192 | 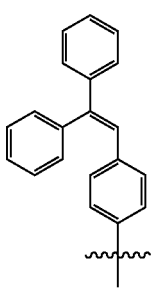 [SMILES: *c1ccc(C=C(c2ccccc2)c2ccccc2)cc1] | 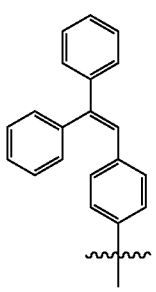 [SMILES: *c1ccc(C=C(c2ccccc2)c2ccccc2)cc1] | 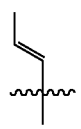 | H |
| 193 | 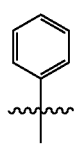 | 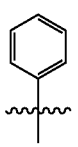 | 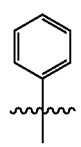 | H |

| | 71 | 72 | | |
|---|---|---|---|---|
| 194 | 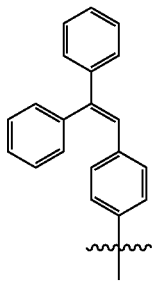 [SMILES: *c1ccc(C=C(c2ccccc2)c2ccccc2)cc1] | 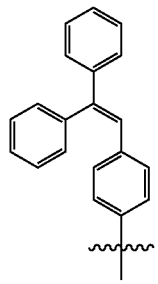 [SMILES: *c1ccc(C=C(c2ccccc2)c2ccccc2)cc1] | 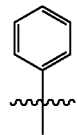 | H |
| 195 | 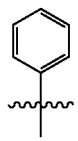 | 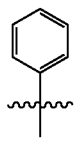 | H | 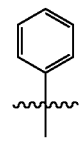 |
| 196 | 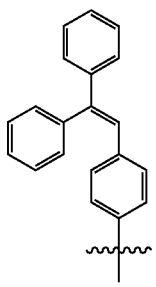 [SMILES: *c1ccc(C=C(c2ccccc2)c2ccccc2)cc1] | 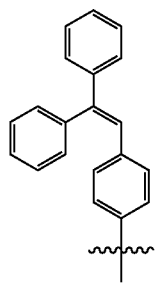 [SMILES: *c1ccc(C=C(c2ccccc2)c2ccccc2)cc1] | H | 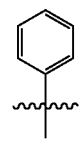 |
| 197 | 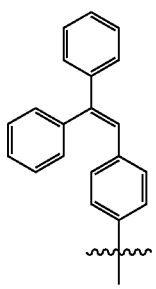 [SMILES: *c1ccc(C=C(c2ccccc2)c2ccccc2)cc1] | 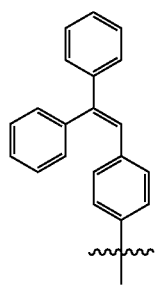 [SMILES: *c1ccc(C=C(c2ccccc2)c2ccccc2)cc1] | H | H |
| 198 | 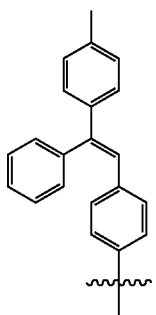 | 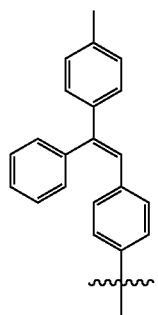 [SMILES: *c1ccc(/C=C(\c2ccccc2)c2ccc(C)cc2)cc1] | H | H |

| | | | | |
|---|---|---|---|---|
| 199 | 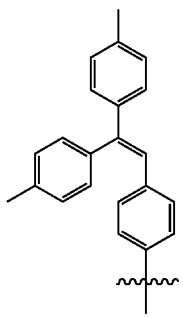 [SMILES: *c1ccc(C=C(c2ccc(C)cc2)c2ccc(C)cc2)cc1] | 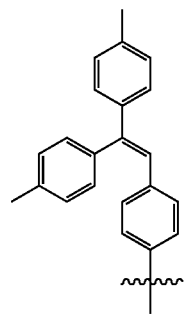 [SMILES: *c1ccc(C=C(c2ccc(C)cc2)c2ccc(C)cc2)cc1] | H | H |
| 200 | 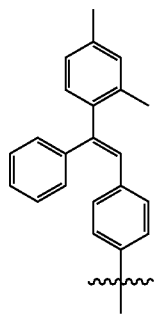 | 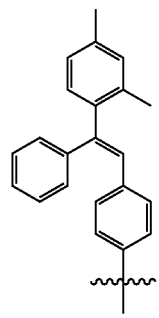 [SMILES: *c1ccc(/C=C(\c2ccccc2)c2ccc(C)cc2C)cc1] | H | H |
| 201 | 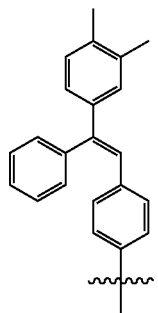 | 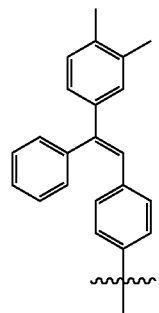 [SMILES: *c1ccc(/C=C(\c2ccccc2)c2ccc(C)c(C)c2)cc1] | H | H |
| 202 | 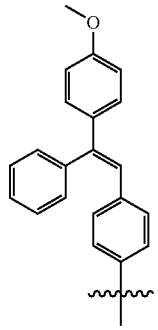 [SMILES: *c1ccc(/C=C(\c2ccccc2)c2ccc(OC)cc2)cc1] | 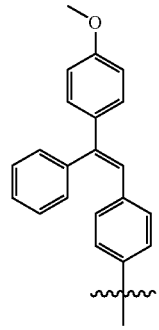 [SMILES: *c1ccc(/C=C(\c2ccccc2)c2ccc(OC)cc2)cc1] | H | H |
| 203 | 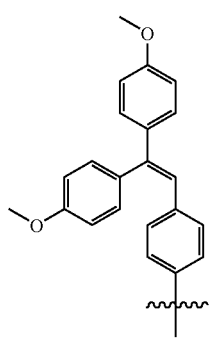 [SMILES: *c1ccc(C=C(c2ccc(OC)cc2)c2ccc(OC)cc2)cc1] | 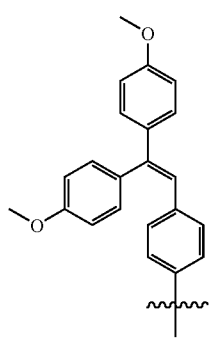 [SMILES: *c1ccc(C=C(c2ccc(OC)cc2)c2ccc(OC)cc2)cc1] | H | H |

-continued
| | | | | |
|---|---|---|---|---|
| 204 | 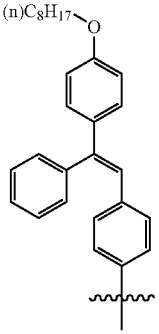 | 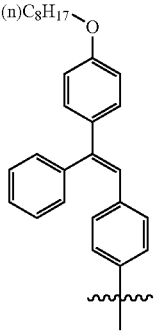 | H | H |
| 205 | 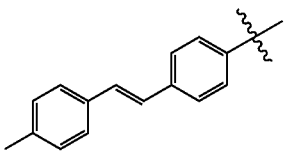 [SMILES: *c1ccc(/C=C/c2ccc(C)cc2)cc1] | 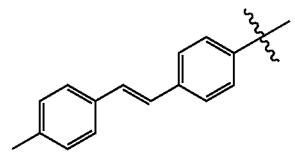 [SMILES: *c1ccc(/C=C/c2ccc(C)cc2)cc1] | H | H |
| 206 | 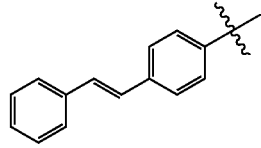 [SMILES: *c1ccc(/C=C/c2ccccc2)cc1] | 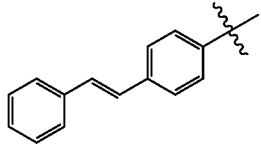 [SMILES: *c1ccc(/C=C/c2ccccc2)cc1] | H | H |
| 207 | 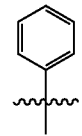 | 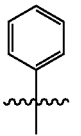 | H | H |
| 208 | 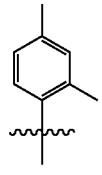 | 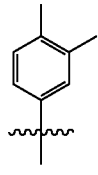 | H | H |
| 209 | 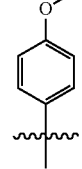 | 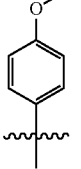 | H | H |
| 210 | 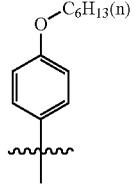 | 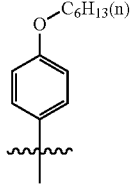 | H | H |
| 211 | 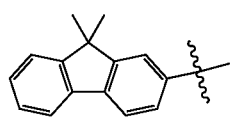 [SMILES: *c1ccc2c(c1)C(C)(C)c1ccccc1-2] | 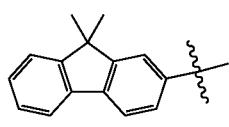 [SMILES: *c1ccc2c(c1)C(C)(C)c1ccccc1-2] | H | H |

| | | | | |
|---|---|---|---|---|
| 212 | 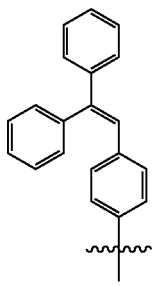 [SMILES: *c1ccc(C=C(c2ccccc2)c2ccccc2)cc1] | 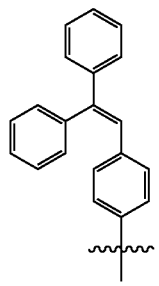 [SMILES: *c1ccc(C=C(c2ccccc2)c2ccccc2)cc1] | H | H |
| 213 | 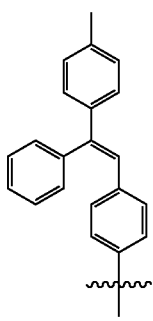 | 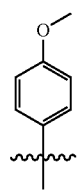 | H | H |
| 214 | 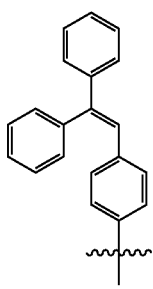 [SMILES: *c1ccc(C=C(c2ccccc2)c2ccccc2)cc1] | 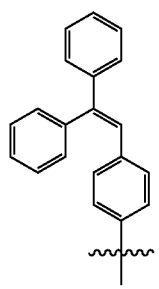 [SMILES: *c1ccc(C=C(c2ccccc2)c2ccccc2)cc1] | H | H |
| 215 | 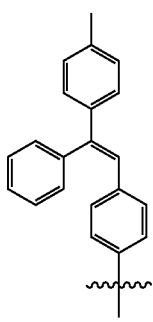 [SMILES: *c1ccc(/C=C(\c2ccccc2)c2ccc(C)cc2)cc1] | 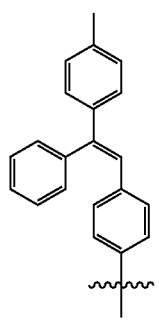 [SMILES: *c1ccc(/C=C(\c2ccccc2)c2ccc(C)cc2)cc1] | H | H |
| 216 | 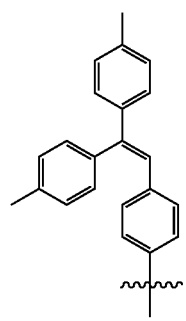 [SMILES: *c1ccc(C=C(c2ccc(C)cc2)c2ccc(C)cc2)cc1] | 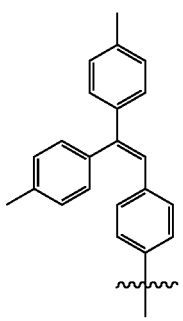 [SMILES: *c1ccc(C=C(c2ccc(C)cc2)c2ccc(C)cc2)cc1] | H | H |

| | | | | |
|---|---|---|---|---|
| 217 | 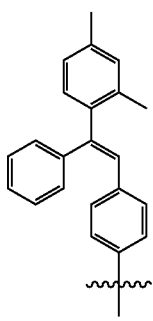 [SMILES: *c1ccc(/C=C(\c2ccccc2)c2ccc(C)cc2C)cc1] | 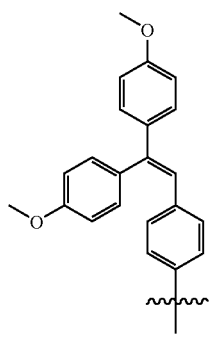 [SMILES: *c1ccc(C=C(c2ccc(OC)cc2)c2ccc(OC)cc2)cc1] | H | H |
| 218 | 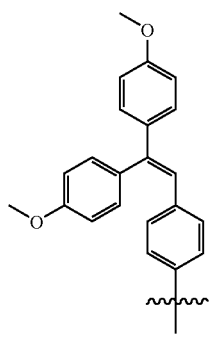 [SMILES: *c1ccc(C=C(c2ccc(OC)cc2)c2ccc(OC)cc2)cc1] | 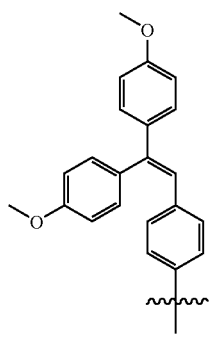 [SMILES: *c1ccc(C=C(c2ccc(OC)cc2)c2ccc(OC)cc2)cc1] | H | H |
| 219 | 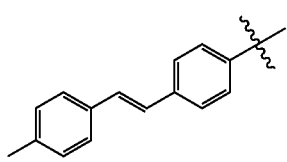 | 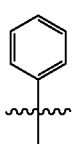 | H | H |
| 220 | 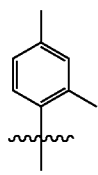 | 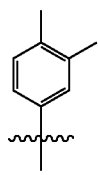 | H | H |
| 221 | 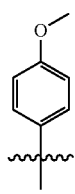 | 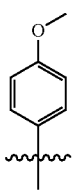 | H | H |
| 222 | 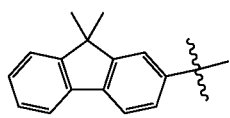 [SMILES: *c1ccc2c(c1)C(C)(C)c1ccccc1-2] | 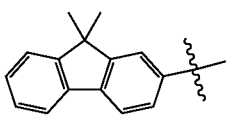 [SMILES: *c1ccc2c(c1)C(C)(C)c1ccccc1-2] | H | H |
| 223 | 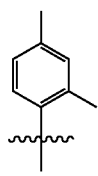 | 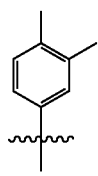 | H | H |

| | 81 | 82 | | |
|---|---|---|---|---|
| 224 | 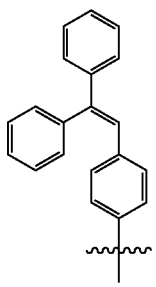 [SMILES: *c1ccc(C=C(c2ccccc2)c2ccccc2)cc1] | 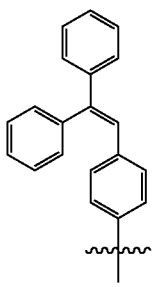 [SMILES: *c1ccc(C=C(c2ccccc2)c2ccccc2)cc1] | H | H |
| 225 | 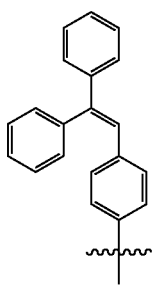 [SMILES: *c1ccc(C=C(c2ccccc2)c2ccccc2)cc1] | 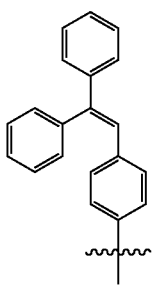 [SMILES: *c1ccc(C=C(c2ccccc2)c2ccccc2)cc1] | H | H |
| 226 | 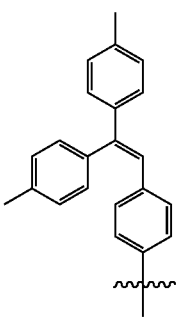 [SMILES: *c1ccc(C=C(c2ccc(C)cc2)c2ccc(C)cc2)cc1] | 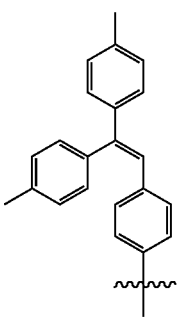 [SMILES: *c1ccc(C=C(c2ccc(C)cc2)c2ccc(C)cc2)cc1] | H | H |
| 227 | 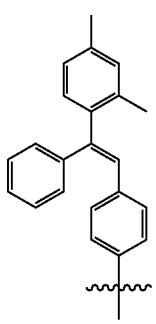 | 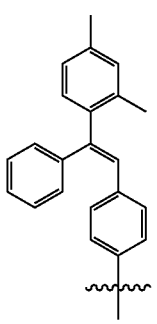 [SMILES: *c1ccc(/C=C(\c2ccccc2)c2ccc(C)cc2C)cc1] | H | H |
| 228 | 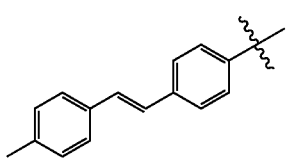 [SMILES: *c1ccc(/C=C/c2ccc(C)cc2)cc1] | 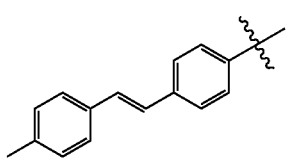 [SMILES: *c1ccc(/C=C/c2ccc(C)cc2)cc1] | H | H |
| 229 | 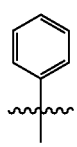 | 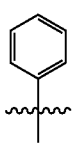 | H | H |

| | | | | |
|---|---|---|---|---|
| 230 | 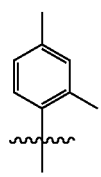 [SMILES: *c1ccc(C)cc1C] | 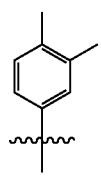 | H | H |
| 231 | 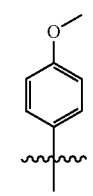 | 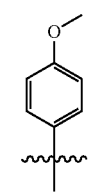 | H | H |
| 232 | 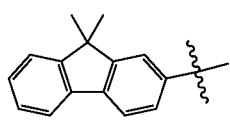 | 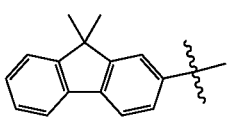 [SMILES: *c1ccc2c(c1)C(C)(C)c1ccccc1-2] | H | H |
| 233 | 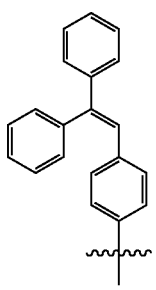 [SMILES: *c1ccc(C=C(c2ccccc2)c2ccccc2)cc1] | 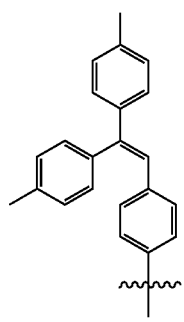 [SMILES: *c1ccc(C=C(c2ccc(C)cc2)c2ccc(C)cc2)cc1] | H | H |
| 234 | 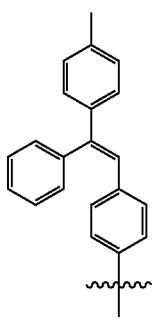 | 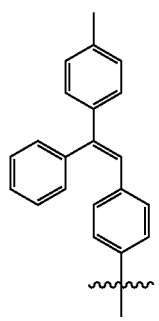 [SMILES: *c1ccc(/C=C(\c2ccccc2)c2ccc(C)cc2)cc1] | H | H |
| 235 | 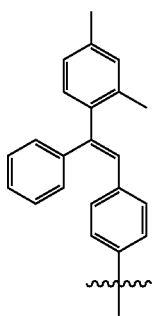 | 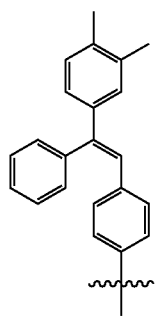 [SMILES: *c1ccc(/C=C(\c2ccccc2)c2ccc(C)c(C)c2)cc1] | H | H |

| | | | | |
|---|---|---|---|---|
| 236 | 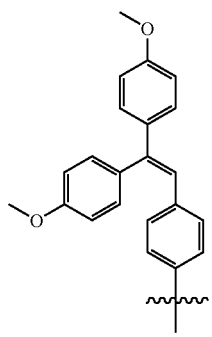 [SMILES: *c1ccc(C=C(c2ccc(OC)cc2)c2ccc(OC)cc2)cc1] | 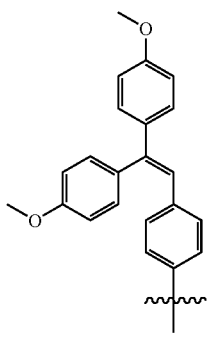 [SMILES: *c1ccc(C=C(c2ccc(OC)cc2)c2ccc(OC)cc2)cc1] | H | H |
| 237 | 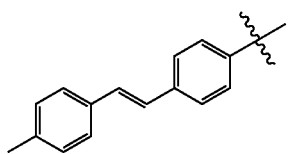 [SMILES: *c1ccc(/C=C/c2ccc(C)cc2)cc1] | 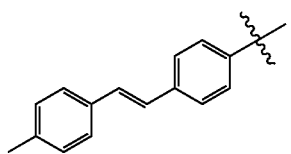 [SMILES: *c1ccc(/C=C/c2ccc(C)cc2)cc1] | H | H |
| 238 | 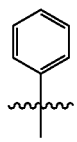 | 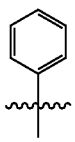 | H | H |
| 239 | 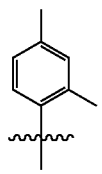 [SMILES: *c1ccc(C)cc1C] | 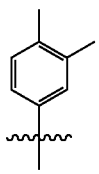 | H | H |
| 240 | 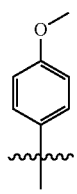 | 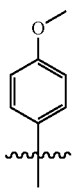 | H | H |
| 241 | 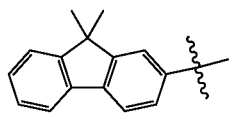 [SMILES: *c1ccc2c(c1)C(C)(C)c1ccccc1-2] | 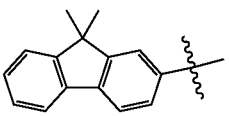 [SMILES: *c1ccc2c(c1)C(C)(C)c1ccccc1-2] | H | H |
| 242 | 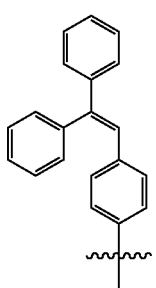 [SMILES: *c1ccc(C=C(c2ccccc2)c2ccccc2)cc1] | 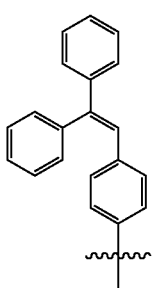 [SMILES: *c1ccc(C=C(c2ccccc2)c2ccccc2)cc1] | H | H |

-continued
| | 87 | 88 | | |
|---|---|---|---|---|
| 243 | 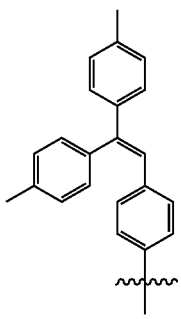 [SMILES: *c1ccc(C=C(c2ccc(C)cc2)c2ccc(C)cc2)cc1] | 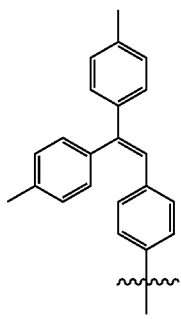 [SMILES: *c1ccc(C=C(c2ccc(C)cc2)c2ccc(C)cc2)cc1] | H | H |
| 244 | 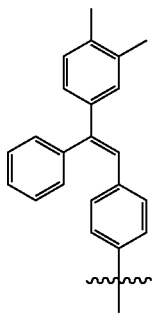 | 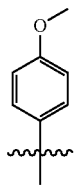 | H | H |
| 245 | 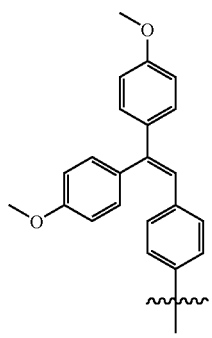 [SMILES: *c1ccc(C=C(c2ccc(OC)cc2)c2ccc(OC)cc2)cc1] | 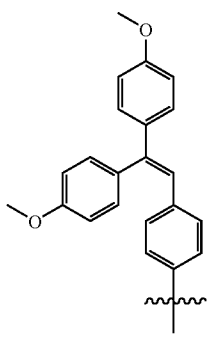 [SMILES: *c1ccc(C=C(c2ccc(OC)cc2)c2ccc(OC)cc2)cc1] | H | H |
| 246 | 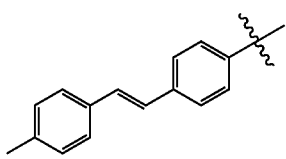 [SMILES: *c1ccc(/C=C/c2ccc(C)cc2)cc1] | 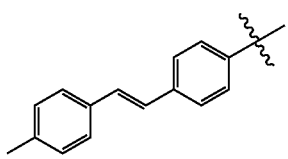 [SMILES: *c1ccc(/C=C/c2ccc(C)cc2)cc1] | H | H |
| 247 | 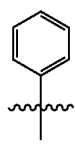 | 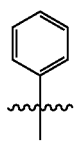 | H | H |
| 248 | 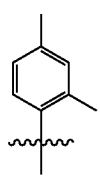 [SMILES: *c1ccc(C)cc1C] | 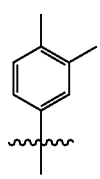 | H | H |

-continued
| | | | | |
|---|---|---|---|---|
| 249 | 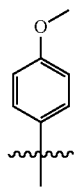 | 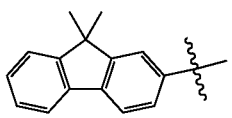 [SMILES: *c1ccc2c(c1)C(C)(C)c1ccccc1-2] | H | H |
| DYE | Ar | Z | —Y—X |
|---|---|---|---|
| 1 | –C6H4– | S | –C(CH3)2COOH |
| 2 | –C6H4– | S | –C(CH3)2COOH |
| 3 | –C6H4– | S | –C(CH3)2COOH |
| 4 | –C6H4– | S | –C(CH3)2COOH |
| 5 | –C6H4– | S | –C(CH3)2COOH |
| 6 | –C6H4– | S | –C(CH3)2COOH |
| 7 | –C6H4– | S | –C(CH3)2COOH |
| 8 | –C6H4– | S | –C(CH3)2COOH |
| 9 | –C6H4– | S | –C(CH3)2COOH |
| 10 | –C6H4– | S | –C(CH3)2COOH |
| 11 | –C6H4– | S | –C(CH3)2COOH |
| 12 | –C6H4– | S | –C(CH3)2COOH |
| 13 | –C6H4– | S | –C(CH3)2COOH |
| 14 | –C6H4– | S | –C(CH3)2COOH |

-continued
| | | | |
|---|---|---|---|
| 15 | 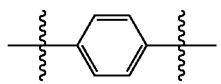 | S | 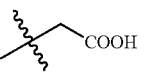 [SMILES: *CC(=O)O] COOH |
| 16 | 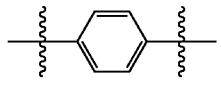 | S | 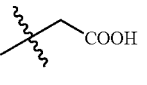 [SMILES: *CC(=O)O] COOH |
| 17 | 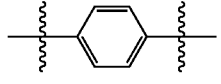 | S | 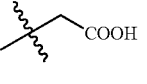 COOH |
| 18 | 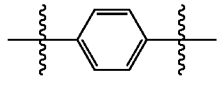 | S | 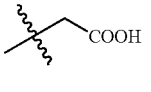 COOH |
| 19 | 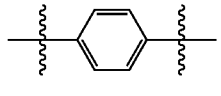 | S | 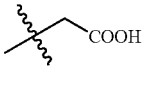 [SMILES: *CC(=O)O] COOH |
| 20 | 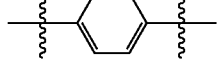 | S | 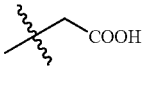 [SMILES: *CC(=O)O] COOH |
| 21 | 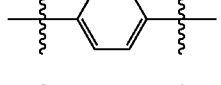 | S | 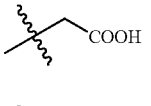 [SMILES: *CC(=O)O] COOH |
| 22 | 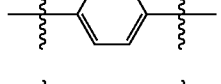 | S | 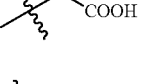 COOH |
| 23 | 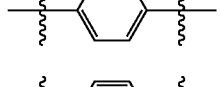 | S |  COOH |
| 24 | 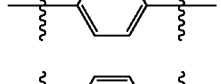 | S | 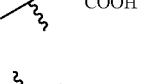 COOH |
| 25 | 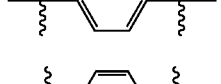 | S |  COOH |
| 26 | 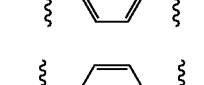 | S |  COOH |
| 27 | 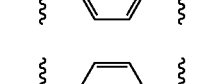 | S | 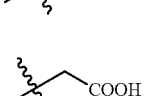 COOH |
| 28 | 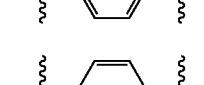 | S | 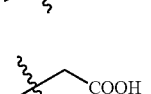 COOH |
| 29 | 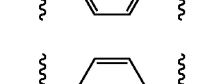 | S | 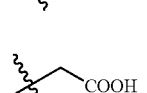 COOH |
| 30 | 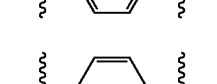 | S | 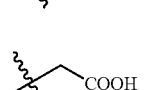 COOH |
| 31 | 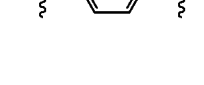 | S |  COOH |

-continued
| | | | |
|---|---|---|---|
| 32 | 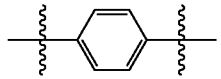 | S | 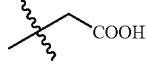 [SMILES: *CC(=O)O]COOH |
| 33 | 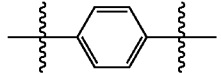 | S | COOH |
| 34 | 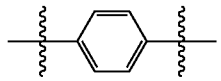 [SMILES: *c1ccc(*)cc1] | S | 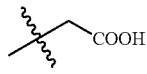COOH |
| 35 | 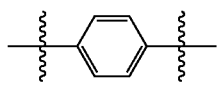 | S | 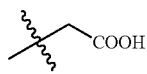 [SMILES: *CC(=O)O]COOH |
| 36 | 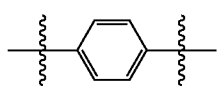 | S | 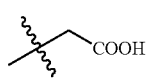 [SMILES: *CC(=O)O]COOH |
| 37 | 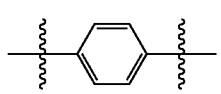 [SMILES: *c1ccc(*)cc1] | S | 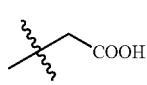COOH |
| 38 | 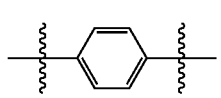 | S | 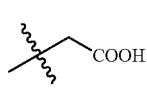 [SMILES: *CC(=O)O]COOH |
| 39 | 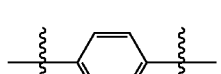 | S | 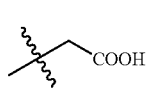COOH |
| 40 | 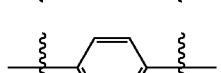 | S | 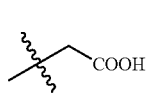COOH |
| 41 |  | S | 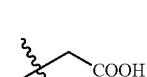COOH |
| 42 |  | S | 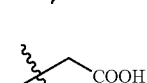COOH |
| 43 | 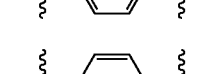 | S | 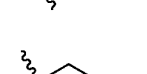COOH |
| 44 | 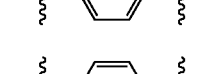 | S | COOH |
| 45 | 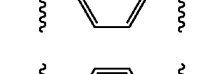 | S | COOH |
| 46 | 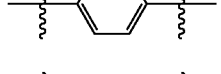 | S | 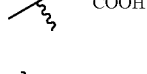COOH |
| 47 | 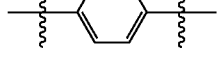 | S | COOH |
| 48 | 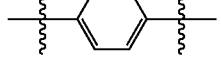 | S | 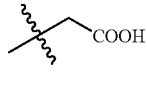COOH |

-continued
| | | | |
|---|---|---|---|
| 49 | 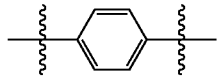 [SMILES: *c1ccc(*)cc1] | S | 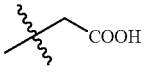 [SMILES: *CC(=O)O]COOH |
| 50 | 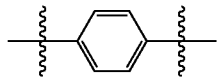 [SMILES: *c1ccc(*)cc1] | S | 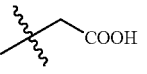 [SMILES: *CC(=O)O]COOH |
| 51 | 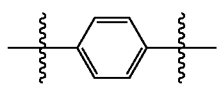 | S | 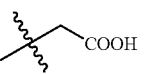 [SMILES: *CC(=O)O]COOH |
| 52 | 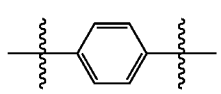 | S | 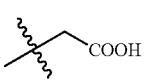 [SMILES: *CC(=O)O]COOH |
| 53 | 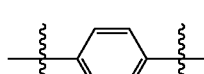 | S | 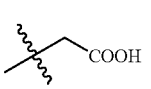 [SMILES: *CC(=O)O]COOH |
| 54 | 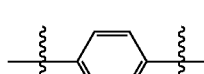 | S | 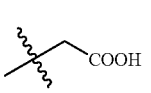COOH |
| 55 | 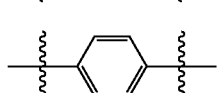 | S | 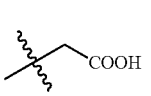COOH |
| 56 | 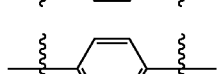 | S | 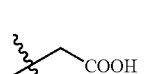COOH |
| 57 |  | S | 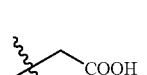COOH |
| 58 |  | S | 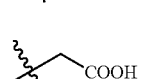COOH |
| 59 |  | S | 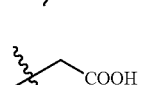COOH |
| 60 | 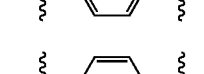 | S | 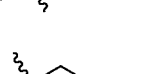COOH |
| 61 | 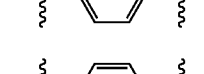 | S | COOH |
| 62 | 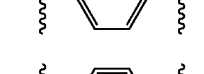 | S | 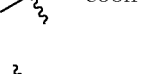COOH |
| 63 | 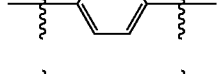 | S | 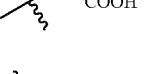COOH |
| 64 | 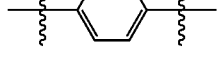 | S | 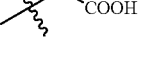COOH |
| 65 | 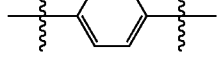 | S | 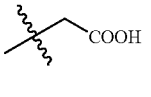 [SMILES: *CC(=O)O]COOH |

-continued
| | | | |
|---|---|---|---|
| 66 | 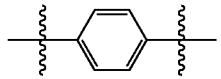 | S | 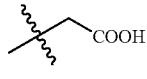COOH |
| 67 | 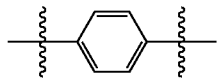 | S | 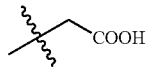COOH |
| 68 | 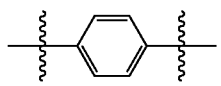 | S | 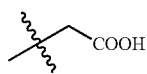 [SMILES: *CC(=O)O]COOH |
| 69 | 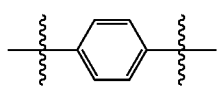 | S | 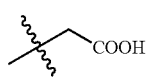 [SMILES: *CC(=O)O]COOH |
| 70 | 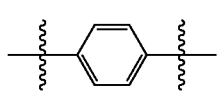 | S | 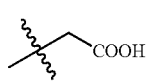 [SMILES: *CC(=O)O]COOH |
| 71 | 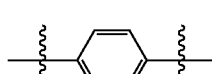 | S | 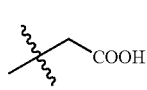 [SMILES: *CC(=O)O]COOH |
| 72 | 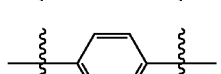 | S | 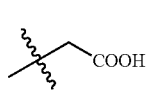 [SMILES: *CC(=O)O]COOH |
| 73 | 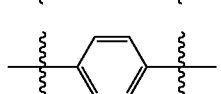 | S | 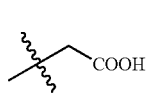COOH |
| 74 | 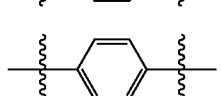 | S | 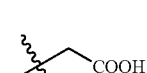COOH |
| 75 |  | S | 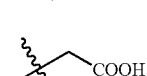COOH |
| 76 |  | S | 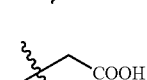COOH |
| 77 | 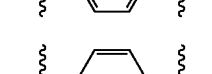 | S | 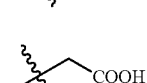COOH |
| 78 | 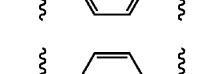 | S | 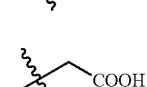COOH |
| 79 | 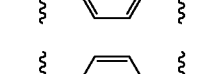 | S | 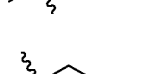COOH |
| 80 | 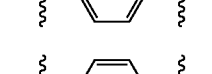 | S | COOH |
| 81 | 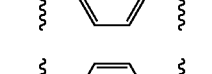 | S | COOH |
| 82 | 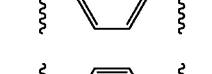 | S | 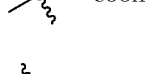COOH |

-continued
| | | | | |
|---|---|---|---|---|
| 83 | 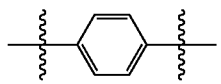 [SMILES: *c1ccc(*)cc1] | S | 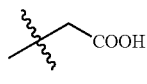COOH | |
| 84 | 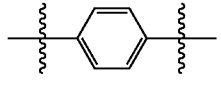 | S | 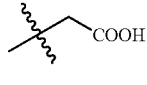 [SMILES: *CC(=O)O]COOH | |
| 85 | 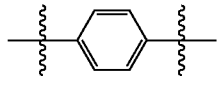 | S | 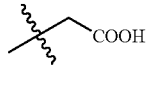 [SMILES: *CC(=O)O]COOH | |
| 86 | 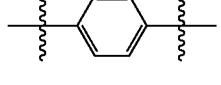 | S | 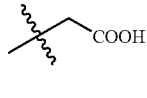COOH | |
| 87 | 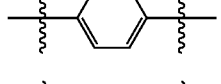 | S | 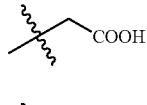COOH | |
| 88 | 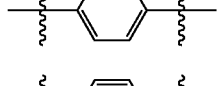 | S | 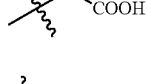COOH | |
| 89 | 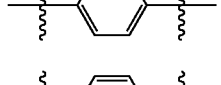 | S | 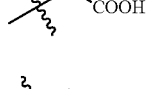COOH | |
| 90 | 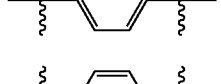 | S | COOH | |
| 91 | 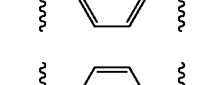 | S | 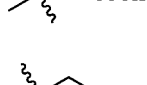COOH | |
| 92 | 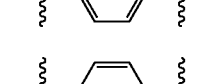 | S | 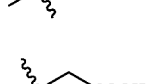COOH | |
| 93 | 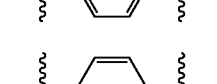 | S | 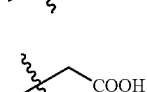COOH | |
| 94 | 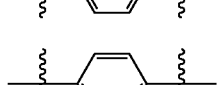 | S | 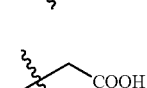COOH | |
| 95 | 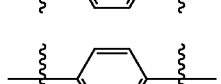 | S | 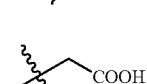COOH | |
| 96 | 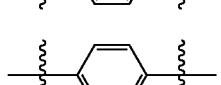 | S | 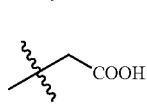COOH | |
| 97 | 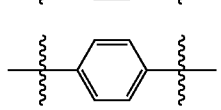 | S | 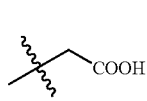 [SMILES: *CC(=O)O]COOH | |
| 98 | 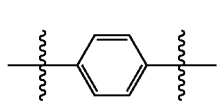 [SMILES: *c1ccc(*)cc1] | S | 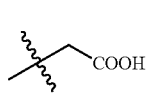 [SMILES: *CC(=O)O]COOH | |
| 99 |  | S | COOH | |

| | | | |
|---|---|---|---|
| 100 | 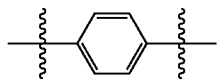 [SMILES: *c1ccc(*)cc1] | S | 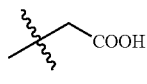COOH |
| 101 | 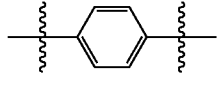 [SMILES: *c1ccc(*)cc1] | S | 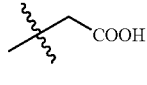 [SMILES: *CC(=O)O]COOH |
| 102 | 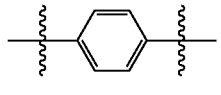 | S | 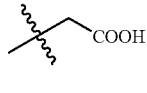 [SMILES: *CC(=O)O]COOH |
| 103 | 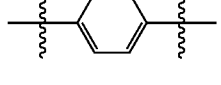 | S | 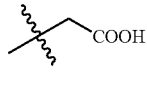COOH |
| 104 | 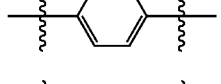 | S | 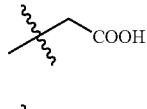COOH |
| 105 | 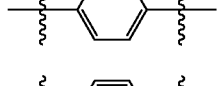 | S | 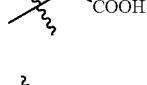COOH |
| 106 | 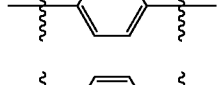 | S | 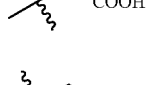COOH |
| 107 | 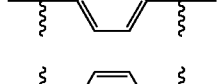 | S | COOH |
| 108 | 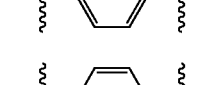 | S | 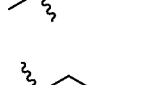COOH |
| 109 | 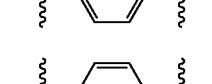 | S | 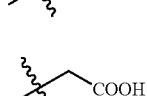COOH |
| 110 | 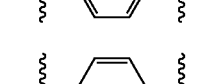 | S | 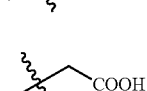COOH |
| 111 | 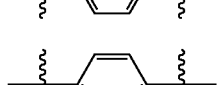 | S | 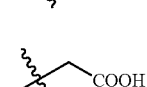COOH |
| 112 | 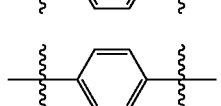 | S | 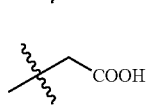COOH |
| 113 | 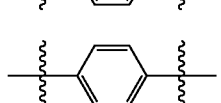 | S | 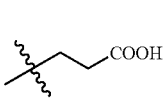COOH |
| 114 | 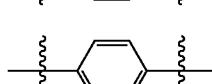 | S | 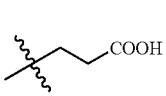COOH |
| 115 | 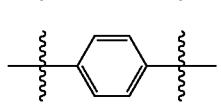 | S | 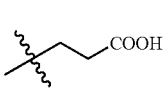 [SMILES: *CCC(=O)O]COOH |
| 116 |  | S | COOH |

| | | | |
|---|---|---|---|
| 117 | 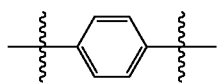 [SMILES: *c1ccc(*)cc1] | S | 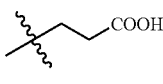 |
| 118 | 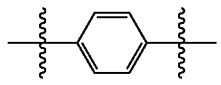 [SMILES: *c1ccc(*)cc1] | S | 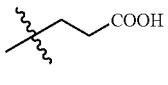 |
| 119 | 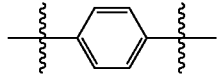 [SMILES: *c1ccc(*)cc1] | S | 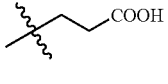 |
| 120 | 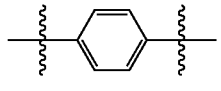 | S | 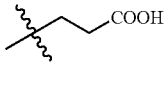 |
| 121 | 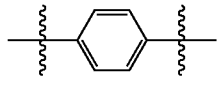 | S | 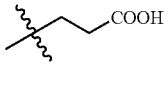 |
| 122 | 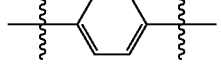 | S | 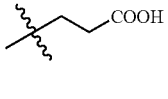 |
| 123 | 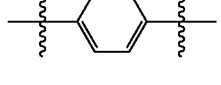 | S | 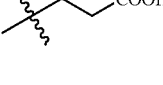 |
| 124 | 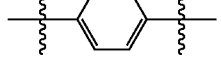 | S | 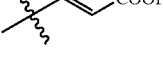 |
| 125 | 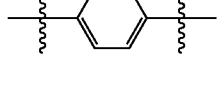 | S | 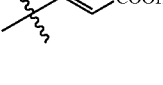 |
| 126 | 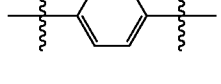 | S | 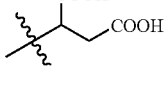 |
| 127 | 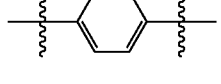 | S | 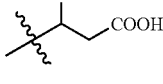 |
| 128 | 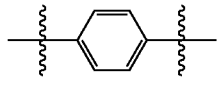 | S | 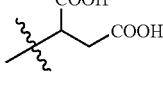 |
| 129 | 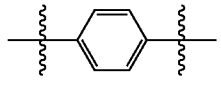 | S | 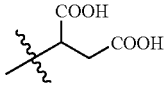 |
| 130 | 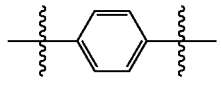 [SMILES: *c1ccc(*)cc1] | S | 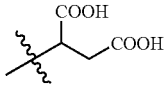 |
| 131 | 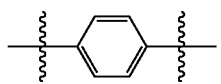 | S | 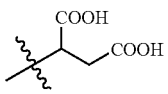 |
| 132 | 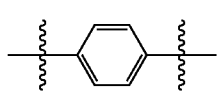 [SMILES: *c1ccc(*)cc1] | S | 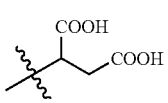 |

| | | | |
|---|---|---|---|
| 133 | -C6H4- (para) | S | CH(COOH)CH2COOH |
| 134 | -C6H4- (para) | S | CH(COOH)CH2COOH |
| 135 | -C6H4- (para) | S | CH(COOH)CH2COOH |
| 136 | -C6H4- (para) | S | CH(COOH)CH2COOH |
| 137 | -C6H4- (para) | S | CH(COOH)CH2COOH |
| 138 | -C6H4- (para) | S | CH(COOH)CH2COOH |
| 139 | -C6H4- (para) | S | CH(COOH)CH2COOH |
| 140 | -C6H4- (para) | S | CH(COOH)CH2COOH |
| 141 | -C6H4- (para) | S | CH(COOH)CH2COOH |
| 142 | -C6H4- (para) | S | CH(COOH)CH2COOH |
| 143 | -C6H4- (para) | S | -CH2CH2P(O)(OH)2 |
| 144 | -C6H4- (para) | S | -CH2CH2P(O)(OH)2 |
| 145 | -C6H4- (para) | S | -CH2CH2P(O)(OH)2 |
| 146 | -C6H4- (para) | S | -CH2CH2P(O)(OH)2 |
| 147 | -C6H4- (para) | S | -CH2CH2P(O)(OH)2 |

| | | | |
|---|---|---|---|
| 148 | -C6H4- (para) | S | -CH2CH2-P(=O)(OH)2 |
| 149 | -C6H4- (para) | S | -CH2CH2-S(=O)2-OH |
| 150 | -C6H4- (para) | S | -CH2CH2-S(=O)2-OH |
| 151 | -C6H4- (para) | S | -CH2CH2-S(=O)2-OH |
| 152 | -C6H4- (para) | S | -CH2CH2-S(=O)2-OH |
| 153 | -C6H4- (para) | S | -CH2CH2-S(=O)2-OH |
| 154 | -C6H4- (para) | S | -CH2CH2-S(=O)2-OH |
| 155 | -C6H4- (para) | S | -CH2CH2-S(=O)2-OH |
| 156 | -C6H4- (para) | S | -CH2CH2-S(=O)2-OH |
| 157 | -C6H4- (para) | S | -C(CH3)2-COOH |
| 158 | -C6H4- (para) | S | -C(CH3)2-COOH |
| 159 | -C6H4- (para) | S | -C(CH3)2-COOH |
| 160 | -C6H4- (para) | S | -C(CH3)2-COOH |
| 161 | -C6H4- (para) | S | -C(CH3)2-COOH |
| 162 | -C6H4- (para) | S | -C(CH3)2-COOH |
| 163 | -C6H4- (para) | S | -C(CH3)2-COOH |

-continued
| | | | |
|---|---|---|---|
| 164 | 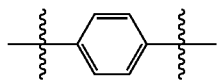 | S | 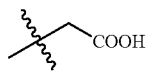 [SMILES: *CC(=O)O] COOH |
| 165 | 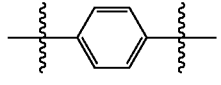 | S | 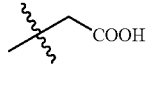 [SMILES: *CC(=O)O] COOH |
| 166 | 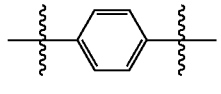 | S | 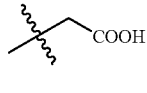 [SMILES: *CC(=O)O] COOH |
| 167 | 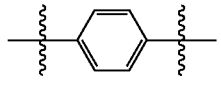 | S | 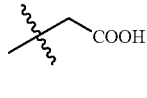 COOH |
| 168 | 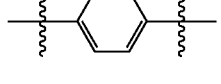 | S | 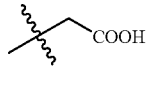 COOH |
| 169 | 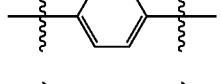 | S | 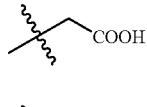 COOH |
| 170 | 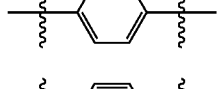 | S | 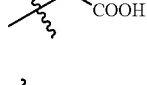 COOH |
| 171 | 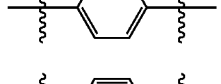 | S | 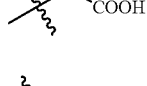 COOH |
| 172 | 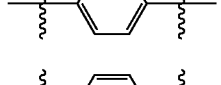 | S | 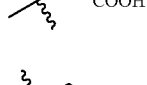 COOH |
| 173 | 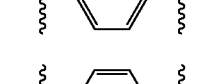 | S |  COOH |
| 174 | 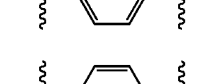 | S | 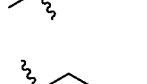 COOH |
| 175 | 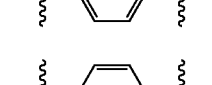 | S | 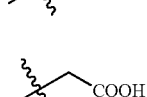 COOH |
| 176 | 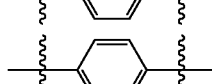 | S | 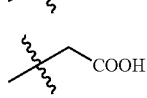 COOH |
| 177 | 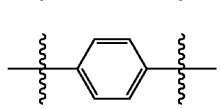 | S | 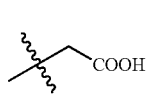 COOH |
| 178 | 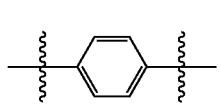 | S | 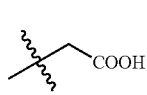 [SMILES: *CC(=O)O] COOH |
| 179 | 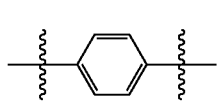 [SMILES: *c1ccc(*)cc1] | S | 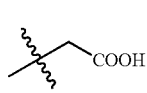 [SMILES: *CC(=O)O] COOH |
| 180 |  | S |  COOH |

-continued
| | | | |
|---|---|---|---|
| 181 | 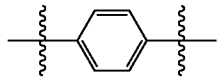 | S | 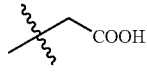 [SMILES: *CC(=O)O] |
| 182 | 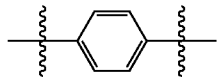 | S | 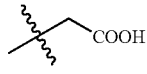 [SMILES: *CC(=O)O] |
| 183 | 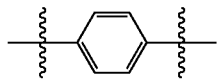 [SMILES: *c1ccc(*)cc1] | S | 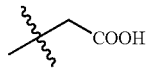 [SMILES: *CC(=O)O] |
| 184 | 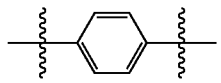 | S | 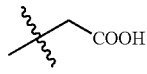 [SMILES: *CC(=O)O] |
| 185 | 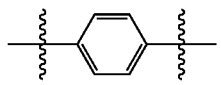 | S | 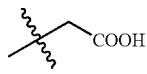 |
| 186 | 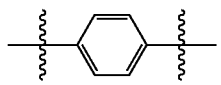 | S | 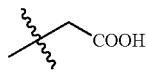 [SMILES: *CC(=O)O] |
| 187 | 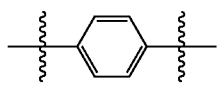 [SMILES: *c1ccc(*)cc1] | S | 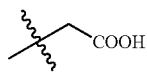 [SMILES: *CC(=O)O] |
| 188 | 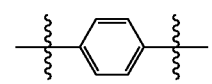 | S |  |
| 189 | 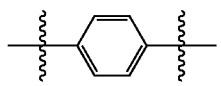 | S | 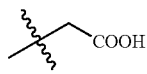 |
| 190 | 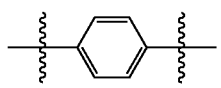 | S | 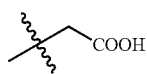 [SMILES: *CC(=O)O] |
| 191 | 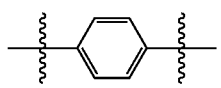 | S |  |
| 192 | 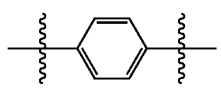 [SMILES: *c1ccc(*)cc1] | S | 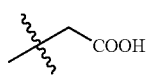 [SMILES: *CC(=O)O] |
| 193 | 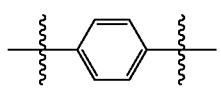 [SMILES: *c1ccc(*)cc1] | S | 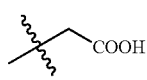 |
| 194 | 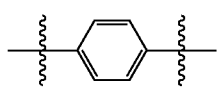 | S | 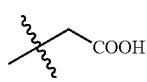 |
| 195 | 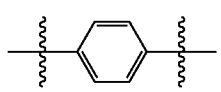 [SMILES: *c1ccc(*)cc1] | S | 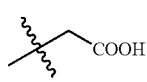 |
| 196 | 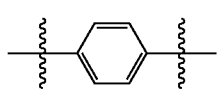 | S | 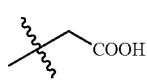 [SMILES: *CC(=O)O] |

-continued
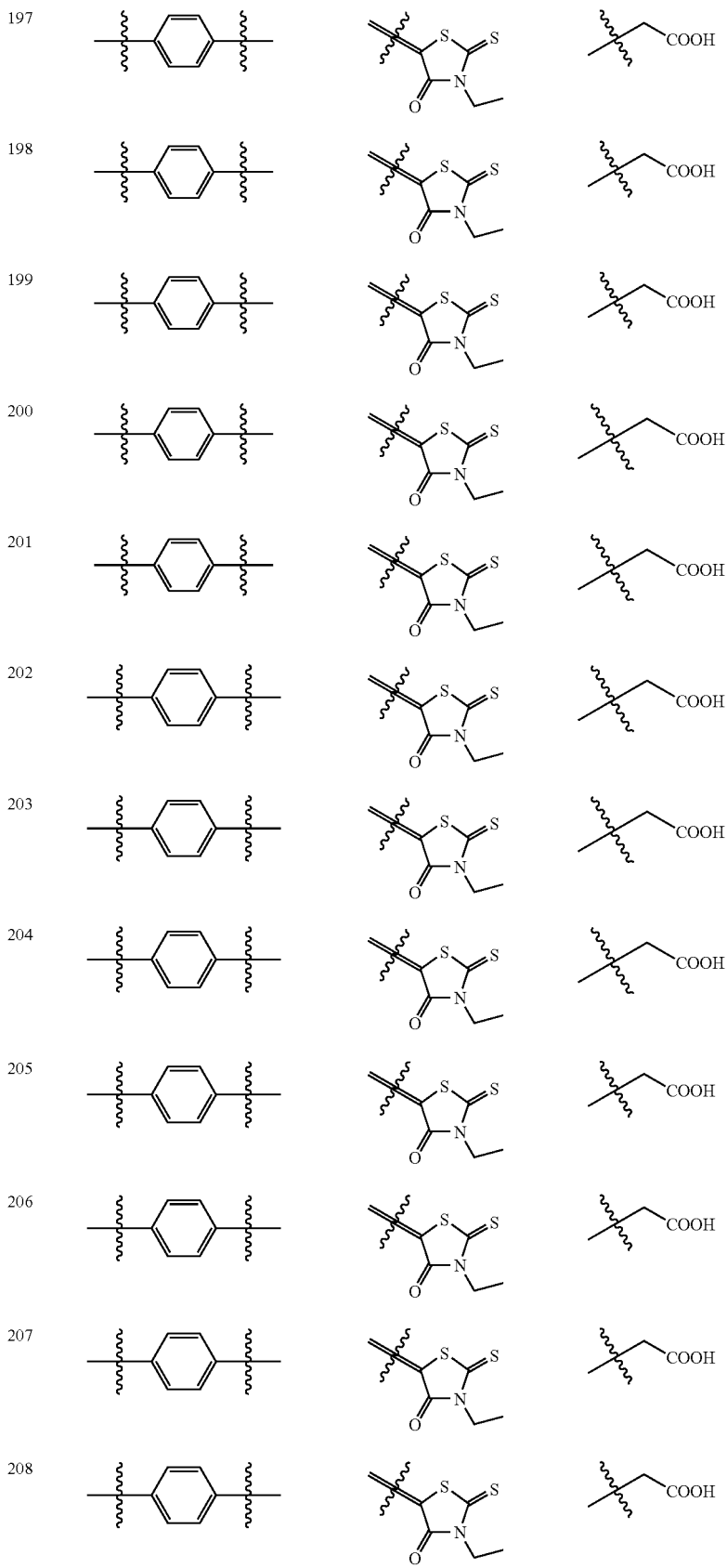

-continued

| | | | |
|---|---|---|---|
| 209 | phenylene | 5-ylidene-3-ethyl-2-thioxo-thiazolidin-4-one | C(CH₃)₂COOH |
| 210 | phenylene | 5-ylidene-3-ethyl-2-thioxo-thiazolidin-4-one | C(CH₃)₂COOH |
| 211 | phenylene | 5-ylidene-3-ethyl-2-thioxo-thiazolidin-4-one | C(CH₃)₂COOH |
| 212 | phenylene | =CH-CH=Ph (styryl) | C(CH₃)₂COOH |
| 213 | phenylene | =CH-CH=Ph (styryl) | C(CH₃)₂COOH |
| 214 | phenylene | O | C(CH₃)₂COOH |
| 215 | phenylene | O | C(CH₃)₂COOH |
| 216 | phenylene | O | C(CH₃)₂COOH |
| 217 | phenylene | O | C(CH₃)₂COOH |
| 218 | phenylene | O | C(CH₃)₂COOH |
| 219 | phenylene | O | C(CH₃)₂COOH |
| 220 | phenylene | O | C(CH₃)₂COOH |
| 221 | phenylene | O | C(CH₃)₂COOH |
| 222 | phenylene | O | C(CH₃)₂COOH |

-continued
| | | | |
|---|---|---|---|
| 223 | 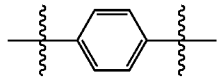 [SMILES: *c1ccc(*)cc1] | Se | 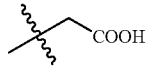 [SMILES: *CC(=O)O]COOH |
| 224 | 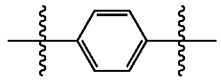 [SMILES: *c1ccc(*)cc1] | Se | 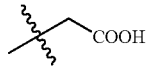COOH |
| 225 | 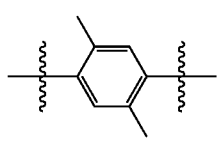 | S | 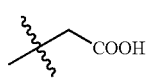COOH |
| 226 | 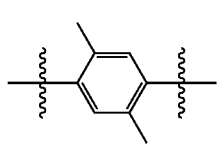 [SMILES: *c1cc(C)c(*)cc1C] | S | 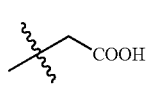 [SMILES: *CC(=O)O]COOH |
| 227 | 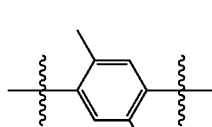 | S | 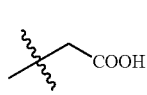COOH |
| 228 | 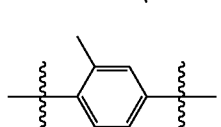 | S | 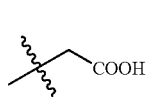 [SMILES: *CC(=O)O]COOH |
| 229 | 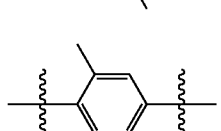 | S | 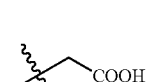COOH |
| 230 | 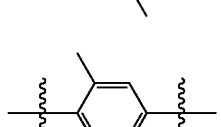 | S | 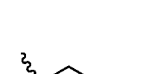COOH |
| 231 | 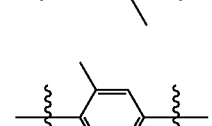 | S | COOH |
| 232 | 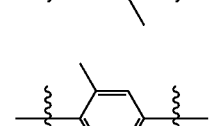 | S | COOH |
| 233 | 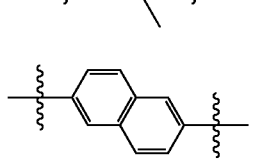 | S | COOH |
| 234 | 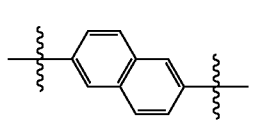 [SMILES: *c1ccc2cc(*)ccc2c1] | S | 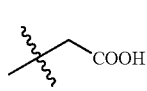 [SMILES: *CC(=O)O]COOH |

-continued

| | | | |
|---|---|---|---|
| 235 | naphthalene-2,6-diyl | S | C(CH3)2COOH |
| 236 | naphthalene-2,7-diyl | S | C(CH3)2COOH |
| 237 | naphthalene-2,7-diyl | S | C(CH3)2COOH |
| 238 | naphthalene-2,7-diyl | S | C(CH3)2COOH |
| 239 | naphthalene-2,6-diyl | S | C(CH3)2COOH |
| 240 | naphthalene-2,6-diyl | S | C(CH3)2COOH |
| 241 | naphthalene-2,6-diyl | S | C(CH3)2COOH |
| 242 | coumarin-3,7-diyl | S | C(CH3)2COOH |
| 243 | coumarin-3,7-diyl | S | C(CH3)2COOH |
| 244 | coumarin-3,7-diyl | S | C(CH3)2COOH |
| 245 | coumarin-3,7-diyl | S | C(CH3)2COOH |
| 246 | coumarin-3,7-diyl | S | C(CH3)2COOH |

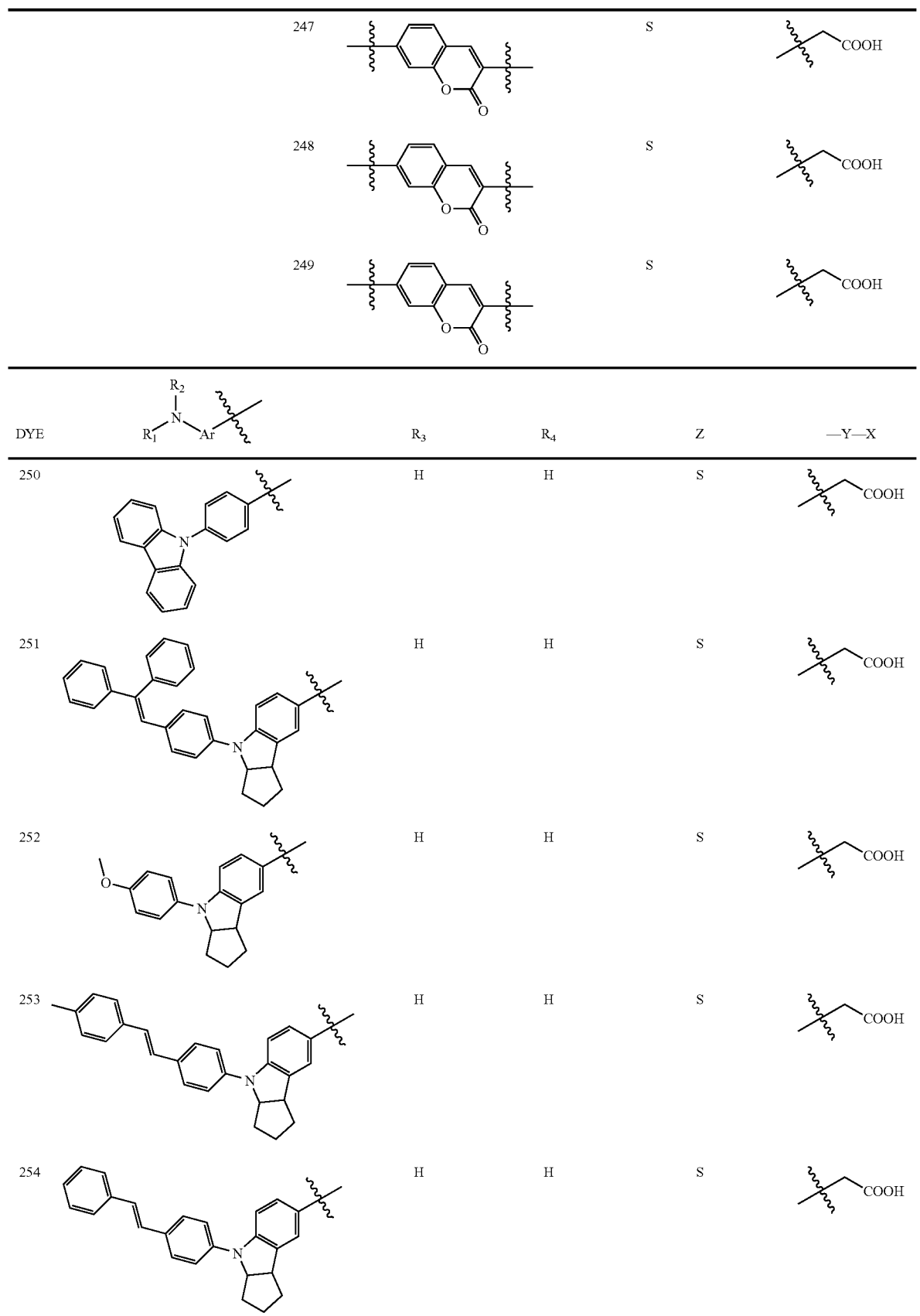

-continued

| | 123 | | | 124 | |
|---|---|---|---|---|---|
| 255 | *9-ethylcarbazol-3-yl* | H | H | S | *CH(CH3)COOH* |
| 256 | *6-methyl-9-ethylcarbazol-3-yl* | H | H | S | *CH(CH3)COOH* |
| 257 | *julolidine-fused coumarin (dimethyl)* | H | H | S | *CH(CH3)COOH* |
| 258 | *julolidine-fused coumarin* | H | H | S | *CH(CH3)COOH* |
| 259 | *7-(diethylamino)coumarin-3-yl* | H | H | S | *CH(CH3)COOH* |
| 260 | *4-(2,2-diphenylvinyl)phenyl-carbazol-3-yl* | H | H | S | *CH(CH3)COOH* |
| 261 | *9-(4-methoxyphenyl)carbazol-3-yl* | H | H | S | *CH(CH3)COOH* |
| 262 | *4-(2,2-diphenylvinyl)phenyl-cyclopenta-carbazol-yl* | H | H | *N-ethyl-2-thioxothiazolidin-4-one* | *CH(CH3)COOH* |

| 125 | | | 126 | |
|---|---|---|---|---|
| | | | -continued | |

| | 125 | | | 126 | |
|---|---|---|---|---|---|
| 263 | [carbazole-cyclopentane fused with stilbene-tolyl substituent] | H | H | [thiazolidinone with S, N-ethyl, =S] | CH(CH₃)COOH |
| 264 | [9-ethylcarbazole] | H | H | [thiazolidinone with S, N-ethyl, =S] | CH(CH₃)COOH |
| 265 | [julolidine-fused coumarin with gem-dimethyl groups] | H | H | [thiazolidinone with S, N-ethyl, =S] | CH(CH₃)COOH |
| 266 | [9-(4-methoxyphenyl)carbazole] | H | H | [thiazolidinone with S, N-ethyl, =S] | CH(CH₃)COOH |
| 267 | [9-phenylcarbazole with para-substituent] | H | H | S | CH(COOH)CH₂COOH |
| 268 | [carbazole-cyclopentane fused with diphenylvinyl-phenyl substituent] | H | H | S | CH(COOH)CH₂COOH |
| 269 | [3,6-disubstituted 9-ethylcarbazole] | H | H | S | CH(COOH)CH₂COOH |
| 270 | [julolidine-fused coumarin with gem-dimethyl groups] | H | H | S | CH(COOH)CH₂COOH |

-continued

| | 127 | | | 128 | |
|---|---|---|---|---|---|
| 271 | 7-(diethylamino)coumarin-3-yl | H | H | S | CH(COOH)CH2COOH |
| 272 | 4-(2,2-diphenylvinyl)phenyl-carbazol-3-yl | H | H | S | CH(COOH)CH2COOH |
| 273 | 4-(carbazol-9-yl)phenyl | H | n-C6H13 | S | CH2COOH |
| 274 | 4-(2,2-diphenylvinyl)phenyl-(cyclopenta-fused carbazol)-yl | H | n-C6H13 | S | CH2COOH |
| 275 | 9-ethylcarbazol-3-yl | H | n-C6H13 | S | CH2COOH |
| 276 | julolidine-coumarin | H | n-C6H13 | S | CH2COOH |
| 277 | 4-(2,2-diphenylvinyl)phenyl-carbazol-3-yl | H | n-C6H13 | S | CH2COOH |
| 278 | 4-(2,2-diphenylvinyl)phenyl-(cyclopenta-fused carbazol)-yl | CN | H | S | CH2COOH |

-continued

| | | | | | |
|---|---|---|---|---|---|
| 279 | 9-ethylcarbazol-3-yl | CN | H | S | CH(COOH) |
| 280 | julolidine-coumarin | CN | H | S | CH(COOH) |
| 281 | julolidine-coumarin | CN | H | S | CH(COOH) |
| 282 | 7-diethylaminocoumarin-3-yl | CN | H | S | CH(COOH) |
| 283 | 2,2-diphenylvinyl-phenyl-carbazolyl | CN | H | S | CH(COOH) |
| 284 | 4-(carbazol-9-yl)phenyl | CMe | H | S | CH(COOH) |
| 285 | diphenylvinyl-phenyl-cyclopenta-carbazolyl | CMe | H | S | CH(COOH) |
| 286 | 9-ethylcarbazol-3-yl | CMe | H | S | CH(COOH) |
| 287 | 7-diethylaminocoumarin-3-yl | CMe | H | S | CH(COOH) |

| 288 | | | | |
|---|---|---|---|---|
| 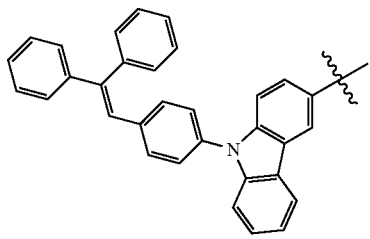 |  | H | S | 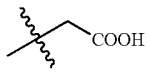 [SMILES: *CC(=O)O] |

A compound (hereinafter also referred to as the dye in the invention) represented by formula (1) can be synthesized according to a conventional method.

A synthetic method of a compound in the invention represented by formula (1) will be described below.

SYNTHETIC EXAMPLE

Synthetic Example 1

Synthesis of Exemplified Compound 1

To a THF solution of ethyl isocyanatoacetate were added 1.2 equivalents of ethylguanidine hydrochloric acid salt and 12 equivalents of triethylamine and the resulting mixture was reacted at 60° C. for 2 hours. The resulting reaction solution was extracted with ethyl acetate, washed with water, dried over magnesium sulfate, and concentrated with a rotary evaporator. The resulting concentrate was subjected to silica chromatography to obtain ethyl-2-thiohydantoin-3-acetate (yield: 87%).

An acetic acid solution of 1 equivalent of aldehyde as illustrated below (hereinafter also referred to as Compound A), 1.1 equivalents of ethyl-2-thiohydantoin-3-acetate and 3 equivalents of ammonium acetate was reacted at 120° C. for 3 hours with stirring. The resulting reaction solution was extracted with ethyl acetate, washed with water, dried over magnesium sulfate, and concentrated with a rotary evaporator. The resulting concentrate was subjected to silica chromatography to obtain adduct of a substituted triphenylamine and ethyl-2-thiohydantoin-3-acetate (yield: 93%).

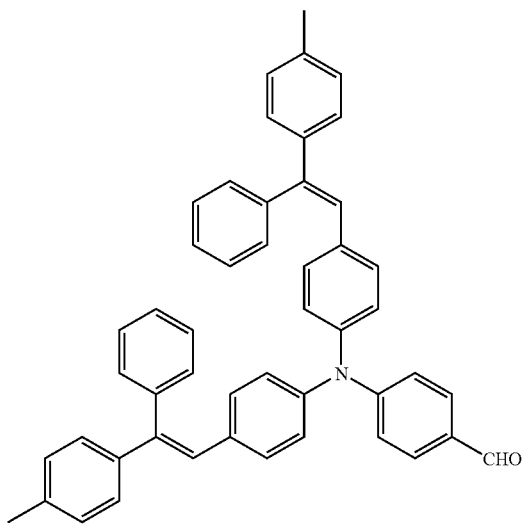 [SMILES: Cc1ccc(/C(=C/c2ccc(N(c3ccc(C=O)cc3)c3ccc(/C=C(\c4ccccc4)c4ccc(C)cc4)cc3)cc2)c2ccccc2)cc1]

The adduct of a substituted triphenylamine and ethyl-2-thiohydantoin-3-acetate was mixed with a water-ethanol (=2:1) mixture solution of 5 equivalents of potassium hydroxide and stirred at 70° C. for 10 minutes. The resulting mixture was concentrated with a rotary evaporator, added with water, and then with ethyl acetate. The organic phase was removed from the mixture solution employing a separating funnel. The residual water phase was added with an excessive amount of a 1N hydrochloric acid solution, stirred for 5 minutes, extracted with ethyl acetate, washed with water, dried over magnesium sulfate, and concentrated employing a rotary evaporator. The resulting concentrate was subjected to silica chromatography to obtain Exemplified compound (dye) 1, one of compounds in the invention represented by formula (1) (yield: 86%).

Other compounds can also be similarly synthesized.

The thus obtained sensitizing dye is carried on a semiconductor, preferably an oxide semiconductor (hereinafter also referred to simply as a semiconductor) to achieve sensitization, enabling to realize the advantageous effects of the invention. Herein, that the dye is carried on a semiconductor means various forms, such that the dye is adsorbed onto the semiconductor surface or when the semiconductor has a porous structure and has pores, the pores are filled with the dye.

The content of the dye in the semiconductor layer (or semiconductor) is preferably from 0.01 to 100 mmol, more preferably from 0.1 to 50 mmol, and still more preferably from 0.5 to 20 mmol, per 1 $m^2$ of semiconductor layer.

When sensitization is carried out employing the sensitizing dyes in the invention, the sensitizing dyes may be used singly or in combination, or in combination with other compounds, as described in, for example, U.S. Pat. Nos. 4,684,537, 4,927,721, 5,084,365, 5,350,644, 5,463,057 and 5,525,440, and Japanese Patent O.P.I. Publication Nos. 7-249790 and 2000-150007.

When the photoelectric conversion element of the invention is applied to a solar cell described later, it is preferred that two or more dyes differing in absorption wavelength ranges are used, whereby the wavelength region for photoelectric conversion is widened as broad as possible to attain effective utilization of solar light.

To carry the sensitizing dye of the invention on a semiconductor, generally, the dye is dissolved in an appropriate solvent (e.g., ethanol) to prepare a dye solution, and a well-dried semiconductor is immersed in the solution over a long period of time.

When two or more kinds of the sensitizing dye in the invention or the sensitizing dye in combination with other sensitizing dyes are employed for sensitization, a mixed solution of the dyes may be prepared in which a semiconductor is immersed, or solutions of the individual dyes may be prepared, wherein a semiconductor is immersed in each of the individual solutions in order. In the latter, when the semiconductor is immersed in each of the individual dye solutions, the immersion may be in any order to attain the advantageous effects of the invention. Further, semiconductor particles which were in advance adsorbed with the sensitizing dyes may be mixed.

Sensitization of the semiconductor in the invention will be explained in detail in a photoelectric conversion element described later.

In a semiconductor with a high porosity, it is preferred that the semiconductor layer is subjected to dye adsorption treatment before moisture or water vapor is adsorbed onto the semiconductor layer surface or incorporated into the pores in the interior of the semiconductor.

Next, the photoelectric conversion element of the invention will be explained.

The photoelectric conversion element of the invention comprises a photoelectrode and an opposed electrode which are opposed through a charge transporting layer, the photoelectrode comprising an electrically conductive support and provided thereon, a semiconductor containing a dye.

The semiconductor, the photoelectrode, the charge transporting layer and the opposed electrode will be explained below.

<<Semiconductor>>

Examples of the semiconductor usable in the photoelectrode include simple substances such as silicon and germanium, compounds containing elements of Groups 3-5 and 13-15 of the periodical table, metal chalcogenides (e.g., an oxide, a sulfide, a selenide), and metal nitrides.

Preferred examples of the metal chalcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and a telluride of cadmium. Other compound semiconductors include a phosphide of zinc, gallium, indium or cadmium; a gallium-arsine or copper-indium selenide; a copper-indium sulfide and a titanium nitride.

Specific examples thereof include $TiO_2$, $SnO_2$, $Fe_2O_3$, $WO_3$, $ZnO$, $Nb_2O_5$, $CdS$, $ZnS$, $PbS$, $Bi_2S_3$, $CdSe$, $CdTe$, $GaP$, $InP$, $GaAs$, $CuInS_2$, $CuInSe_2$ and $Ti_3N_4$. Of these, $TiO_2$, $ZnO$, $SnO_2$, $Fe_2O_3$, $WO_3$, $Nb_2O_5$, $CdS$ and $PbS$ are preferred, $TiO_2$ and $Nb_2O_5$ are more preferred and $TiO_2$ is still more preferred.

Plural semiconductors may be used in combination for the photoelectrode. For instance, plural kinds of the foregoing metal oxides or metal sulfides may be used in combination, or a titanium oxide semiconductor may be mixed with 20% by weight of titanium nitride ($Ti_3N_4$). There may also be used a zinc oxide/tin oxide composite, as described in J. Chem. Soc., Chem. Commun., 15 (1999). In the above, when an additional semiconductor component other than the metal oxide or metal sulfide is added, the added amount of the additional component is preferably not more than 30% by weight based on the metal oxide or metal sulfide.

The semiconductors in the invention may be subjected to surface treatment by using organic bases. Examples of the organic bases include a diarylamine, a triarylamine, pyridine, 4-t-butylpyridine, polyvinylpyridine, quinoline, piperidine, and amidine. Of these are preferred pyridine, 4-t-butylamidine and polyvinylpyridine.

A liquid organic base is used as such and a solid organic base is used as a solution in which the solid organic base is dissolved in an organic solvent is used. The semiconductor in the invention is immersed in a liquid amine or an amine solution to perform surface treatment.

(Conductive Support)

In the conductive support used in the photoelectric conversion element or solar cell of the invention, an electrically conductive material such as a metal plate or an electrically non-conductive material (e.g., glass, plastic film) provided with an electrically conductive material is used. Examples of a material used for the conductive support include metals (e.g., platinum, gold, silver, copper, aluminum, rhodium, indium), conductive metal oxides (e.g., indium-tin composite oxide, fluorine-doped tin oxide), and carbon. The thickness of the conductive support is not specifically limited but preferably is in the range of from 0.3 to 5 mm.

The conductive support is preferably substantially transparent. The expression, being substantially transparent means that the light transmittance is not less than 10%, preferably not less than 50%, and more preferably not more than 80%. To obtain a transparent conductive support, the surface of a transparent substrate such as a glass plate or a plastic film is preferably provided with an electrically conductive layer comprised of an electrically conductive metal oxide. When using the transparent conductive support, light is preferably entered from the substrate side.

The surface resistance of the electrically conductive support is preferably not more than 50 $\Omega/cm^2$, and more preferably not more than 10 $\Omega/cm^2$.

Preparation of Photoelectrode

Next, a preparation method of the photoelectrode in the invention will be explained.

When a semiconductor used in the photoelectrode in the invention is in the form of particles, the semiconductor is coated onto or sprayed onto the conductive support to prepare a photoelectrode. When the semiconductor is in the form of film without a conductive support, the semiconductor is laminated onto the conductive support to prepare a photoelectrode.

AS a preferred method of preparing the photoelectrode in the invention, there is a method in which the photoelectrode is formed by calcining semiconductor particles on the conductive support.

When preparing the semiconductor in the invention through calcination, it is preferred that sensitization treatment of the semiconductor using a sensitizing dye (adsorption of the sensitizing dye, incorporation of the dye in the pores of a porous layer, and the like) is carried out after the calcination. It is specifically preferred that the adsorption of the dye is carried out promptly after calcination and before moisture adsorption onto the semiconductor.

Next, a method will be explained in detail which forms a photoelectrode by calcination of semiconductor particles.

(Preparation of Coating Solution Containing Semiconductor Particles)

Firstly, a coating solution containing semiconductor particles is prepared. The primary particle size of the semiconductor particles is preferably small, and is preferably in the range of from 1 to 5000 nm, and more preferably from 2 to 50 nm. The coating solution containing semiconductor particles can be prepared by dispersing the semiconductor particles in a solvent. The semiconductor particles dispersed in a solvent are in the form of primary particles. Any solvent can be used, as long as it is capable of dispersing semiconductor particles, and is not limited.

Examples of the solvents include water, organic solvents and mixtures of water and an organic solvent. Specific examples of the organic solvent include alcohols such as methanol and ethanol; ketones such as methyl ethyl ketone, acetone and acetylacetone; and hydrocarbons such as hexane and cyclohexane. Surfactants or a viscosity-adjusting agent (a polyhydric alcohol such as polyethylene glycol) may optionally be added to a coating solution. The content of semiconductor particles in a coating solution is in the range of preferably from 0.1 to 70% by weight, and more preferably from 0.1 to 30% by weight.

(Coating of Coating Solution Containing Semiconductor Particles and Calcination of Semiconductor Layer Formed)

The above-obtained coating solution containing semiconductor particles is coated or sprayed onto a conductive support, dried and calcined in the air or in an inert gas to form a semiconductor layer (or semiconductor film) on the conductive support.

The film obtained by coating and drying a coating solution containing semiconductor particles is composed of aggregates of semiconductor particles, and the particle size of the particles corresponds to the primary particle size of the semiconductor particles used.

In the semiconductor particle layer formed on an electrically conductive layer such as an electrically conductive support, the particle layer is weakly bonded to the conductive support or the particles are also weakly bonded with each other, resulting in poor mechanical strength. In order to enhance the mechanical strength of the layer and adhesion of the layer to the conductive support, the semiconductor particle layer is subjected to calcination treatment.

In the invention, the semiconductor layer may be of any structure but is preferably a porous layer (or a porous layer with pores).

Herein, the porosity of the semiconductor layer in the invention is preferably not more than 10% by volume, more preferably not more than 8% by volume, and still more preferably in the range of from 0.01 to 5% by volume. The porosity of the semiconductor layer implies the volume percentage in the semiconductor layer of pores penetrating in the thickness direction of the semiconductor layer, and can be measured through a commercially available instrument such as a mercury porosimeter (PORELIZER 9220, produced by Shimazu Seisakusho Co., Ltd.).

The thickness of the semiconductor layer forming a porous calcination layer is preferably not less than 10 nm, (0.01 µm), and more preferably from 500 to 30000 nm (0.5 to 30 µm).

To obtain the calcination layer having the void rate as described above while controlling the real surface area of the calcination layer during calcination treatment, the calcination temperature is preferably lower than 1000° C., more preferably from 200 to 800° C., and still more preferably from 300 to 800° C.

The ratio of real surface area to apparent surface area can be controlled by the particle size and specific surface area of the semiconductor particles or calcination temperature. In order to increase the surface area of semiconductor particles, purity in the vicinity of semiconductor particles or efficiency of electron injection of from a dye to semiconductor particles, the semiconductor layer after calcination treatment may be subjected to chemical plating treatment using an aqueous titanium tetrachloride solution or electrochemical plating treatment using an aqueous titanium trichloride solution.

The thickness of the semiconductor layer is preferably at least 10 nm, and more preferably from 500 to 30000 nm.

(Sensitization Treatment of Semiconductor)

Sensitization treatment for a semiconductor is conducted in such a manner as above. That is, the sensitizing dye in the invention is dissolved in an appropriate solvent to obtain a solution, and a calcined semiconductor layer board is immersed in this solution. Herein, the calcined semiconductor layer board is preferably subjected to evacuation treatment or heating treatment prior to the immersion in order to remove air bubbles in the semiconductor layer. Such a treatment enables incorporation of the sensitizing dye in the invention into the interior of the semiconductor layer (or semiconductor film), which is especially preferred for a porous semiconductor layer.

A solvent used to dissolve the sensitizing dye in the invention may be any one as long as it can dissolve the dye and does not dissolve the semiconductor nor react with the semiconductor. However, it is preferred that the solvent is subjected to preliminarily degassing or distillation purification to prevent entry of moisture or gas dissolved in the solvent in the semiconductor layer from inhibiting sensitization due to adsorption of the dye onto the semiconductor.

Preferred solvents used for dissolution of the foregoing dyes include a nitrile solvent such as acetonitrile; an alcoholic solvent such as methanol, ethanol or propanol; a ketone solvent such as acetone or methyl ethyl ketone; an ether solvent such as diethyl ether, diisopropyl ether, tetrahydrofuran or 1,4-dioxane; and a halogenated hydrocarbon solvent such as methylene chloride or 1,1,2-trichloroethane. These solvents may be used as an admixture of two or more kinds thereof. Of these, acetonitrile, an acetonitrile/methanol mixture solvent, methanol, ethanol, acetone, methyl ethyl ketone, tetrahydrofuran and methylene chloride are especially preferred.

The time of immersion of the calcined semiconductor layer board in a solution containing the sensitizing dye in the invention is preferably one during which the dye enters the semiconductor layer (or semiconductor film), and is adsorbed on the semiconductor to achieve sufficient sensitization of the semiconductor. The immersion time is preferably from 3 to 48 hours at 25° C., and more preferably from 4 to 24 hours, taking into consideration that a decomposition product produced in decomposition of the sensitizing dye in the solution inhibits adsorption of the dye. This effect is remarkable in a porous semiconductor layer. The immersion time described above is at 25° C. and it is not limited thereto when the temperature condition varies.

During immersion, a solution containing the sensitizing dye in the invention may be heated to a high temperature, provide that the solution is not boiled and the dye is not decomposed. The heating temperature range is preferably from 10 to 100° C., and more preferably from 25 to 80° C., as long as the solvent does not boil.

(Charge Transporting Layer)

The charge transporting layer promptly reduces an oxidation product of a dye and transports a hole injected at an interface with the dye to an opposed electrode.

The charge transporting layer contains, as the main component, a redox electrolyte dispersion or a p-type compound semiconductor (charge transporting material) as a hole transporting material, and optionally a film-forming material such as a binder.

Examples of a redox electrolyte include an $I^-/I_3^-$ system, a $Br^-/Br_3^-$ system and a quinone/hydroquinone system. Such a redox electrolyte can be obtained by commonly known methods. For instance, an electrolyte of the $I^-/I_3^-$ system can be obtained, for example, by mixing ammonium iodide with iodine. A dispersion in which an electrolyte is dispersed in a liquid is called a liquid electrolyte, a dispersion in which an electrolyte is dispersed in a solid polymer at ordinary temperature is called a solid polymer electrolyte, and a dispersion in which an electrolyte is dispersed in a gelled material is called a gel electrolyte. When a liquid electrolyte is used as a charge transporting layer, a solvent which is electrochemically inert is used, including, for example, acetonitrile, propylene carbonate and ethylene carbonate. As a solid electrolyte is cited, for example, an electrolyte described in Japanese Patent O.P.I. Publication No. 2001-160427 and as a gel electrolyte is cited, for example, an electrolyte described in "Hyomen Kagaku" (Surface Science) 21 [5] 288-293.

The charge transporting material preferably has a large band gap in so as not to prevent absorption of the dye. The band gap of the charge transporting material used in the invention is preferably not less than 2 eV, and more preferably not less than 2.5 eV. It is necessary that the ionization potential of the charge transporting material be smaller than that of a dye-adsorbing electrode in order to reduce the dye hole. The ionization potential of the charge transporting material used varies due to kinds of a dye used, but it is preferably from 4.5 to 5.5 eV, and more preferably from 4.7 to 5.3 eV.

As the charge transporting material, an aromatic amine derivative is preferred which has excellent hole transporting capability. Accordingly, a charge transporting layer containing mainly a charge transporting material can improve a photoelectric conversion efficiency. As the aromatic amine derivative, a triphenyldiamine derivative is especially preferred. Among the aromatic amine derivatives, the triphenyldiamine derivative has an especially superior hole transporting capability. The aromatic amine derivatives may be a monomer, an oligomer, a prepolymer, a polymer, or a mixture thereof. The monomer, oligomer, and prepolymer have a relatively low molecular weight and have a high solubility to an organic solvent. Accordingly, when a charge transporting layer is formed by a coating method, these are advantageous in that adjustment of a charge transporting composition is easy. As the oligomer, a dimer or a trimer is preferably used.

Typical examples of the aromatic tertiary amine compound and styrylamine compound include N,N,N',N'-tetraphenyl-4, 4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)-phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quadriphenyl, N,N,N-trip-tolyl)amine, 4-(di-p-tolylamino)-4'-[4-(di-p-tolylamino)styryl]stilbene, 4-N,N-diphenylamino(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]triphenylamine (MTDATA) in which three triphenylamine units are bonded in a starburst form.

A polymer in which the material mentioned above is introduced in the polymer chain or a polymer having the material as the polymer main chain can be also used.

Examples of a charge transporting material other than the aromatic amine derivatives include thiophene derivatives and pyrrole derivatives.

Next, typical examples of the charge transporting material will be listed, but the invention is not limited thereto.

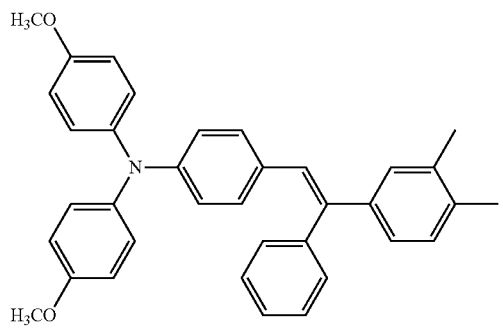

D-1

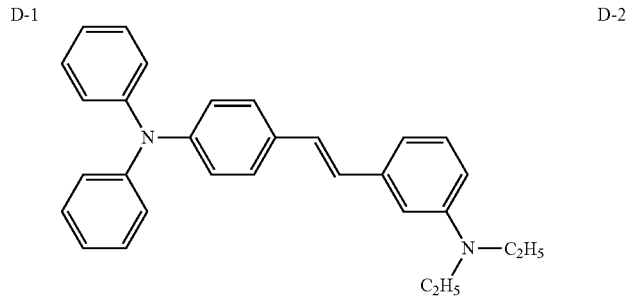

D-2

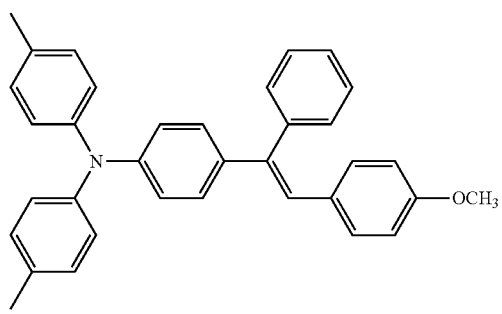

D-3

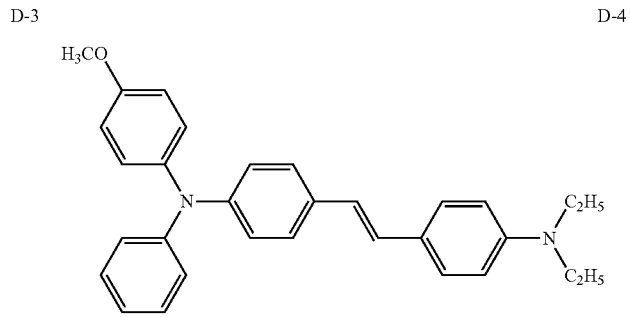

D-4

-continued
D-5
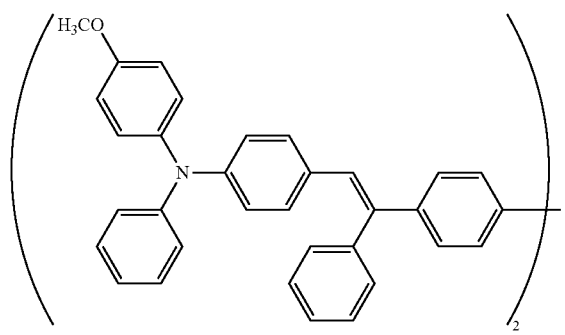
D-6
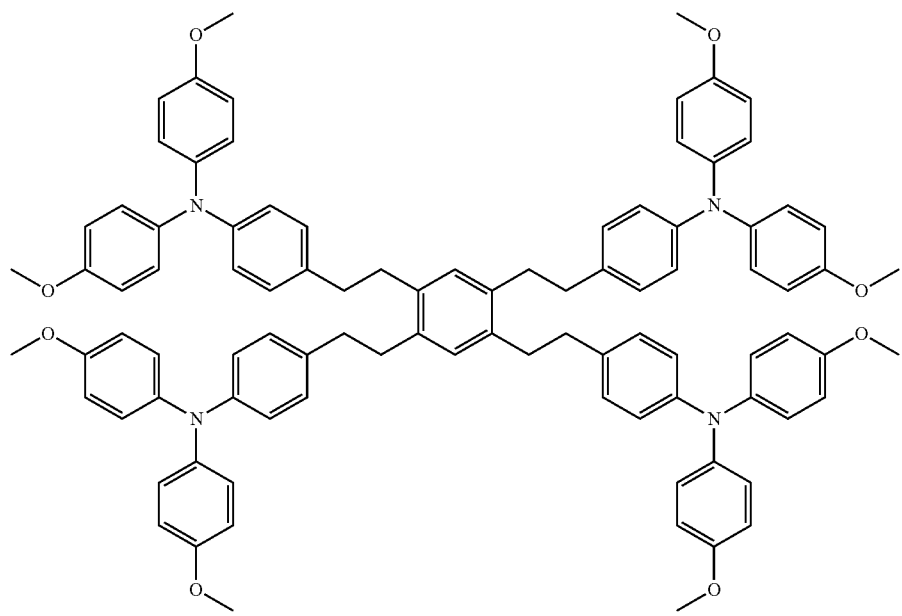
D-7
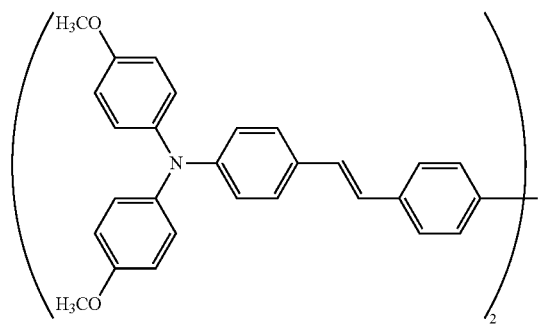
D-8
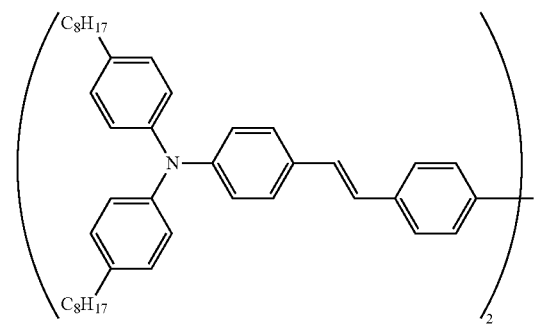

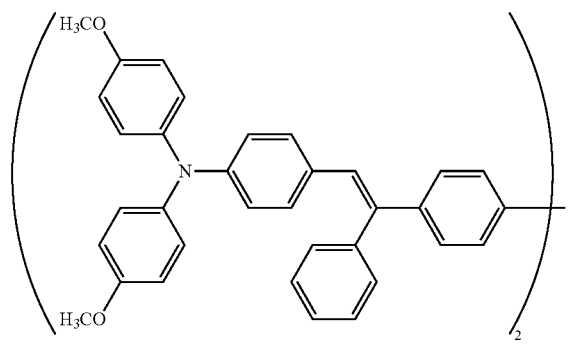
D-9
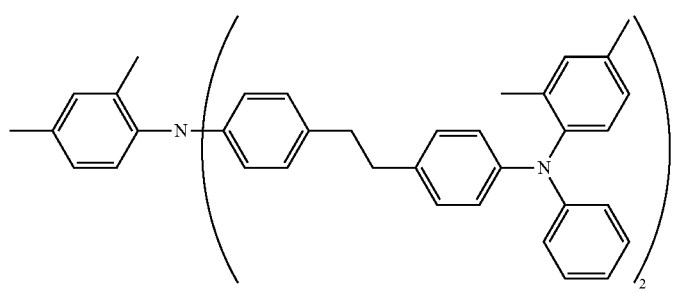
D-10
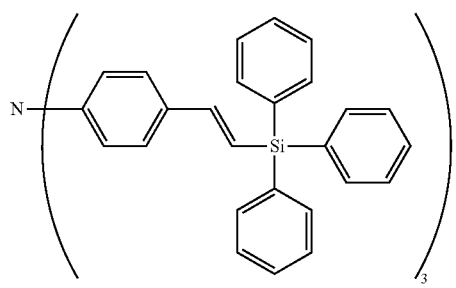
D-11
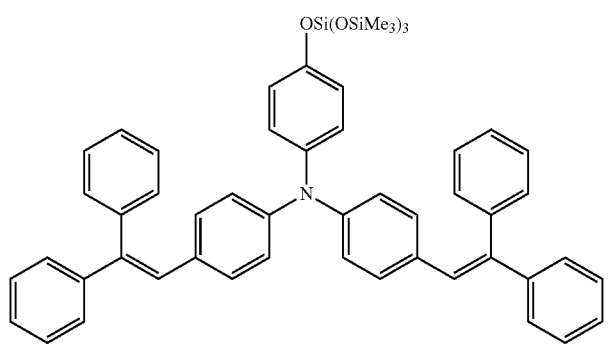
D-12

-continued

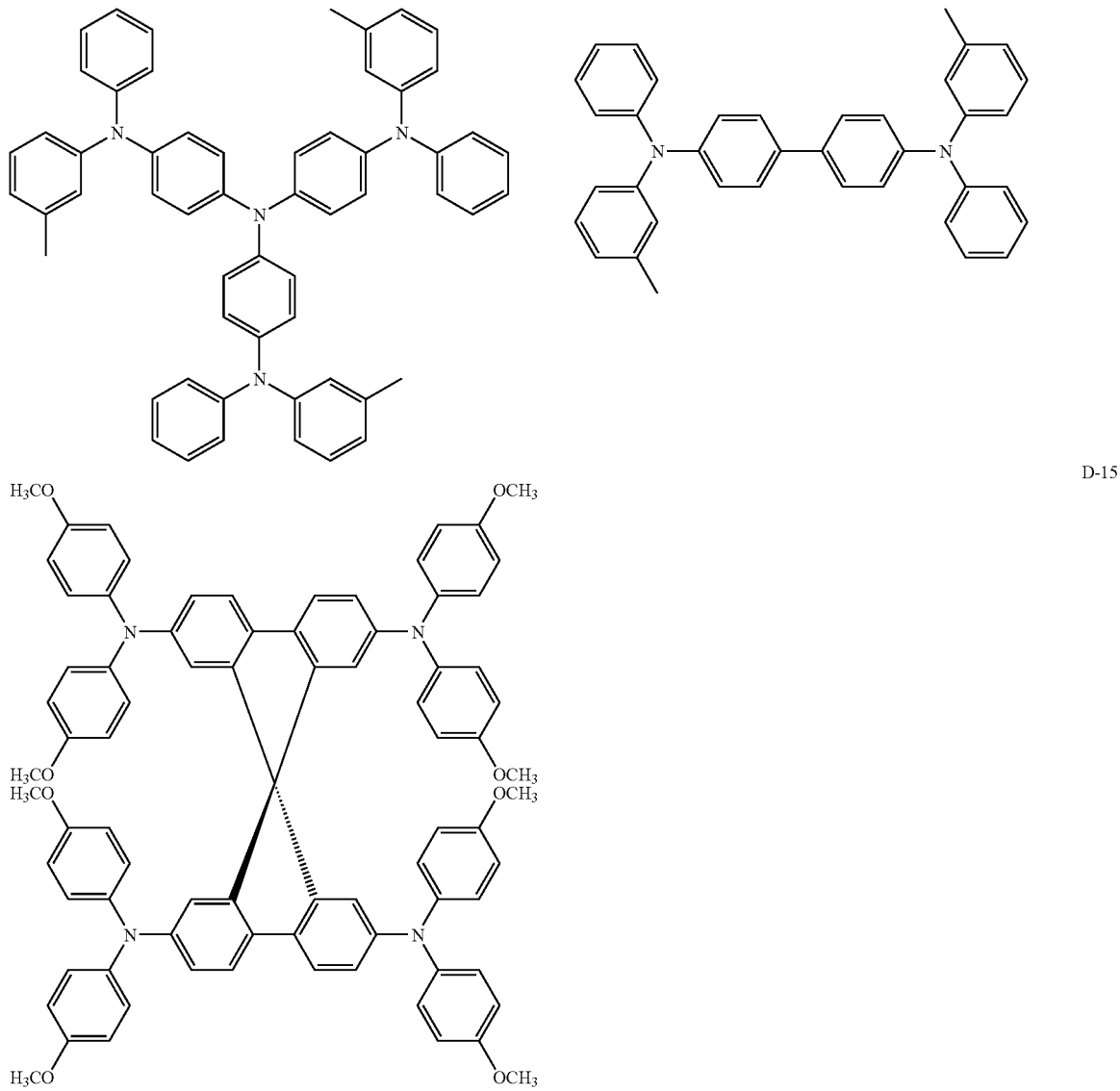

The charge transporting layer is formed by coating of the charge transporting material or p-type semiconductor compound as described previously, or by coating or filling the redox electrolyte dispersion described previously.

<<Opposed Electrode>>

The opposed electrode used in the invention will be explained below.

Any electrically conductive material can be used as an opposed electrode, as long as it is electrically conductive. The electrically conductive material is preferably one which has catalytic capability of carrying out oxidation reaction of an $I_3^-$ ion and the like or reduction of other redox ions at a sufficient rate. Examples of such a material include a platinum electrode, a platinum-plated or platinum-deposited conductive material, a rhodium metal, a ruthenium metal, ruthenium oxide and carbon.

[Solar Cell]

The solar cell of the invention will be explained below.

In the solar cell of the invention, which is one embodiment of the photoelectric conversion element of the invention and its circuit, a design most suitable for solar light is carried out. The solar cell of the invention has such a structure that when solar light is used as a light source, an optimum photoelectric conversion is carried out, that is, such a structure that a dye-sensitized semiconductor is capable of being exposed to solar light. In preparation of the solar light of the invention, it is preferred that the photoelectrode, electrolyte layer and opposed electrode each described above are housed and sealed in a case or the whole of them is sealed with a resin.

When the solar cell of the invention is exposed to a solar light or an electromagnetic wave equivalent to the solar light, a sensitizing dye carried on a semiconductor absorbs the exposed light or electromagnetic wave and is excited. Electrons generated upon the excitation are transferred to the semiconductor and then to the opposed electrode through the electrically conductive support to reduce the redox electrolyte in the charge transporting layer. On the other hand, the sensitizing dye whose electrons are transferred to the semiconductor forms the oxidation product but is reduced by electrons supplied from the opposed electrode through the redox electrolyte of the electrolyte layer to return to the original state, and at the same time, the redox electrolyte in the charge transporting layer is oxidized to return to the original state which is capable of being reduced by electrons supplied from the opposed electrode. Thus, electrons flow, and a solar cell can be prepared using the photoelectric conversion element of the invention.

EXAMPLES

Next, the present invention will be explained employing specific examples, but the present invention is not limited thereto.

Example 1

Preparation of Photoelectric Conversion Element 1

A commercially available titanium oxide paste having a particle diameter of 18 nm was coated onto a fluorine-doped tin oxide (FTO) conductive glass substrate according to a screen printing method, followed by drying. The coated area was 5×5 mm$^2$. The coating and drying (at 120° C. for 3 minutes) were repeated three times, followed by calcining at 200° C. for 10 minutes and further calcining at 500° C. for 15 minutes to obtain a first titanium oxide layer having a thickness of 15 μm. Herein, prior to adsorption treatment of a dye described later, the resulting titanium oxide layer was further coated with a commercially available titanium oxide paste having a particle diameter of 400 nm in the same manner as above to obtain a second titanium oxide layer with a thickness of 5 μm.

Exemplified compound (dye) 1, one of compounds (the dyes in the invention) represented by formula (1) was dissolved in a mixture solvent of acetonitrile and t-butyl alcohol (=1:1) to prepare a 5×10$^{-4}$ mole/liter dye solution. The above FTO glass substrate on which titanium oxide paste was coated and calcined was immersed in this solution at room temperature for 3 hours to conduct adsorption treatment of the dye. Thus, an oxide semiconductor electrode was obtained.

An acetonitrile solution containing 0.6 mole/liter of 1,2-dimethyl-3-propylimidazolium iodide, 0.1 mole/liter of lithium iodide, 0.05 mole/liter of iodine, and 0.5 mole/liter of 4-(t-butyl)pyridine was employed as an electrolyte solution for a charge transporting layer. The glass plate on which platinum and chromium were vapor deposited was used as an opposed electrode. The opposed electrode, the oxide semiconductor electrode and the electrolyte solution each prepared above were assembled by a clamp to prepare Photoelectric conversion element 1.

Preparation of Photoelectric Conversion Elements 2 Through 32

Photoelectric conversion elements 2 through 32 were prepared in the same manner as in Photoelectric conversion element 1 above, except that compounds (dyes) as shown in Table 1 were used in an amount equimolar with the Exemplified compound 1 instead of Exemplified compound 1.

[Evaluation of Power Generation Properties]

The evaluation was carried out through a solar simulator (produced by EKO Instruments Co., Ltd.). Each photoelectric conversion element was exposed to a pseudo solar light of a xenon lamp at 100 mW/cm$^2$ through an AM filter (AM-1.5).

The current-voltage property of each of the photoelectric conversion elements 1 to 32 was measured at room temperature through an I-V tester, and short circuit current density Jsc (mA·cm$^{-2}$) and open circuit voltage Voc (V) were determined. Then, photoelectric conversion efficiency η (%) was determined from the following equation (A).

Further, each element was short-circuited, and then exposed to the pseudo solar light of a xenon lamp at 120 mW/cm$^2$ for 720 hours. Thereafter, the current-voltage property was measured in the same manner as above, and short circuit current density Jsc1 (mA·cm$^{-2}$) and open circuit voltage Voc1 (V) were determined. Then, photoelectric conversion efficiency after light exposure $η_1$ (%) was determined from Jsc1 and Voc1 employing the equation (A).

The photoelectric conversion efficiency η (%) was calculated according to the following equation (A).

$$\text{Photoelectric conversion efficiency } η(\%) = 100 \times (Voc \times Jsc \times F.F.)/P \quad \text{Equation (A)}$$

wherein P is intensity of incident light (mW·cm$^{-2}$), Voc is the open circuit voltage (V), Jsc is the short circuit current density (mA·cm$^{-2}$) and F.F. is the fill factor.

Conversion efficiency η is synonymous with photoelectric conversion efficiency η, which means the efficiency that light energy is converted to electrical energy by a solar cell.

A value represented by ($η_1/η$) was calculated and evaluated as a measure of durability of the photoelectric conversion efficiency.

The results are shown in Table 1.

TABLE 1

| Photo-electric conversion element No. | Sensitizing dye used | Initial Properties | | | Properties after exposure | | | a) $η_1/η$ | Remarks |
|---|---|---|---|---|---|---|---|---|---|
| | | Voc (mV) | Jsc (mA·cm$^{-2}$) | η (%) | Voc1 (mV) | Jsc1 (mA·cm$^{-2}$) | $η_1$ (%) | | |
| 1 | *Ex. 1 | 710 | 9.0 | 4.2 | 680 | 8.7 | 3.8 | 0.9 | Inv. |
| 2 | Ex. 2 | 700 | 9.0 | 4.1 | 690 | 8.8 | 3.9 | 0.95 | Inv. |
| 3 | Ex. 3 | 700 | 8.8 | 4.0 | 680 | 8.6 | 3.9 | 0.98 | Inv. |
| 4 | Ex. 5 | 700 | 8.5 | 4.1 | 680 | 8.3 | 3.9 | 0.95 | Inv. |
| 5 | Ex. 6 | 690 | 9.9 | 4.6 | 680 | 9.6 | 4.2 | 0.91 | Inv. |
| 6 | Ex. 8 | 740 | 9.2 | 4.5 | 740 | 9.0 | 4.2 | 0.93 | Inv. |
| 7 | Ex. 12 | 690 | 9.9 | 4.7 | 690 | 9.8 | 4.5 | 0.91 | Inv. |
| 8 | Ex. 32 | 710 | 10.0 | 4.7 | 700 | 9.0 | 4.3 | 0.96 | Inv. |
| 9 | Ex. 35 | 720 | 8.8 | 3.9 | 720 | 8.5 | 3.6 | 0.92 | Inv. |
| 10 | Ex. 55 | 690 | 10.3 | 4.5 | 680 | 9.8 | 4.1 | 0.91 | Inv. |
| 11 | Ex. 81 | 680 | 10.1 | 4.8 | 680 | 9.9 | 4.7 | 0.98 | Inv. |
| 12 | Ex. 108 | 670 | 9.8 | 3.8 | 620 | 9.5 | 3.4 | 0.9 | Inv. |
| 13 | Ex. 114 | 690 | 8.2 | 3.9 | 680 | 8.1 | 3.8 | 0.97 | Inv. |
| 14 | Ex. 144 | 630 | 4.1 | 1.8 | 600 | 3.7 | 1.7 | 0.94 | Inv. |
| 15 | Ex. 151 | 610 | 3.9 | 1.2 | 610 | 3.8 | 1.1 | 0.97 | Inv. |
| 16 | Ex. 170 | 660 | 7.2 | 3.3 | 650 | 7.0 | 3.0 | 0.91 | Inv. |

TABLE 1-continued

| Photo-electric conversion element No. | Sensitizing dye used | Initial Properties | | | Properties after exposure | | | a) $\eta_1/\eta$ | Remarks |
|---|---|---|---|---|---|---|---|---|---|
| | | Voc (mV) | Jsc (mA·cm$^{-2}$) | $\eta$ (%) | Voc1 (mV) | Jsc1 (mA·cm$^{-2}$) | $\eta_1$ (%) | | |
| 17 | Ex. 179 | 700 | 10.5 | 4.2 | 700 | 10.4 | 4.0 | 0.95 | Inv. |
| 18 | Ex. 200 | 720 | 10.1 | 4.9 | 700 | 9.5 | 4.4 | 0.90 | Inv. |
| 19 | Ex. 215 | 660 | 6.1 | 2.8 | 650 | 6.0 | 2.6 | 0.93 | Inv-. |
| 20 | Ex. 230 | 670 | 8.0 | 3.9 | 640 | 7.8 | 3.6 | 0.92 | Inv. |
| 21 | Ex, 241 | 670 | 7.0 | 3.1 | 650 | 6.7 | 2.8 | 0.90 | Inv. |
| 22 | Ex. 252 | 690 | 10.3 | 4.9 | 690 | 9.9 | 4.7 | 0 96 | Inv. |
| 23 | Ex. 255 | 670 | 8.9 | 3.9 | 650 | 8.2 | 3.5 | 0.90 | Inv. |
| 24 | Ex. 259 | 660 | 10.0 | 4.3 | 650 | 9.6 | 4.0 | 0.93 | Inv. |
| 25 | Ex. 263 | 660 | 9.5 | 3.9 | 640 | 9.0 | 3.6 | 0.92 | Inv. |
| 26 | Ex. 265 | 680 | 12.1 | 5.1 | 660 | 10.9 | 4.7 | 0.92 | Inv. |
| 27 | Ex. 268 | 760 | 8.3 | 4.2 | 760 | 8.0 | 4.1 | 0.98 | Inv. |
| 28 | Ex. 277 | 650 | 7.8 | 3.2 | 650 | 7.6 | 3.1 | 0.97 | Inv. |
| 29 | Ex. 280 | 640 | 7.0 | 3.0 | 640 | 6.8 | 2.8 | 0.93 | Inv. |
| 30 | Ex. 288 | 710 | 9.1 | 4.5 | 680 | 8.8 | 4.1 | 0.91 | Inv. |
| 31 | b) 501 | 690 | 9.0 | 4.0 | 650 | 7.6 | 3.3 | 0.83 | Comp. |
| 32 | c) 502 | 720 | 8.6 | 3.8 | 650 | 6.9 | 2.9 | 0.76 | Comp. |

Inv. Inventive, Comp. Comparative, *Ex.: Exemplified compound (dye),
a) Durability of photoelectric conversion efficiency,
b) Compound 501 (Comparative dye) described later,
c) Compound 502 (Comparative dye) described later Compound 501 (Comparative dye)

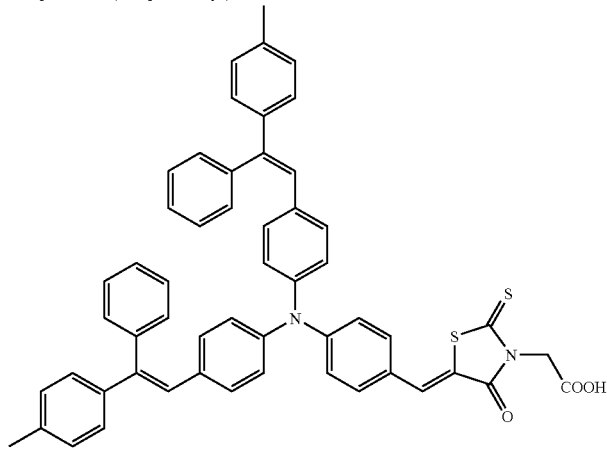 [SMILES: Cc1ccc(/C(=C/c2ccc(N(c3ccc(/C=C4\SC(=S)N(CC(=O)O)C4=O)cc3)c3ccc(/C=C(\c4ccccc4)c4ccc(C)cc4)cc3)cc2)c2ccccc2)cc1]

Compound 502 (Comparative dye)

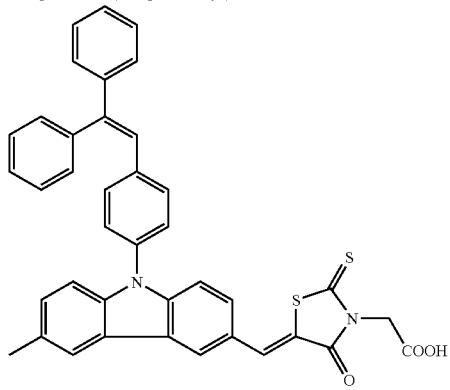

The inventive photoelectric element No. 2, employing a dye in the invention having a thiohydantoin nucleus has the same electron doper structure as the comparative photoelectric element No. 31, employing a comparative dye having a rhodanine nucleus. As is apparent from Table 1, the inventive photoelectric element No. 2 has substantially the same initial photoelectric conversion efficiency, however, the durability of photoelectric conversion efficiency of the inventive photoelectric element No. 2 is maintained at 95%, while the durability of photoelectric conversion efficiency of the comparative photoelectric element No. 31 deteriorates to 83%. It has proved that the inventive photoelectric element has excellent durability to light. All the inventive photoelectric elements are maintained at a durability of photoelectric conversion efficiency of not less than 90%. As is apparent from the aforementioned, it has been found that the present invention provides a sensitizing dye having high durability to light and maintaining the photoelectric conversion efficiency for a long term.

What is claimed is:

1. A photoelectric conversion element comprising a conductive support, and provided thereon, a semiconductor layer, a charge transporting layer and an opposed electrode, the semiconductor layer comprising a semiconductor with a dye, wherein the dye is a compound represented by formula (1),

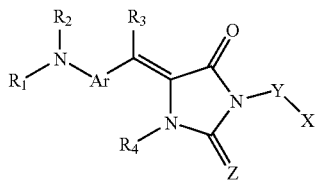

Formula (1)

wherein Ar represents a substituted or unsubstituted aromatic hydrocarbon ring or substituted or unsubstituted aromatic heterocyclic ring; $R_1$ and $R_2$ represent a substituted or unsubstituted stilbenzyl group; $R_3$ and $R_4$ independently represent a hydrogen atom, a halogen atom, a cyano group, a substituted or unsubstituted alkyl group, a substituted or unsubstituted alkenyl group, a substituted or unsubstituted aryl group, a substituted or unsubstituted amino group or a substituted or unsubstituted heterocyclic group; Z represents a sulfur atom, an oxygen atom, a selenium atom, a substituted or unsubstituted alkylidene group, a substituted or unsubstituted aromatic hydrocarbon ring or a substituted or unsubstituted heterocyclic ring; Y represents a substituted or unsubstituted alkylene group, a substituted or unsubstituted alkenylene group, a substituted or unsubstituted aromatic hydrocarbon ring or a substituted or unsubstituted heterocyclic ring; and X represents a carboxylic acid group, a sulfonic acid group, a nitric acid group or a phosphoric acid group.

2. The photoelectric conversion element of claim 1, wherein Ar in formula (1) is a substituted or unsubstituted aromatic hydrocarbon ring.

3. The photoelectric conversion element of claim 2, wherein the aromatic hydrocarbon ring is a benzene ring.

4. The photoelectric conversion element of claim 1, wherein $R_3$ and $R_4$ in formula (1) independently represent a hydrogen atom or a substituted or unsubstituted alkyl group.

5. The photoelectric conversion element of claim 4, wherein $R_3$ and $R_4$ represent a hydrogen atom.

6. The photoelectric conversion element of claim 1, wherein Z in formula (1) represents a sulfur atom or a substituted or unsubstituted heterocyclic ring, the heterocyclic ring being a rhodanine ring or a thiohydantoin ring.

7. The photoelectric conversion element of claim 6, wherein Z represents a sulfur atom.

8. The photoelectric conversion element of claim 1, wherein Y in formula (1) represents a substituted or unsubstituted alkylene group.

9. The photoelectric conversion element of claim 8, wherein the alkylene group is a methylene group.

10. The photoelectric conversion element of claim 1, wherein X in formula (1) represents a carboxylic acid group, a sulfonic acid group or a phosphoric acid group.

11. The photoelectric conversion element of claim 10, wherein X is a carboxylic acid group.

12. The photoelectric conversion element of claim 1, wherein the semiconductor layer is a porous semiconductor layer.

13. The photoelectric conversion element of claim 12, wherein the porosity of the porous semiconductor layer is not more than 10% by volume.

14. The photoelectric conversion element of claim 1, wherein the thickness of the semiconductor layer is from 0.5 to 30 µm.

15. The photoelectric conversion element of claim 1, wherein the semiconductor is titanium oxide.

16. The photoelectric conversion element of claim 1, wherein the content of the dye in the semiconductor layer is from 0.01 to 100 mmol per 1 $m^2$ of semiconductor layer.

17. The photoelectric conversion element of claim 1, wherein the conductive support is substantially transparent.

18. A solar cell employing a photoelectric conversion element comprising a conductive support, and provided thereon, a semiconductor layer, a charge transporting layer and an opposed electrode, the semiconductor layer comprising a semiconductor with a dye, wherein the dye is a compound represented by formula (1),

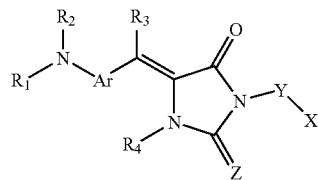

Formula (1)

wherein Ar represents a substituted or unsubstituted aromatic hydrocarbon ring or a substituted or unsubstituted aromatic heterocyclic ring; $R_1$ and $R_2$ represent a substituted or unsubstituted stilbenyl group; $R_3$ and $R_4$ independently represent a hydrogen atom, a halogen atom, a cyano group, a substituted or unsubstituted alkyl group, a substituted or unsubstituted alkenyl group, a substituted or unsubstituted aryl group, a substituted or unsubstituted amino group or a substituted or unsubstituted heterocyclic group; Z represents a sulfur atom, an oxygen atom, a selenium atom, a substituted or unsubstituted alkylidene group, a substituted or unsubstituted aromatic hydrocarbon ring or a substituted or unsubstituted heterocyclic ring; Y represents a substituted or unsubstituted alkylene group, a substituted or unsubstituted alkenylene group, a substituted or unsubstituted aromatic hydrocarbon ring or a substituted or unsubstituted heterocyclic ring; and X represents a carboxylic acid group, a sulfuric acid group, a nitric acid group or a phosphoric acid group.

* * * * *